(12) United States Patent
Jang et al.

(10) Patent No.: US 10,811,260 B2
(45) Date of Patent: Oct. 20, 2020

(54) SEMICONDUCTOR DEVICE HAVING BURIED GATE STRUCTURE AND METHOD FOR FABRICATING THE SAME

(71) Applicant: SK hynix Inc., Gyeonggi-do (KR)

(72) Inventors: Tae-Su Jang, Gyeonggi-do (KR); Jin-Chul Park, Gyeonggi-do (KR); Ji-Hwan Park, Chungcheongbuk-do (KR); Il-Sik Jang, Gyeonggi-do (KR); Seong-Wan Ryu, Gyeonggi-do (KR); Se-In Kwon, Incheon (KR); Jung-Ho Shin, Seoul (KR); Dae-Jin Ham, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/383,082

(22) Filed: Apr. 12, 2019

(65) Prior Publication Data

US 2019/0244820 A1    Aug. 8, 2019

Related U.S. Application Data

(62) Division of application No. 15/713,798, filed on Sep. 25, 2017, now Pat. No. 10,304,684.

(30) Foreign Application Priority Data

Dec. 16, 2016 (KR) .................... 10-2016-0172646

(51) Int. Cl.
*H01L 21/28* (2006.01)
*H01L 29/423* (2006.01)
(Continued)

(52) U.S. Cl.
CPC ...... *H01L 21/28088* (2013.01); *H01L 27/228* (2013.01); *H01L 27/2454* (2013.01);
(Continued)

(58) Field of Classification Search
CPC ............ H01L 43/12; H01L 29/66621; H01L 29/4236; H01L 29/4966; H01L 29/7827;
(Continued)

(56) References Cited

U.S. PATENT DOCUMENTS

2013/0316524 A1    11/2013   Jang
2017/0186844 A1*   6/2017    Kim ................. H01L 29/517

FOREIGN PATENT DOCUMENTS

CN          104810390 A     7/2015
CN          106067482 A     11/2016
KR     10-2006-0114474 A    11/2006

OTHER PUBLICATIONS

Office Action issued by the Chinese Patent Office dated Jul. 3, 2020.

* cited by examiner

*Primary Examiner* — Hrayr A Sayadian
(74) *Attorney, Agent, or Firm* — IP & T Group LLP

(57) ABSTRACT

A method for fabricating a semiconductor device includes: forming a gate trench in a semiconductor substrate; forming a gate dielectric layer over a bottom surface and sidewalls of the gate trench; forming a first work function layer over the gate dielectric layer; doping a work function adjustment element to form a second work function layer which overlaps with the sidewalls of the gate trench; forming a gate conductive layer that partially fills the gate trench; and forming doped regions inside the semiconductor substrate on both sides of the gate trench.

12 Claims, 23 Drawing Sheets

(51) Int. Cl.
  *H01L 29/49*    (2006.01)
  *H01L 27/24*    (2006.01)
  *H01L 29/78*    (2006.01)
  *H01L 27/22*    (2006.01)
  *H01L 29/66*    (2006.01)
  *H01L 43/12*    (2006.01)
  *H01L 45/00*    (2006.01)
  H01L 27/108    (2006.01)
  H01L 21/265    (2006.01)

(52) U.S. Cl.
  CPC ...... *H01L 29/4236* (2013.01); *H01L 29/4966* (2013.01); *H01L 29/66621* (2013.01); *H01L 29/66666* (2013.01); *H01L 29/78* (2013.01); *H01L 29/7827* (2013.01); *H01L 43/12* (2013.01); *H01L 45/16* (2013.01); H01L 21/26586 (2013.01); H01L 21/28114 (2013.01); H01L 27/10805 (2013.01); H01L 27/10861 (2013.01); H01L 45/04 (2013.01); H01L 45/06 (2013.01); H01L 45/143 (2013.01); H01L 45/144 (2013.01); H01L 45/146 (2013.01)

(58) Field of Classification Search
  CPC . H01L 29/66666; H01L 27/228; H01L 29/78; H01L 21/28088; H01L 27/2454; H01L 45/16; H01L 27/10805; H01L 21/28114; H01L 45/06; H01L 45/144; H01L 27/10861; H01L 45/04; H01L 21/26586; H01L 45/146; H01L 45/143
  USPC ........................................................ 257/330
  See application file for complete search history.

SEMICONDUCTOR DEVICE HAVING BURIED GATE STRUCTURE AND METHOD FOR FABRICATING THE SAME

CROSS-REFERENCE TO RELATED APPLICATIONS

This application is a division of U.S. patent application Ser. No. 15/713,798 filed on Sep. 25, 2017, which claims priority of Korean Patent Application No. 10-2016-0172646, filed on Dec. 16, 2016. The disclosure of each of the foregoing applications is incorporated herein by reference in its entirety.

BACKGROUND

1. Field

Exemplary embodiments of the present invention relate to a semiconductor device having a buried gate structure, a method for fabricating the semiconductor device, and a memory cell including the semiconductor device.

2. Description of the Related Art

A metal gate electrode is used for a high-performance transistor. In particular, a threshold voltage needs to be controlled for a high-performance operation of a buried gate-type transistor. Also, gate-induced drain leakage (GIDL) characteristics may affect the performance of the buried gate-type transistor.

SUMMARY

Embodiments of the present invention are directed to a buried gate structure capable of shifting a threshold voltage, and a method for fabricating the buried gate structure.

Embodiments of the present invention are directed to a semiconductor device capable of reducing a gate-induced drain leakage (GIDL), and a method for fabricating the semiconductor device.

Embodiments of the present invention are directed to a memory cell exhibiting improved refresh characteristics.

In accordance with an embodiment of the present invention, a method for fabricating a semiconductor device includes: forming a gate trench in a semiconductor substrate; forming a gate dielectric layer over a bottom surface and sidewalls of the gate trench; forming a first work function layer over the gate dielectric layer; doping a low work function adjustment element into a portion of the first work function layer to form a second work function layer; forming a gate conductive layer that partially fills the gate trench; and forming doped regions inside the semiconductor substrate on both sides of the gate trench.

The second work function layer may be formed to overlap with the sidewalls of the gate trench.

The second work function layer may have lower work function than the first work function layer.

The doping of the work function adjustment element may be performed at a tilted angle with respect to the sidewalls of the gate trench through a tilt-implantation process.

The first work function layer may include a titanium nitride.

The work function adjustment element may include carbon, hydrogen, or a combination thereof.

The gate conductive layer may include tungsten or a titanium nitride.

The doped regions may have a depth that partially overlaps with the second work function layer.

After the forming of the gate conductive layer that partially fills the gate trench, the method may further include: forming a barrier layer over the gate conductive layer; forming a polysilicon layer doped with an N-type impurity over the barrier layer; and forming a capping layer over the polysilicon layer, wherein the polysilicon layer overlaps with the doped regions.

The second work function layer may have higher work function than the first work function layer. The second work function layer may be formed to overlap with the bottom surface of the gate trench. The doping of the work function adjustment element may be performed in a vertical direction with respect to the bottom surface of the gate trench through a vertical implantation process. The work function adjustment element may include an oxygen, a nitrogen, an aluminum, or a combination thereof. The doped regions may have a depth that partially overlaps with an undoped portion of the first work function layer that may be disposed on the sidewalls of the gate trench.

In accordance with another embodiment of the present invention, a method for fabricating a semiconductor device includes: forming a gate trench in a semiconductor substrate; forming a gate dielectric layer that lines a surface of the gate trench; forming a first work function layer over the gate dielectric layer; doping a first work function adjustment element into a portion of the first work function layer to form a second work function layer which overlaps with sidewalls of the gate trench; doping a second work function adjustment element into undoped portion of the first work function layer to form a third work function layer which overlaps with a bottom surface of the gate trench; forming a gate conductive layer that partially fills the gate trench over the third work function layer and the second work function layer; and forming doped regions inside the semiconductor substrate on both sides of the gate trench. The third work function layer may have higher work function than the second work function layer.

The first work function layer may include a titanium nitride.

The first work function adjustment element may include carbon, hydrogen, or a combination thereof.

The second work function adjustment element may include oxygen, nitrogen, aluminum, or a combination thereof.

After the forming of the gate conductive layer that partially fills the gate trench, the method may include: forming a barrier layer over the gate conductive layer and the second work function layer; forming a polysilicon layer doped with an N-type impurity over the barrier layer; and forming a capping layer over the polysilicon layer, wherein the polysilicon layer overlaps with the doped regions.

In accordance with yet another embodiment of the present invention, a semiconductor device includes: a gate trench extended into a semiconductor substrate and may include a bottom channel and a side channel; a first work function layer covering a lowest portion of the gate trench to overlap with the bottom channel; a second work function layer that continues from the first work function layer and overlaps with the side channel; a gate conductive layer covering the first work function layer and the second work function layer and filling the gate trench; and doped regions isolated from each other by the gate trench and contacting with an upper portion of the side channel.

The second work function layer may fully overlap with the side channel.

The first work function layer may fully overlap with the bottom channel.

The second work function layer may include a material that may be doped with a first work function adjustment element, and the first work function layer may include a material that is not doped with the first work function adjustment element, and the first work function adjustment element may include carbon, hydrogen, or a combination thereof.

The first work function layer may include a material that is doped with a high work function adjustment element, and the second work function layer may include a material that is not doped with the second work function adjustment element, and the second work function adjustment element may include oxygen, nitrogen, aluminum, or a combination thereof.

The second work function layer may include a material that is doped with a first work function adjustment element, and the first work function layer may include a material that is doped with a second work function adjustment element, and the first work function adjustment element may include carbon, hydrogen, or a combination thereof, and the second work function adjustment element may include oxygen, nitrogen, aluminum, or a combination thereof.

The second work function layer may include a carbon-doped titanium nitride, a hydrogen-doped titanium nitride, or a combination thereof.

The first work function layer may include an oxygen-doped titanium nitride, a nitrogen-doped titanium nitride, an aluminum-doped titanium nitride, or a combination thereof.

The semiconductor device may further include: a barrier layer over the gate conductive layer; a polysilicon layer doped with an N-type impurity over the barrier layer; and a capping layer over the polysilicon layer, wherein the polysilicon layer overlaps with the doped regions.

The second work function layer may include a titanium nitride that may be doped with a first work function adjustment element, and the first work function layer may include a titanium nitride that is not doped with the first work function adjustment element, and the gate conductive layer may include tungsten or a titanium nitride that may be not doped with the first work function adjustment element.

The first work function layer may include a titanium nitride that is doped with a second work function adjustment element, and the first work function layer may include a titanium nitride that may be not doped with the second work function adjustment element, and the gate conductive layer may include tungsten or a titanium nitride that may be not doped with the second work function adjustment element.

The second work function layer may include a titanium nitride that may be doped with a first work function adjustment element, and the first work function layer may include a titanium nitride that may be doped with a second work function adjustment element, and the gate conductive layer may include tungsten or a titanium nitride that may be not doped with the first work function adjustment element and the second work function adjustment element.

DETAILED DESCRIPTION

Figure 1A:
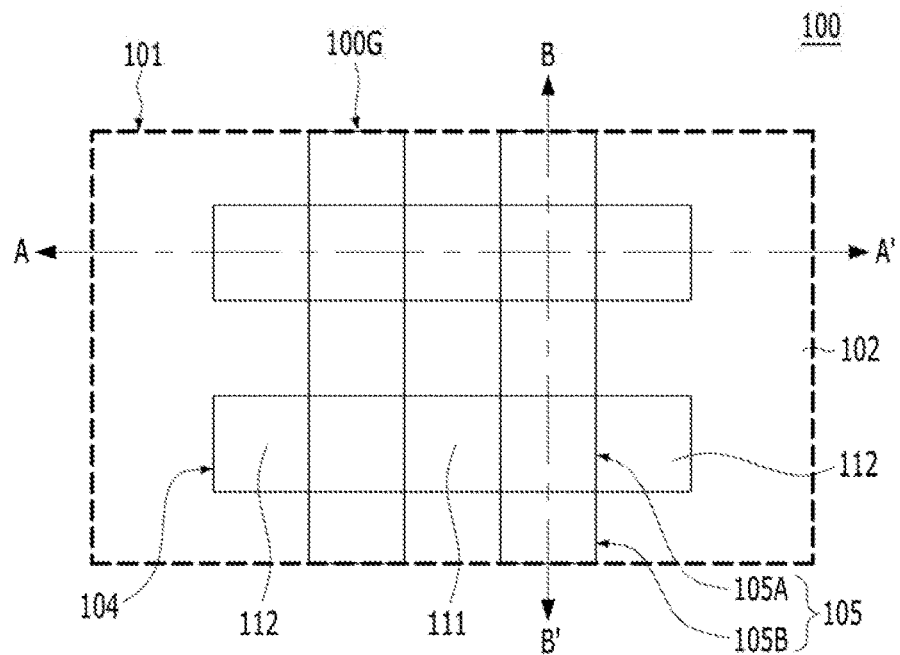
FIG. 1A illustrates a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. The shapes of the constituent elements shown in the embodiments of the present invention are not restrictive but illustrative only. The shapes may be changed during the fabrication process. Therefore, the regions shown in the drawings should be understood not by their shapes but by their attributes.

Hereafter, a threshold voltage Vt may depend on a flatband voltage, which depends on a work function. A work function may be engineered through diverse methods. For example, the work function may be controlled by a material of a gate electrode, a material between a gate electrode and a channel region, a dipole and the like. The flat-band voltage may be shifted by increasing or decreasing a work function. A high work function may shift the flat-band voltage in a positive direction, and a low work function may shift the flat-band voltage in a negative direction. The threshold voltage may be controlled by the shift of the flat-band voltage described above. In the following embodiments, the threshold voltage may be controlled by the shift of the flat-band voltage, although a channel dose is decreased or a channel doping is omitted. In the following embodiments, the flat-band voltage may be shifted based on a work function layer (or a barrier layer) having a controllable work function.

Figure 1B:
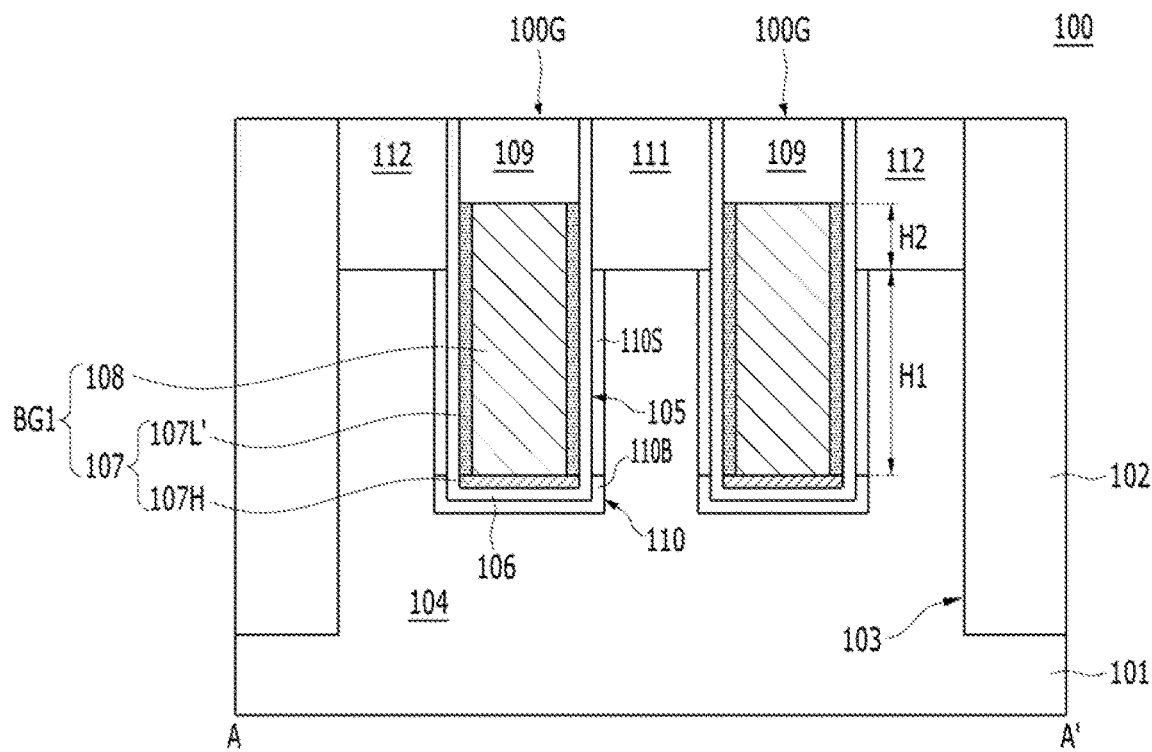
FIG. 1B is a cross-sectional view of the semiconductor device of FIG. 1A taken along a line A-A'.
Figure 1C:
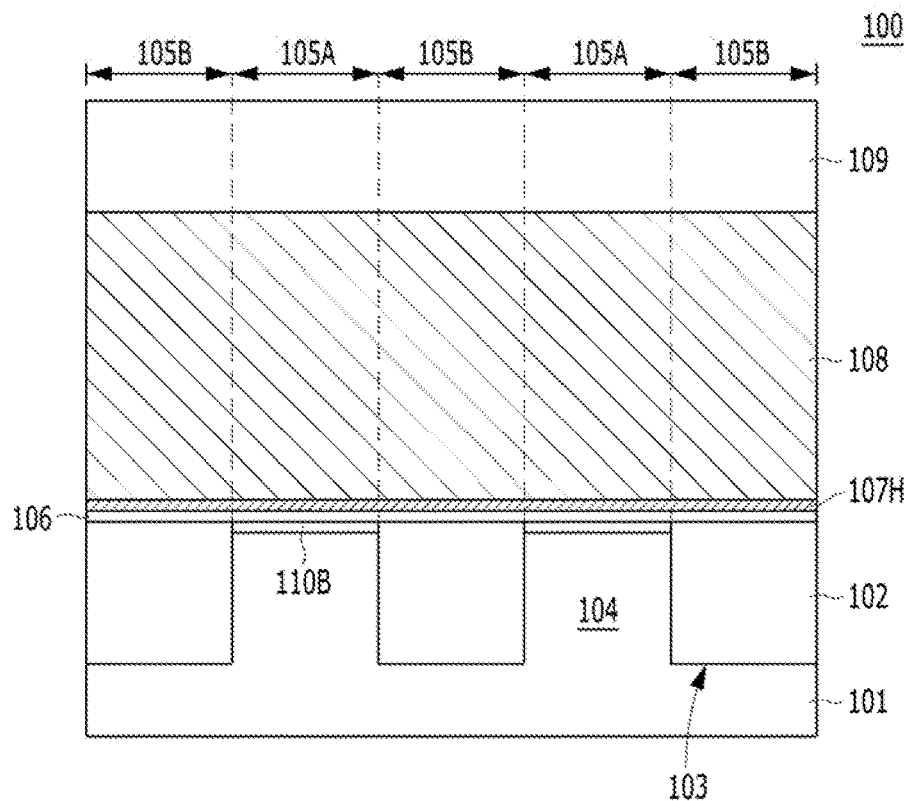
FIG. 1C is a cross-sectional view of the semiconductor device of FIG. 1A taken along a line B-B'.

FIG. 1A is a plan view illustrating a semiconductor device in accordance with a first embodiment of the present invention. FIG. 1B is a cross-sectional view of the semiconductor device of FIG. 1A taken along a line A-A'. FIG. 1C is a cross-sectional view of the semiconductor device of FIG. 1A taken along a line B-B'.

Referring to FIGS. 1A to 1C, a semiconductor device 100 in accordance with an embodiment of the present invention may include a transistor.

The semiconductor device 100 may include a substrate 101, a gate trench 105, a channel region 110, a buried gate structure 100G, a first doped region 111, and a second doped region 112. The buried gate structure 100G may include a gate dielectric layer 106, a buried gate electrode BG1, and a capping layer 109. The buried gate electrode BG1 may include a work function layer 107, and a gate conductive layer 108. The work function layer 107 may include an undoped high work function layer 107H and a doped low work function layer 107L'.

The substrate 101 may include a material appropriate for a semiconductor processing. The substrate 101 may include a semiconductor substrate. The substrate 101 may be formed of a silicon-containing material. The substrate 101 may include one selected from a group including silicon, monocrystalline silicon, polysilicon, amorphous silicon, silicon germanium, monocrystalline silicon germanium, polycrystalline silicon germanium, carbon-doped silicon, combinations thereof, or a multi-layer of two or more of them. The substrate 101 may include other semiconductor materials such as germanium. The substrate 101 may include a semiconductor substrate of III/V groups, e.g., a compound semiconductor substrate, such as a gallium arsenide (GaAs). The substrate 101 may include a Silicon-On-Insulator (SOI) substrate.

In the substrate 101, an isolation layer 102 and an active region 104 may be formed. The isolation layer 102 may define a plurality of active regions 104. The isolation layer 102 may be a Shallow Trench Isolation (STI) region. The isolation layer 102 may be formed by filling a shallow trench, e.g., an isolation trench 103, with an insulating material. The isolation layer 102 may include a silicon oxide, a silicon nitride, or a combination thereof.

Each of the active regions 104 may include the channel region 110, the first doped region 111, and the second doped region 112. The first doped region 111 and the second doped region 112 may be doped with a conductive dopant. For example, the conductive dopant may include phosphorus (P), arsenic (As), antimony (Sb), or boron (B). The first doped region 111 and the second doped region 112 may be doped with a dopant of the same conductive type. The first doped region 111 and the second doped region 112 may be isolated from each other by the gate trench 105. The first doped region 111 and the second doped region 112 may be disposed in the active regions 104 on both sides of the gate trench 105. The first doped region 111 and the second doped region 112 may be referred to as a source region and a drain region, respectively. Bottom surfaces of the first doped region 111 and the second doped region 112 may be positioned at a predetermined depth from top surfaces of the active regions 104. The first doped region 111 and the second doped region 112 may be adjacent to upper outer sidewalls of the gate trench 105. The bottom surfaces of the first doped region 111 and the second doped region 112 may be higher than a bottom surface of the gate trench 105. The first doped region 111 and the second doped region 112 may be symmetrical to each other. For example, the first doped region 111 and the second doped region 112 may form a junction of the same depth.

The channel region 110 may be defined in the active region 104 between the first doped region 111 and the second doped region 112. The channel region 110 may be formed in a U shape. The channel region 110 may include a bottom channel 110B and a side channel 110S. The bottom channel 110B may be defined below the bottom surface of the gate trench 105, and the side channel 110S may be defined on lower outer sidewalls of the gate trench 105. The bottom channel 110B and the side channel 110S may form a continuum. The channel region 110 may include a dopant doped through a channel doping process. The bottom channel 110B and the side channel 110S may include a dopant individually. The bottom channel 110B and the side channel 110S may have different dopant concentrations. For example, the dopant concentration of the side channel 110S may be higher than the dopant concentration of the bottom channel 110B. According to another embodiment of the present invention, the side channel 110S may be a doped region, while the bottom channel 110B may be an undoped region. In other words, the bottom channel 110B may not include the dopant doped into the side channel 110S. Even though the bottom channel 110B does not include the dopant doped into the side channel 110S, a threshold voltage of a uniform level may be acquired based on the high work function layer 107H. The channel region 110 may have a longer channel length than general planar-type transistors. Therefore, it is possible to prevent a short channel effect.

A plurality of gate trenches 105 may be formed in the substrate 101. Referring to FIG. 1A, the gate trenches 105 may be line-shaped trenches extending in one direction. The gate trenches 105 may traverse the active region 104 and the isolation layer 102. Each of the gate trenches 105 may include a first trench 105A and a second trench 105B. The first trench 105A may be formed in the active region 104. The second trench 105B may be formed in the isolation layer 102. The first trench 105A and the second trench 105B may be formed in such a manner that the first trench 105A is continuously extended toward the second trench 105B. The first trench 105A and the second trench 105B may have their bottom surfaces positioned at the same level. The depth of the gate trench 105 may be shorter than the depth of the isolation trench 103. Lower edges of the gate trench 105 may be round. The gate trench 105 may be formed in a U shape. The gate trench 105 may be formed between the first doped region 111 and the second doped region 112.

The buried gate structure 100G may be extended into the inside of the substrate 101. For example, the buried gate structure 100G may be formed in the inside of the gate trench 105. The buried gate structure 100G may be disposed in the active region 104 between the first doped region 111 and the second doped region 112 to be extended into the isolation layer 102. The bottom surface of a portion of the buried gate structure 100G disposed in the active region 104 and the bottom surface of a portion of the buried gate structure 100G disposed in the isolation layer 102 may be at the same level.

The buried gate structure 100G may include the gate dielectric layer 106, the buried gate electrode BG1, and the capping layer 109. The buried gate electrode BG1 may include the work function layer 107 and the gate conductive layer 108. The top surface of the buried gate electrode BG1 may be positioned at a lower level than the top surface of the active region 104. In other words, the work function layer 107 and the gate conductive layer 108 may partially fill the gate trench 105. The work function layer 107 and the gate conductive layer 108 may be collectively called 'a buried gate electrode' or 'an embedded gate electrode'. The capping layer 109 may be disposed over the work function layer 107 and the gate conductive layer 108.

The gate trench 105 may be lined with the gate dielectric layer 106. The gate trench 105 lined with the gate dielectric layer 106 may be called 'a lined trench' or 'a lined gate trench'. The gate dielectric layer 106 may be formed over the bottom and the inner sidewalls of the gate trench 105. The gate dielectric layer 106 may include a silicon oxide, a silicon nitride, a silicon oxynitride, a high-k material, or a combination thereof. The high-k material may include a material having a higher dielectric constant than the dielectric constant of a silicon oxide. For example, the high-k material may include a material having a higher dielectric constant than approximately 3.9. Preferably, the high-k material may include a material having a higher dielectric constant than approximately 10. More preferably, the high-k material may include a material having a dielectric constant ranging from approximately 10 to 30. The high-k material may include at least one metallic element. The high-k material may include a hafnium-containing material. The hafnium-containing material may include a hafnium oxide, a hafnium silicon oxide, a hafnium silicon oxynitride, or a combination thereof. According to another embodiment of the present invention, the high-k material may include a lanthanum oxide, a lanthanum aluminum oxide, a zirconium oxide, a zirconium silicon oxide, a zirconium silicon oxynitride, an aluminum oxide, and combinations thereof. Other known high-k materials may be optionally used for the high-k material. According to an embodiment of the present invention, the gate dielectric layer 106 may be formed by oxidizing the surface of the gate trench 105. According to another embodiment of the present invention, the gate dielectric layer 106 may be formed by depositing a liner material and then oxidizing the liner material. The liner material may include a liner polysilicon or a liner nitride.

The capping layer 109 may cover the top surface of work function layer 107 and the gate conductive layer 108. The capping layer 109 may include an insulating material. The capping layer 109 may include a silicon nitride, a silicon oxynitride, or a combination thereof. According to another embodiment of the present invention, the capping layer 109 may include a combination of a silicon nitride and a silicon oxide. For example, in order to form the capping layer 109, the inner sidewall of the gate dielectric layer 106 which extends over the top surface of the buried gate electrode BG1 and the top surface of the buried gate electrode BG1 are lined with a silicon nitride and then filled with a Spin-On-Dielectric (SOD) material. According to another embodiment of the present invention, the capping layer 109 may have an Oxide-Nitride-Oxide (ONO) structure.

Hereafter, the work function layer 107 and the gate conductive layer 108 are described in detail.

The work function layer 107 may be formed over the gate dielectric layer 106 along the bottom and the inner sidewalls of the gate trench 105. The work function layer 107 may be a thin layer. For example, the work function layer 107 may be a continuous layer that is continuously formed along the bottom and the inner sidewalls of the gate trench 105 to a uniform thickness. Therefore, the work function layer 107 may be called 'a work function liner'. The gate conductive layer 108 disposed over the work function layer 107 may partially fill the gate trench 105. Specifically, the gate conductive layer 108 may fill the gate trench up to the same height as the work function liner 107L' leaving the remainder of the gate trench 105 to be filled with the capping layer 109. The gate conductive layer 108 may also be called 'a filling gate conductor'.

The gate conductive layer 108 may fill most of the gate trench 105. The gate conductive layer 108 may have a lower resistance than the work function layer 107. The gate conductive layer 108 may be called 'a low resistance layer' in this respect. The gate conductive layer 108 may include a metal-based material to decrease a resistance of the buried gate electrode BG1. In this way, the volume of the gate conductive layer 108 occupied in the buried gate electrode BG1 may be increased so as to decrease the resistance. The gate conductive layer 108 may be made of a low resistance metal. The gate conductive layer 108 may include a metal, a metal nitride, or a combination thereof. The gate conductive layer 108 may include a tungsten (W). When the tungsten is used for the gate conductive layer 108, the gate dielectric layer 106 may be attacked. For example, the tungsten may be deposited using a tungsten hexafluoride ($WF_6$), and the gate dielectric layer 106 may be attacked by the fluorine. Therefore, the work function layer 107 may function as a barrier for preventing the fluorine diffusing from the gate conductive layer 108 to the gate dielectric layer 106.

According to an embodiment of the present invention, the gate conductive layer 108 may be made of a fluorine-free metal material. The fluorine-free metal material may be a material that does not contain the fluorine. For example, the fluorine-free metal material may be a material, such as a fluorine-free tungsten (FFW).

The work function layer 107 may include a conductive material. The work function layer 107 may include a material having a lower resistance than a polysilicon layer. The work function layer 107 may be made of a metal-based material. The work function layer 107 may function as a barrier. In other words, the work function layer 107 may be a barrier layer for preventing an impurity from diffusing from the gate conductive layer 108 into the gate dielectric layer 106. The work function layer 107 may include a metal nitride. The work function layer 107 may include a titanium nitride (TiN).

The work function layer 107 may contain a work function adjustment element. The work function adjustment element may be a material for engineering the work function into a high work function or a low work function. The high work function may mean a work function higher than a mid-gap work function of silicon. The low work function may mean a work function lower than the mid-gap work function of silicon. To be specific, the high work function may have a work function higher than approximately 4.5 eV, and the low work function may have a work function lower than approximately 4.5 eV. The work function adjustment element may engineer the work function of the work function layer 107 to be lower than its intrinsic work function. Also, the work function adjustment element may engineer the work function of the work function layer 107 to be higher than its intrinsic work function. In short, the work function of the work function layer 107 may be increased or decreased according to the work function adjustment element contained therein. As described above, the work function adjustment element may include a high work function adjustment element or a low work function adjustment element. The high work function adjustment element may refer to a material for engineering the work function of the work function layer 107 into a high work function. The high work function adjustment element may include an oxygen, a nitrogen, an aluminum, or a combination thereof. The low work function adjustment element may refer to a material for engineering the work function of the work function layer 107 into a low work function. The low work function adjustment element may include a carbon, a hydrogen, or a combination thereof. For example, the work function layer 107 may include a titanium nitride doped with a high work function adjustment element. Also, the work function layer 107 may include a titanium nitride doped with a low work function adjustment element. The work function layer 107 may include a titanium nitride doped with an oxygen, a titanium nitride doped with a nitrogen, a titanium nitride doped with an aluminum, a titanium nitride doped with a carbon, a titanium nitride doped with a hydrogen, or a combination thereof.

In an embodiment of the present invention, the work function layer 107 may locally contain the work function adjustment element. For example, the work function layer 107 may include the undoped high work function layer 107H and the doped low work function layer 107L'. The doped low work function layer 107L' may be doped with a low work function adjustment element. The undoped high work function layer 107H may not be doped with the low work function adjustment element. In the embodiment of the present invention, the undoped high work function layer 107H may not be doped with a high work function adjustment element, either. To be specific, the undoped high work function layer 107H may just be referred to as a layer having a higher work function than the doped low work function layer 107L', and the undoped high work function layer 107H may not be doped with a high work function adjustment element or a low work function adjustment element. The doped low work function layer 107L' and the undoped high work function layer 107H may be a continuous layer.

To form the doped low work function layer 107L', the work function layer 107 may be locally doped with a low work function adjustment element. For example, the work function layer 107 may be doped with a carbon, a hydrogen, or a combination thereof. The low work function adjustment element may be doped through a doping process, such as a tilt-ion implantation process. For example, the doped low work function layer 107L' may be locally formed on the work function layer 107 through a tilt-ion implantation of a low work function adjustment element. Herein, since the other region where the tilt-ion implantation is not performed is not doped with the low work function adjustment element, the other region may remain as the undoped high work function layer 107H. The doped low work function layer 107L' may include a titanium nitride doped with a carbon, a titanium nitride doped with a hydrogen, or a combination thereof. The undoped high work function layer 107H may include an undoped titanium nitride.

As described above, the doped low work function layer 107L' may be formed through the tilt-ion implantation process. The tilt-ion implantation process may be performed with a tilted angle with respect to the sidewalls of the gate trench 105. The tilted angle in the tilt-implantation process may be adjusted in such a manner that most of the doped low work function layer 107L' and the side channel 110S may overlap with each other. The doped low work function layer 107L' may not overlap with the bottom channel 110B. The doped low work function layer 107L' may be formed only on the internal sidewall of the gate dielectric layer 106 and may not overlap with come into contact with a bottom portion of the gate dielectric layer 106 which is formed over the bottom channel 110B. The undoped high work function layer 107H may be formed over the bottom portion of the gate dielectric layer 106 which is formed over the bottom channel 110B. The undoped high work function layer 107H may vertically overlap with the bottom channel 110B. The undoped high work function layer 107H may not overlap with the side channel 110S. The upper portion of the doped low work function layer 107L' may horizontally overlap with the first doped region 111 and the second doped region 112, meaning that the top surface of the doped low work function layer 107L' may extend to a height that is higher than the height of the bottom surface of the first and second doped regions 111 and 112. Herein, the doped low work function layer 107L' and the side channel 110S may overlap with each other in a horizontal direction. The doped low work function layer 107L' may fully overlap with the side channel 110S. As a result, a threshold voltage of the side channel 110S may be dominantly controlled by the work function of the doped low work function layer 107L'. The undoped high work function layer 107H and the bottom channel 110B may overlap with each other in a vertical direction. The undoped high work function layer 107H may fully overlap with the bottom channel 110B. As a result, a threshold voltage of the bottom channel 110B may be dominantly controlled by the work function of the undoped high work function layer 107H.

The undoped high work function layer 107H may have a work function capable of shifting the threshold voltage of the bottom channel 110B. The doped low work function layer 107L' may have a work function capable of shifting the threshold voltage of the side channel 110S. For example, the threshold voltage of the bottom channel 110B may be increased by the undoped high work function layer 107H, and an increase in the threshold voltage of the side channel 110S may be suppressed by the doped low work function layer 107L'. The undoped high work function layer 107H may have a high work function higher than approximately 4.5 eV. The doped low work function layer 107L' may have a low work function lower than approximately 4.5 eV.

The undoped high work function layer 107H may be formed to be vertically spaced apart from the first doped region 111 and the second doped region 112 by a first height H1, which may be the same as the height of the side channel 110S. The first height H1 may be defined as a height between the bottom surfaces of the first doped region 111 and the second doped region 112 and the lowest portion of the gate trench 105. The undoped high work function layer 107H may cover most of the lowest portion of the gate trench 105. Meanwhile, the upper portion of the doped low work function layer 107L' may overlap with the first and second doped regions 111 and 112 by a second height H2. The first height H1 may be longer than the second height H2. The doped low work function layer 107L' may overlap with the side channel 110S by the first height H1. Therefore, the doped low work function layer 107L' may fully overlap with the side channel 110S. As described, the doped low work function layer 107L' may sufficiently overlap not only with the first doped region 111 and the second doped region 112 but also with the side channel 110S.

The bottom channel 110B, the side channel 110S, the first doped region 111, the second doped region 112, and the buried gate structure 100G may form a transistor. For example, the transistor may be referred to as 'a buried gate-type transistor'.

According to the embodiment of the present invention, the undoped high work function layer 107H may be a material that induces a high work function, and the undoped high work function layer 107H may be formed to be sufficiently spaced apart from the first doped region 111 and the second doped region 112 by the first height H1. The threshold voltage Vt may shift by the undoped high work function layer 107H. For example, the undoped high work function layer 107H may increase the threshold voltage of the bottom channel 110B. Since the gate trench 105 has a high aspect ratio, it is difficult to secure the threshold voltage of the bottom channel 110B through a general channel doping process. In other words, it is difficult to sufficiently perform a channel doping process for the bottom portion of the gate trench 105. Therefore, after the channel doping, an additional channel doping may be locally performed onto the bottom portion of the gate trench 105. This may be called 'a local channel doping'. When an implantation process is performed as the local channel doping process, the implantation process may be called 'a Local Channel Implantation (LCI)'. Through the local channel doping process, the threshold voltage of the bottom channel 110B may be adjusted. In accordance with the embodiment of the present invention, the threshold voltage may be adjusted by the undoped high work function layer 107H. Therefore, a channel dose of the bottom channel 110B may be decreased. In other words, the dose of the local channel implantation may be drastically reduced or a process of the local channel implantation may be omitted. After all, since the channel dose may be decreased by the undoped high work function layer 107H in the embodiment of the present invention, a junction leakage may be improved.

Also, since the doped low work function layer 107L' has a low work function, a gate-induced drain leakage (GIDL) may be suppressed in the first doped region 111 and the second doped region 112. When the undoped high work function layer 107H overlaps with the first doped region 111 and the second doped region 112, the gate-induced drain leakage (GIDL) may be increased. Therefore, the undoped high work function layer 107H may be controlled to be formed at a place that does not overlap with the first doped region 111 and the second doped region 112.

Moreover, an off-state leakage may be prevented not only by forming the undoped high work function layer 107H not to overlap with the side channel 110S but also by forming the doped low work function layer 107L' to fully overlap with the side channel 110S. The off-state leakage may be referred to as a leakage current caused when a transistor is in an off state. As a comparative example, when the undoped high work function layer 107H overlaps with the side channel 110S, the off-state leakage may be increased. Also, when the doped low work function layer 107L' has a high work function, the off-state leakage may be increased. Such off-state leakage in the side channel 110S may be called 'a side transistor effect'. The off-state leakage may be increased, as the gap between the neighboring buried gate structures 100G becomes narrower. Due to the side transistor effect, a swing may deteriorate, causing a deterioration of a low margin of the threshold voltage. The side transistor effect may occur because a transistor existing on the part of the side channel 110S may be affected by the neighboring buried gate electrode BG1 so as to increase the threshold voltage.

In the following embodiments of the present invention, the height of the undoped high work function layer 107H may be lowered as much as possible so that the undoped high work function layer 107H does not overlap with the side channel 110S, and the doped low work function layer 107L' may be formed to fully overlap with the side channel 110S. This may lead to improvement in the swing of a buried gate transistor, thus preventing the side transistor effect.

Also, in the embodiment of the present invention, since the threshold voltage may be optionally controlled by the undoped high work function layer 107H and the doped low work function layer 107L' which also function as barrier layers, it does not need to add an additional layer for controlling the threshold voltage, other than the barrier layer. Therefore, it is possible to prevent gap-fill defects of the gate trench 105. The doped low work function layer 107L' may be referred to as 'a low work function barrier layer', and the undoped high work function layer 107H may be referred to as 'a high work function barrier layer'.

Figure 2A:
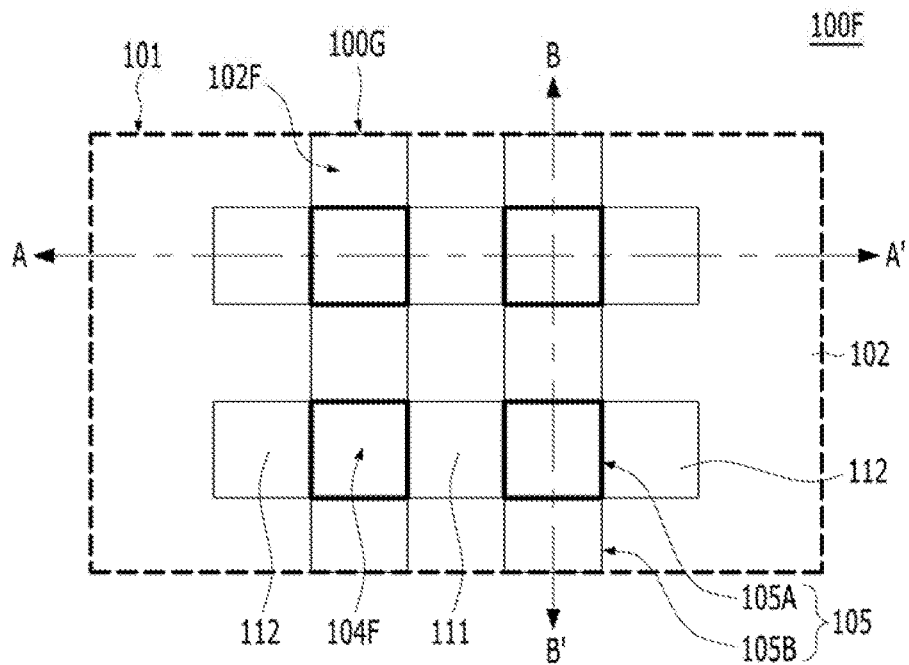
FIG. 2A illustrates a semiconductor device in accordance with an embodiment of the present invention.
Figure 2B:
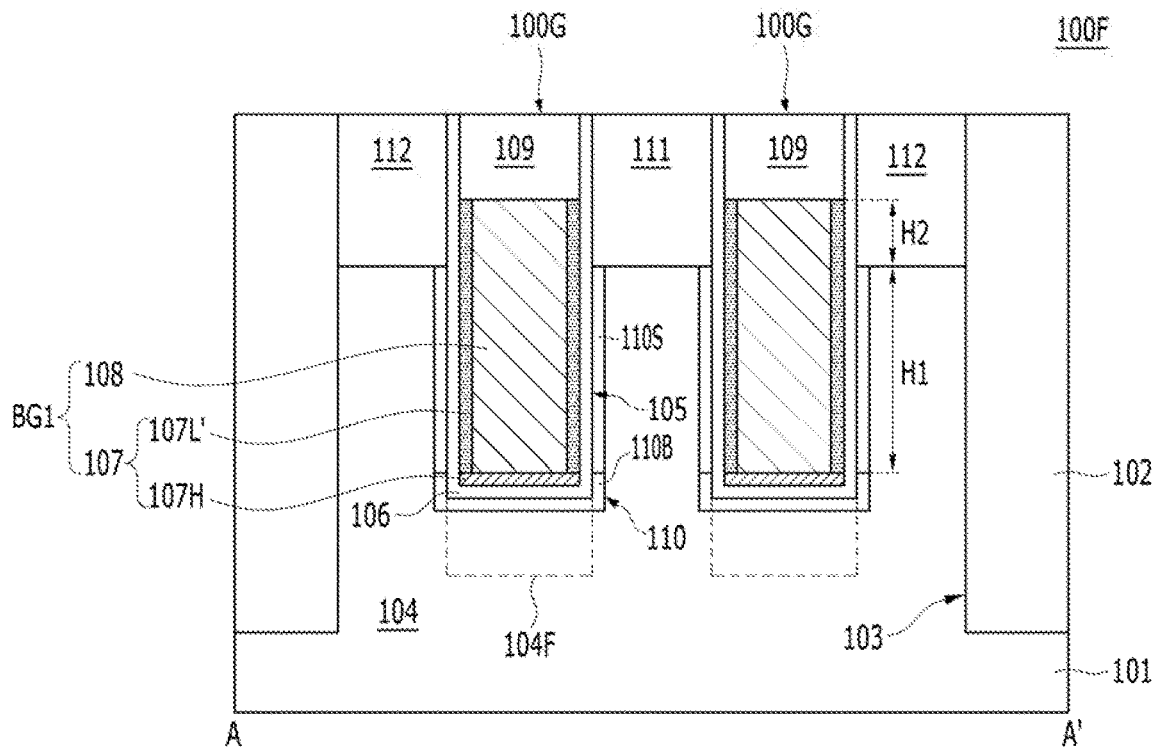
FIG. 2B is a cross-sectional view of the semiconductor device of FIG. 2A taken along a line A-A'.
Figure 2C:
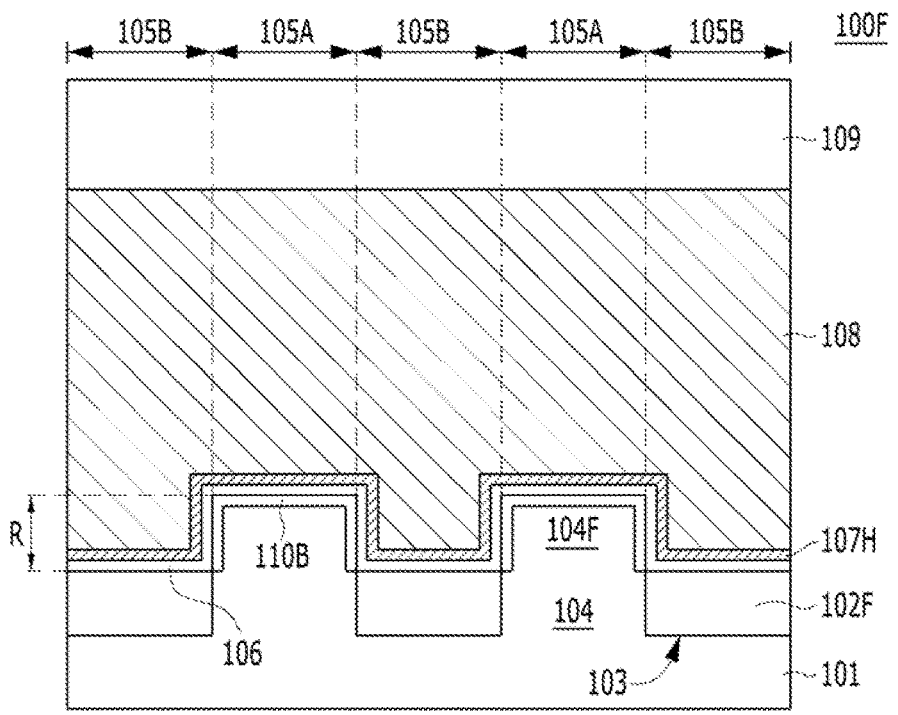
FIG. 2C is a cross-sectional view of the semiconductor device of FIG. 2A taken along a line B-B'.

FIGS. 2A to 2C illustrate a semiconductor device in accordance with an embodiment of the present invention. FIG. 2A is a plan view illustrating the semiconductor device in accordance with the embodiment of the present invention. FIG. 2B is a cross-sectional view of the semiconductor device of FIG. 2A taken along a line A-A'. FIG. 2C is a cross-sectional view of the semiconductor device of FIG. 2A taken along a line B-B'. Some constituents of the semiconductor device 100F in accordance with the embodiment of the present invention may be the same as those of the semiconductor device 100. The semiconductor device 100F may include a substrate 101, an isolation layer 102, an active region 104, a gate trench 105, a channel region 110, a buried gate structure 100G, a first doped region 111, and a second doped region 112. The buried gate structure 100G may include a gate dielectric layer 106, a buried gate electrode BG1, and a capping layer 109. The buried gate electrode BG1 may include a work function layer 107, and a gate conductive layer 108. The work function layer 107 may include an undoped high work function layer 107H and a doped low work function layer 107L'. The doped low work function layer 107L' may include a titanium nitride doped with carbon, a titanium nitride doped with hydrogen, or a combination thereof. The undoped high work function layer 107H may include an undoped titanium nitride. The channel region 110 may include a bottom channel 110B and a side channel 110S. The semiconductor device 100F may further include a fin region 104F. The fin region 104F may be disposed in the inside of the active region 104 below the gate trench 105.

The gate trench 105 may include a first trench 105A and a second trench 105B. The first trench 105A may be formed in the active region 104. The second trench 105B may be formed in the isolation layer 102. The first trench 105A and the second trench 105B may be formed in such a manner that the first trench 105A is continuously extended toward the second trench 105B. The first trench 105A and the second trench 105B may have their bottom surfaces positioned at different levels. For example, the bottom surface of the first trench 105A may be positioned at a higher level than the bottom surface of the second trench 105B. The height difference between the first trench 105A and the second trench 105B may be defined by recessing the isolation layer 102. Therefore, the second trench 105B may include a recess region R having a bottom surface that is lower than the bottom surface of the first trench 105A.

Due to the height difference between the first trench 105A and the second trench 105B, the fin region 104F may be formed in the active region 104. For this reason, the active region 104 may include the fin region 104F. To sum up, the fin region 104F may be formed below the first trench 105A, and the sidewalls of the fin region 104F may be exposed through the recessed isolation layer 102F.

The fin region 104F is a portion where the bottom channel 110B is formed. The bottom channel 110B may be formed in the upper portion and sidewalls of the fin region 104F. The fin region 104F may also be referred to as a saddle fin. The fin region 104F may increase the channel width and improve the electrical characteristics.

The undoped high work function layer 107H may cover the top surface and sidewalls of the fin region 104F. The doped low work function layer 107L' may overlap with the side channel 110S. Therefore, due to the presence of the undoped high work function layer 107H, the channel dose of the fin region 104F may be decreased or the local channel doping may be omitted.

The semiconductor device 100F including the buried gate structure 100G may become 'a buried gate-type fin channel transistor'.

Figure 3A:
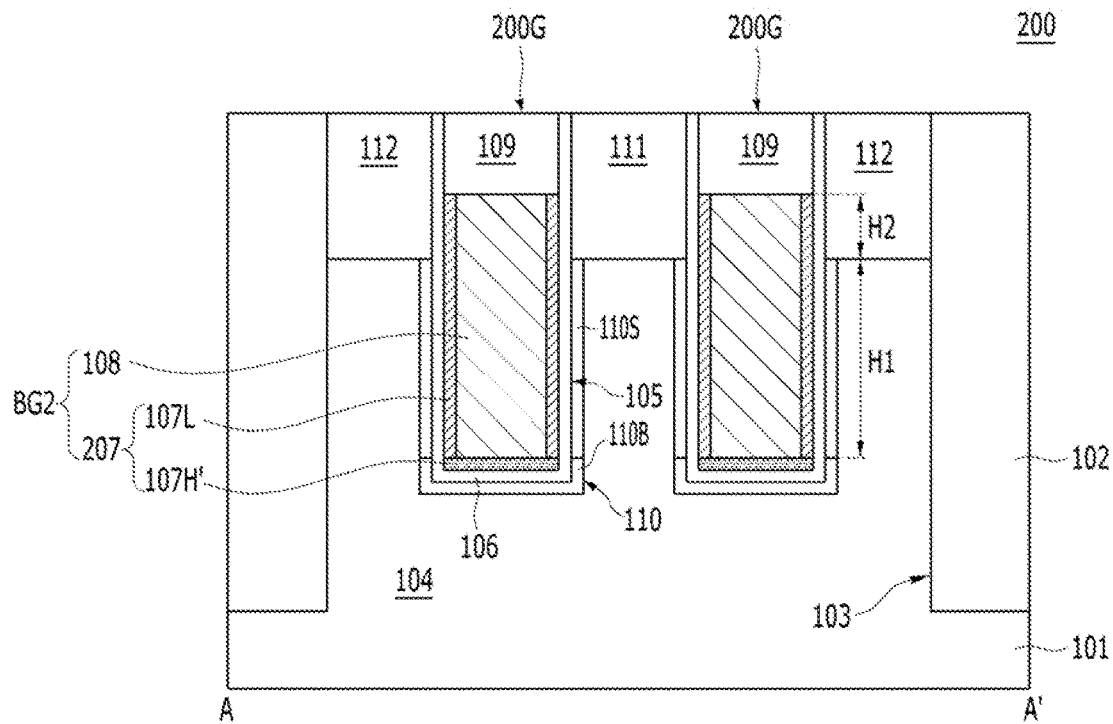
FIG. 3A is a cross-sectional view of a semiconductor device in accordance with an embodiment of the present invention.
Figure 3B:
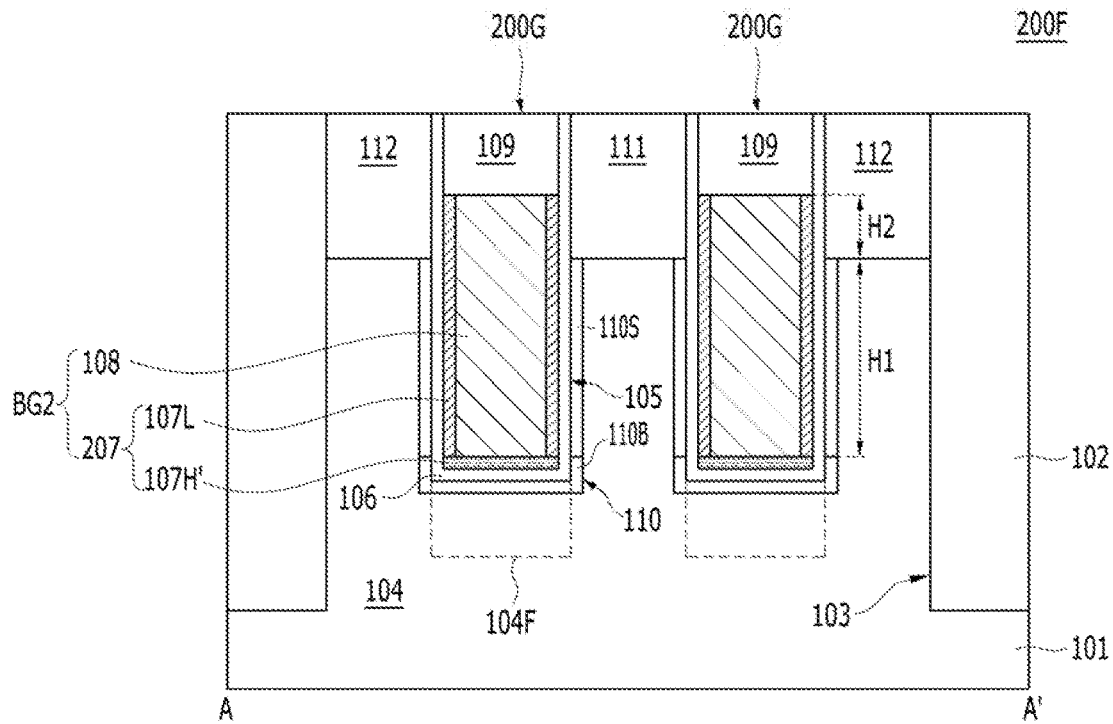
FIG. 3B is a cross-sectional view of an exemplary semiconductor device in accordance with an embodiment of the present invention.

FIG. 3A is a cross-sectional view of a semiconductor device in accordance with an embodiment of the present invention. FIG. 3B is a cross-sectional view of a semiconductor device in accordance with a modified example of the embodiment of the present invention.

Referring to FIG. 3A, some constituents of the semiconductor device 200 in accordance with the third embodiment of the present invention may be the same as those of the semiconductor device 100. The semiconductor device 200 may include a substrate 101, an isolation layer 102, an active region 104, a gate trench 105, a channel region 110, a buried gate structure 200G, a first doped region 111, and a second doped region 112. The buried gate structure 200G may include a gate dielectric layer 106, a buried gate electrode BG2, and a capping layer 109. The buried gate electrode BG2 may include a work function layer 207, and a gate conductive layer 108. The channel region 110 may include a bottom channel 110B and a side channel 110S.

The work function layer 207 may be made of a metal nitride. The work function layer 207 may include a titanium nitride (TiN), a titanium aluminum nitride (TiAlN), or a titanium aluminum (TiAl).

The work function layer 207 may locally contain a work function adjustment element. For example, the work function layer 207 may include a doped high work function layer 107H' and an undoped low work function layer 107L. The doped high work function layer 107H' may be doped with a high work function adjustment element. The undoped low work function layer 107L may not be doped with a high work function adjustment element and a low work function adjustment element. To be specific, the undoped low work function layer 107L may just refer to a layer having a lower work function than the doped high work function layer 107H', and the undoped low work function layer 107L may not be doped with a low work function adjustment element or a high work function adjustment element. The undoped low work function layer 107L and the doped high work function layer 107H' may be a continuous layer.

To form the doped high work function layer 107H', the work function layer 207 may be locally doped with a high work function adjustment element. For example, the work function layer 207 may be doped with an oxygen, a nitrogen, an aluminum, or a combination thereof. The high work function adjustment element may be doped through a doping process, such as a non-tilt-ion implantation process or a plasma doping process. For example, the doped high work function layer 107H' may be locally formed on the work function layer 207 through a vertical implantation of a high work function adjustment element. Herein, since the other region where the vertical implantation is not performed is not doped with the high work function adjustment element, the other region may remain as the undoped low work function layer 107L. According to another embodiment of the present invention, the doped high work function layer 107H' may be formed through a direct plasma doping process of a high work function adjustment element. Oxygen and nitrogen may be individually doped through the plasma doping process or the non-tilt-ion implantation process. Aluminum may be doped through the non-tilt-ion implantation process.

As described above, the doped high work function layer 107H' may be formed through the non-tilt-ion implantation process or the plasma doping process. The non-tilt-ion implantation process may be performed in a vertical direction with respect to the surface of the bottom channel 110B. The non-tilt-ion implantation process may be performed in parallel to the side channel 110S. The doped high work function layer 107H' may include a titanium nitride doped with an oxygen, a titanium nitride doped with a nitrogen, or a titanium nitride doped with an aluminum. The undoped low work function layer 107L may include an undoped titanium nitride.

Most of the doped high work function layer 107H' and the bottom channel 110B may overlap with each other. The doped high work function layer 107H' may not overlap with the side channel 110S. The undoped low work function layer 107L may overlap with the side channel 110S. The undoped low work function layer 107L may not overlap with the bottom channel 110B. The upper portion of the undoped low work function layer 107L may overlap with the first doped region 111 and the second doped region 112. Herein, the undoped low work function layer 107L and the side channel 110S may overlap with each other in a horizontal direction. The undoped low work function layer 107L may fully overlap with the side channel 110S. As a result, a threshold voltage of the side channel 110S may be dominantly controlled by the work function of the undoped low work function layer 107L. The doped high work function layer 107H' and the bottom channel 110B may overlap with each other in a vertical direction. The doped high work function layer 107H' may fully overlap with the bottom channel 110B. As a result, a threshold voltage of the bottom channel 110B may be dominantly controlled by the work function of the doped high work function layer 107H'.

The doped high work function layer 107H' may have a work function capable of shifting the threshold voltage of the bottom channel 110B. The undoped low work function layer 107L may have a work function capable of shifting the threshold voltage of the side channel 110S. For example, the threshold voltage of the bottom channel 110B may be increased by the doped high work function layer 107H', and an increase in the threshold voltage of the side channel 110S may be suppressed by the undoped low work function layer 107L. The doped high work function layer 107H' may have a high work function higher than approximately 4.5 eV. The undoped low work function layer 107L may have a low work function lower than approximately 4.5 eV.

The doped high work function layer 107H' may be formed to be vertically spaced apart from the first doped region 111 and the second doped region 112 by a first height H1, which may be the same as the height of the side channel 110S. The first height H1 may be defined as a height between the bottom surfaces of the first doped region 111 and the second doped region 112 and the lowest portion of the gate trench 105. The doped high work function layer 107H' may cover most of the lowest portion of the gate trench 105. Meanwhile, the undoped low work function layer 107L and the first and second doped regions 111 and 112 may overlap with each other by a second height H2. The first height H1 may be longer than the second height H2. As described, the undoped low work function layer 107L may sufficiently overlap not only with the first doped region 111 and the second doped region 112 but also with the side channel 110S.

Some constituents of the semiconductor device 200F illustrated in FIG. 3B may be the same as those of the semiconductor device 200 shown in FIG. 3A. The semiconductor device 200F in accordance with the modified example of the embodiment of the present invention may further include a fin region 104F.

Figure 4A:
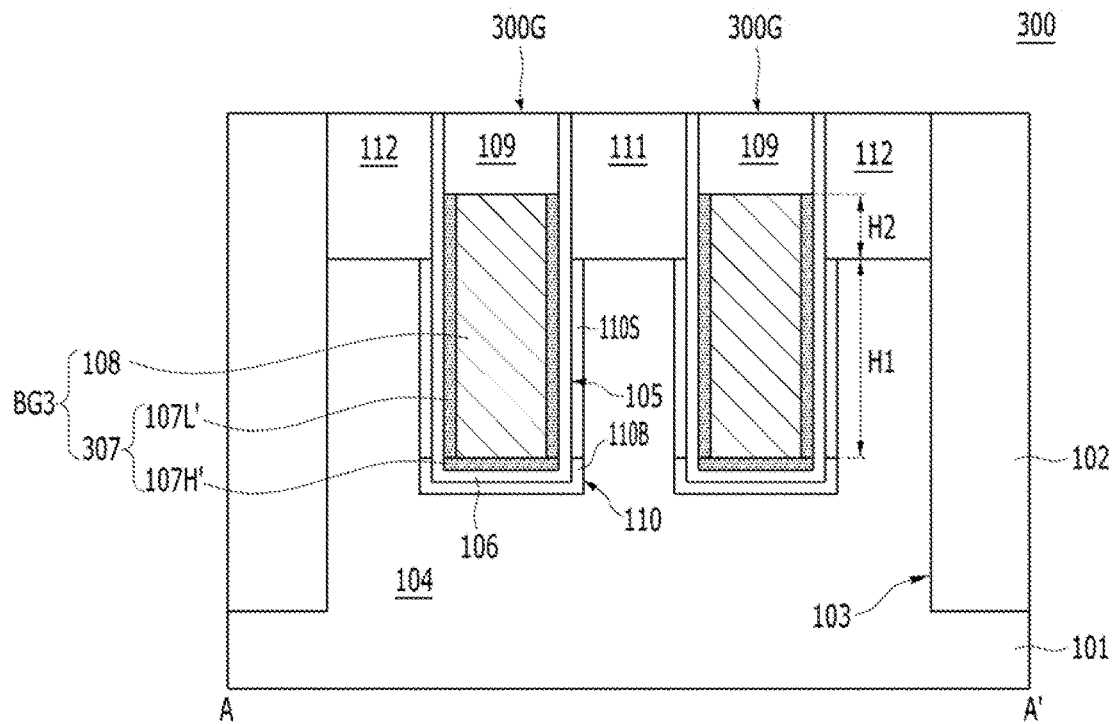
FIG. 4A is a cross-sectional view of an exemplary semiconductor device in accordance with an embodiment of the present invention.
Figure 4B:
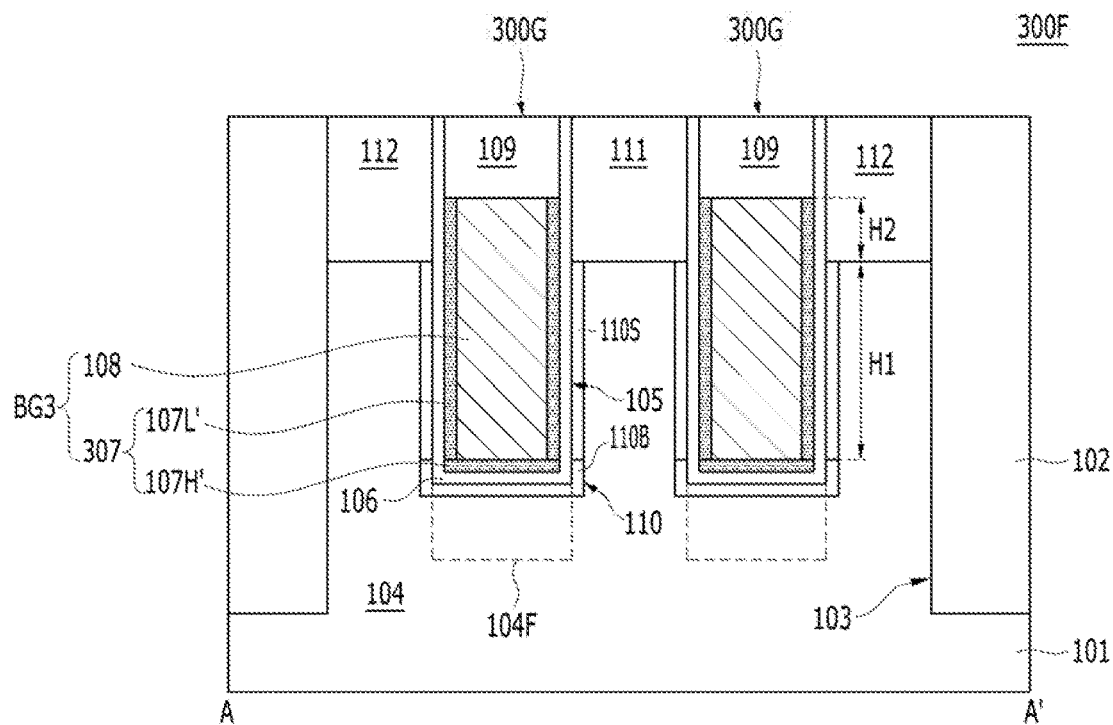
FIG. 4B is a cross-sectional view of an exemplary semiconductor device in accordance with an embodiment of the present invention.

FIG. 4A is a cross-sectional view of a semiconductor device in accordance with an embodiment of the present invention. FIG. 4B is a cross-sectional view of a semiconductor device in accordance with an embodiment of the present invention.

Referring to FIG. 4A, some constituents of the semiconductor device 300 in accordance with the embodiment of the present invention may be the same as those of the semiconductor device 100 and those of the semiconductor device 200. The semiconductor device 300 may include a substrate 101, an isolation layer 102, an active region 104, a gate trench 105, a channel region 110, a buried gate structure 300G, a first doped region 111, and a second doped region 112. The buried gate structure 300G may include a gate dielectric layer 106, a buried gate electrode BG3, and a capping layer 109. The buried gate electrode BG3 may include a work function layer 307, and a gate conductive layer 108. The work function layer 307 may include a doped high work function layer 107H' and a doped low work function layer 107L'. The channel region 110 may include a bottom channel 110B and a side channel 110S.

Hereafter, the work function layer 307 is described in detail.

The work function layer 307 may include a conductive material. The work function layer 307 may include a titanium nitride (TiN).

The work function layer 307 may contain different work function adjustment elements. The work function layer 307 may include a doped high work function layer 107H' and a doped low work function layer 107L'. The doped high work function layer 107H' may be doped with a high work function adjustment element, and the doped low work function layer 107L' may be doped with a low work function adjustment element.

To form the doped low work function layer 107L', the work function layer 107 may be locally doped with a low work function adjustment element. For example, the work function layer 107 may be doped with a carbon, a hydrogen, or a combination thereof. The low work function adjustment element may be doped through a doping process, such as a tilt-ion implantation. For example, the doped low work function layer 107L' may be locally formed on the work function layer 307 through a tilt-ion implantation of a low work function adjustment element. The doped low work function layer 107L' may include a titanium nitride doped with a carbon, a titanium nitride doped with a hydrogen, or a titanium nitride doped with a carbon and a hydrogen.

To form the doped high work function layer 107H', the work function layer 307 may be locally doped with a high work function adjustment element. For example, the work function layer 307 may be doped with an oxygen, a nitrogen, an aluminum, or a combination thereof. The high work function adjustment element may be doped through a doping process, such as a non-tilt-ion implantation process or a plasma doping process. For example, the doped high work function layer 107H' may be locally formed on the work function layer 307 through a vertical implantation of a high work function adjustment element. According to another embodiment of the present invention, the doped high work function layer 107H' may be formed through a direct plasma doping process of a high work function adjustment element. Oxygen and nitrogen may be individually doped through the plasma doping process or the non-tilt-ion implantation process. Aluminum may be doped through the non-tilt-ion implantation process. The doped high work function layer 107H' may be formed through a non-tilt-ion implantation process or a plasma doping process. The non-tilt-ion implantation process may be performed in a vertical direction with respect to the surface of the bottom channel 110B. The non-tilt-ion implantation process may be performed in parallel to the side channel 110S. The doped high work function layer 107H' may include a titanium nitride doped with an oxygen, a titanium nitride doped with a nitrogen, a titanium nitride doped with an aluminum, or a combination thereof.

Some constituents of the semiconductor device 300F illustrated in FIG. 4B may be the same as those of the semiconductor device 300 shown in FIG. 4A. The semiconductor device 300F in accordance with the embodiment of the present invention may further include a fin region 104F.

In accordance with the embodiments of the present invention described above, most of the undoped and doped high work function layers 107H and 107H' and the bottom channel 110B may overlap with each other. The undoped and doped high work function layers 107H and 107H' may not overlap with the side channel 110S. Undoped and doped low work function layers 107L and 107L' may overlap with the side channel 110S. The undoped and doped low work function layers 107L and 107L' may not overlap with the bottom channel 110B. The upper portions of the undoped and doped low work function layers 107L and 107L' may overlap with the first doped region 111 and the second doped region 112. Herein, the undoped and doped low work function layers 107L and 107L' may overlap with the side channel 110S in a horizontal direction. The undoped and doped low work function layers 107L and 107L' may fully overlap with the side channel 110S. As a result, the threshold voltage of the side channel 110S may be dominantly controlled by the low work function of the undoped and doped low work function layers 107L and 107L'. The undoped and doped high work function layers 107H and 107H' and the bottom channel 110B may overlap with each other in a vertical direction. The undoped and doped high work function layers 107H and 107H' may fully overlap with the bottom channel 110B. As a result, the threshold voltage of the bottom channel 110B may be dominantly controlled by the high work function of the undoped and doped high work function layers 107H and 107H'.

Figure 5A:
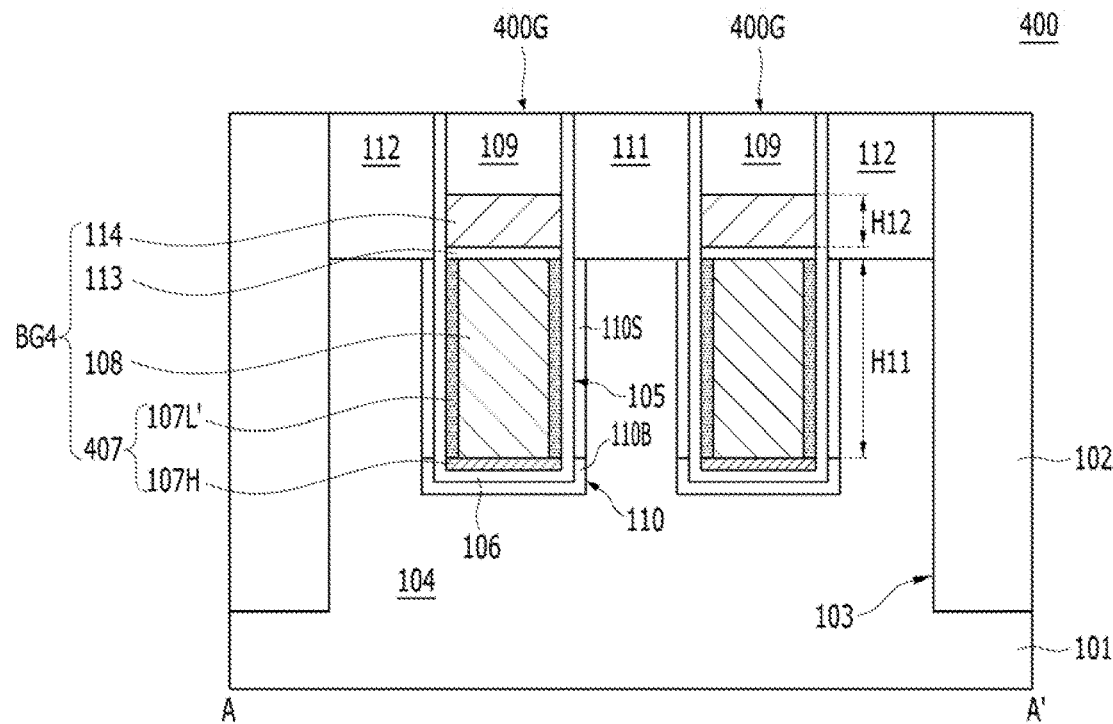
FIG. 5A is a cross-sectional view of an exemplary semiconductor device in accordance with an embodiment of the present invention.
Figure 5B:
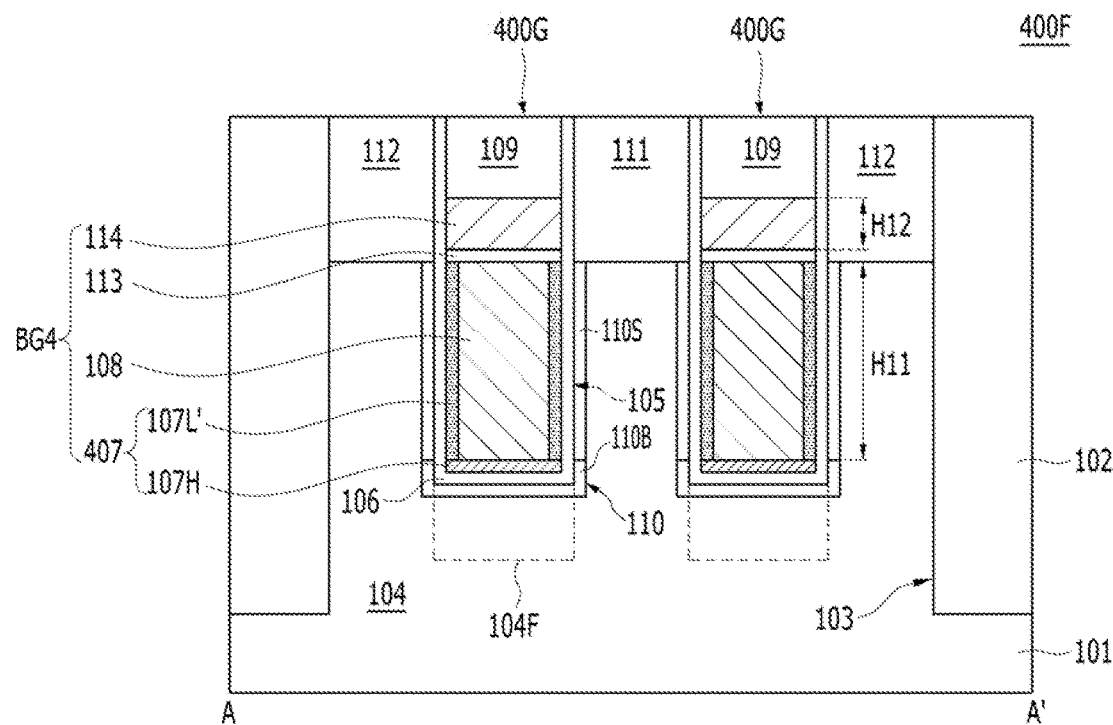
FIG. 5B is a cross-sectional view of an exemplary semiconductor device in accordance with an embodiment of the present invention.

FIG. 5A is a cross-sectional view of a semiconductor device in accordance with an embodiment of the present invention. FIG. 5B is a cross-sectional view of a semiconductor device in accordance with a modified example of the embodiment of the present invention.

Referring to FIG. 5A, some constituents of the semiconductor device 400 in accordance with the fifth embodiment of the present invention may be the same as those of the semiconductor device 100. The semiconductor device 400 may include a substrate 101, an isolation layer 102, an active region 104, a gate trench 105, a channel region 110, a buried gate structure 400G, a first doped region 111, and a second doped region 112. The buried gate structure 400G may include a gate dielectric layer 106, a buried gate electrode BG4, and a capping layer 109. The buried gate electrode BG4 may include a work function layer 407, a gate conductive layer 108, a barrier layer 113, and a silicon-based low work function layer 114. The work function layer 407 may include an undoped high work function layer 107H and a doped low work function layer 107L'. The channel region 110 may include a bottom channel 110B and a side channel 110S.

The undoped high work function layer 107H may include an undoped titanium nitride. The doped low work function layer 107L' may include a doped titanium nitride. The silicon-based low work function layer 114 may include a polysilicon. For example, the doped low work function layer 107L' may include a carbon-doped titanium nitride, a hydrogen-doped titanium nitride, or a combination thereof. The silicon-based low work function layer 114 may include a polysilicon doped with an N-type impurity, which is an N-doped polysilicon layer. For example, the silicon-based low work function layer 114 may include an arsenic (As)-doped polysilicon layer, and a phosphorus (P)-doped polysilicon layer.

The undoped high work function layer 107H may overlap with the bottom channel 110B. The doped low work function layer 107L' may overlap with the side channel 110S. The silicon-based low work function layer 114 may overlap with the first doped region 111 and the second doped region 112 in the horizontal direction. The doped low work function layer 107L' may not overlap with the first doped region 111 and the second doped region 112 in the horizontal direction. The undoped high work function layer 107H may be formed to be vertically spaced apart from the first doped region 111 and the second doped region 112 by a first height H11. The first height H11 may be the same as the height of the side channel 110S. The first height H11 may be defined as a height between the bottom surfaces of the first doped region 111 and the second doped region 112 and the lowest portion of the gate trench 105. The undoped high work function layer 107H may cover most of the lowest portion of the gate trench 105. Meanwhile, the silicon-based low work function layer 114 may overlap with the first and second doped regions 111 and 112 by a second height H12. The first height H11 may be longer than the second height H12. As described above, the doped low work function layer 107L' may fully overlap with the side channel 110S.

A barrier layer 113 may be formed between the silicon-based low work function layer 114 and the gate conductive layer 108. The barrier layer 113 may cover the surfaces of the gate conductive layer 108 and the doped low work function layer 107L'. The barrier layer 113 may include a titanium nitride. The barrier layer 113 may be made of an undoped titanium nitride. The barrier layer 113 may prevent a diffusion between the silicon-based low work function layer 114 and the gate conductive layer 108.

Since the silicon-based low work function layer 114 has a low work function, the gate-induced drain leakage (GIDL) in the first doped region 111 and the second doped region 112 may be suppressed.

Since the doped low work function layer 107L' fully overlaps with the side channel 110S, an off-leakage may be prevented.

The undoped high work function layer 107H may fully overlap with the bottom channel 110B. Accordingly, a threshold voltage of the bottom channel 110B may be dominantly controlled by the work function of the undoped high work function layer 107H.

Referring to FIG. 5B, some constituents of the semiconductor device 400F in accordance with the embodiment of the present invention may be the same as those of the semiconductor device 400 shown in FIG. 5A. The semiconductor device 400F may further include a fin region 104F.

Figure 6A:
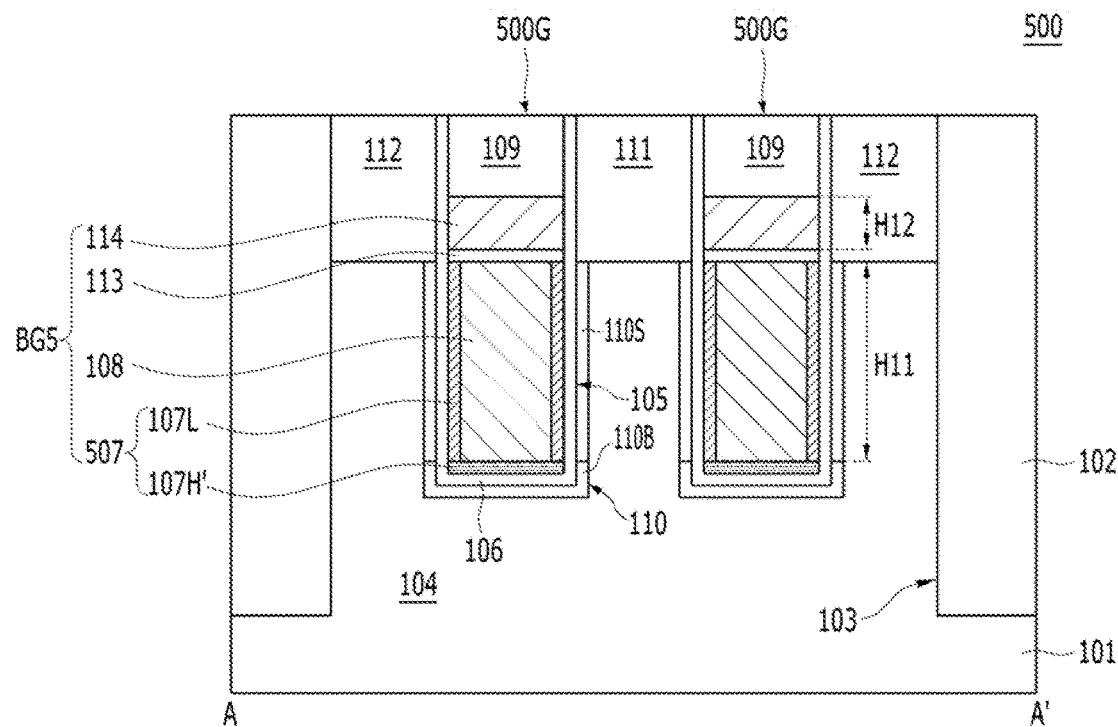
FIG. 6A is a cross-sectional view of an exemplary semiconductor device in accordance with an embodiment of the present invention.
Figure 6B:
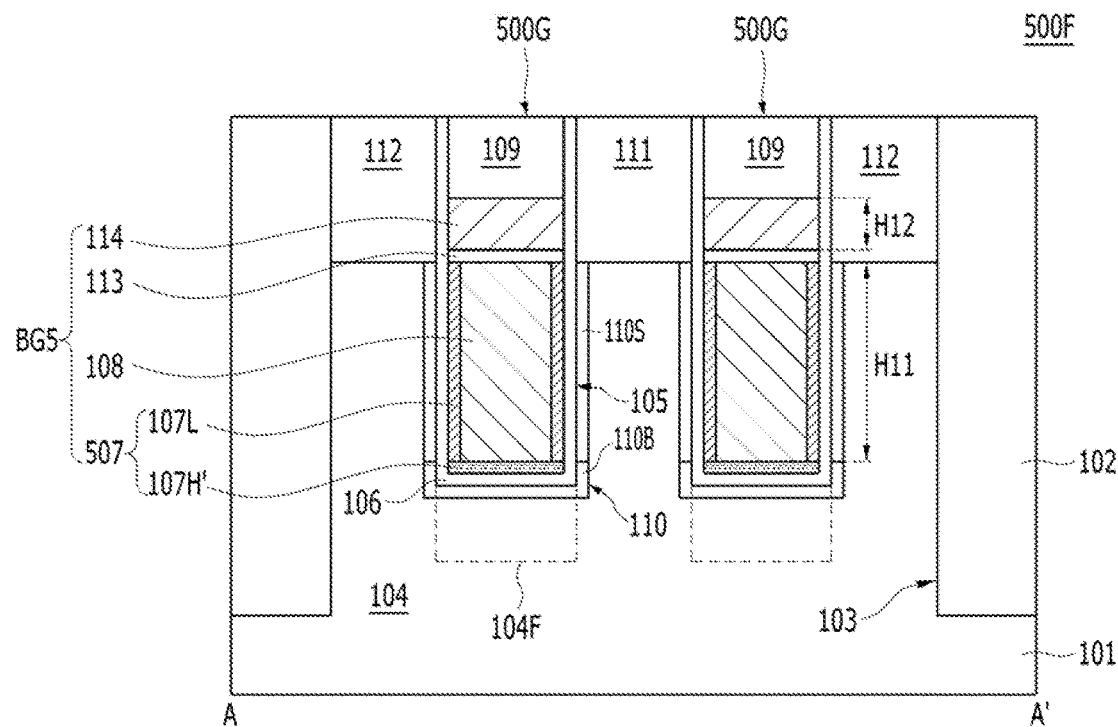
FIG. 6B is a cross-sectional view of an exemplary semiconductor device in accordance with an embodiment of the present invention.

FIG. 6A is a cross-sectional view of a semiconductor device in accordance with an embodiment of the present invention. FIG. 6B is a cross-sectional view of a semiconductor device in accordance with a modified example of the embodiment of the present invention.

Referring to FIG. 6A, some constituents of the semiconductor device 500 in accordance with the sixth embodiment of the present invention may be the same as those of the semiconductor device 100. The semiconductor device 500 may include a substrate 101, an isolation layer 102, an active region 104, a gate trench 105, a channel region 110, a buried gate structure 500G, a first doped region 111, and a second doped region 112. The buried gate structure 500G may include a gate dielectric layer 106, a buried gate electrode BG5, and a capping layer 109. The buried gate electrode BG5 may include a work function layer 507, a gate conductive layer 108, a barrier layer 113, and a silicon-based low work function layer 114. The work function layer 507 may include a doped high work function layer 107H' and an undoped low work function layer 107L. The channel region 110 may include a bottom channel 110B and a side channel 110S.

The doped high work function layer 107H' may include a doped titanium nitride. The undoped low work function layer 107L may include an undoped titanium nitride. The silicon-based low work function layer 114 may include a polysilicon. For example, the doped high work function layer 107H' may include an oxygen-doped titanium nitride, a nitrogen-doped titanium nitride, or an aluminum-doped titanium nitride. The silicon-based low work function layer 114 may include polysilicon doped with an N-type impurity, which is an N-doped polysilicon layer.

The doped high work function layer 107H' may overlap with the bottom channel 110B. The undoped low work function layer 107L may overlap with the side channel 110S. The silicon-based low work function layer 114 may overlap with the first doped region 111 and the second doped region 112. The undoped low work function layer 107L may not overlap with the first doped region 111 and the second doped region 112.

A barrier layer 113 may be formed between the silicon-based low work function layer 114 and the gate conductive layer 108. The barrier layer 113 may include a titanium nitride. The barrier layer 113 may be an undoped titanium nitride. The barrier layer 113 may prevent a diffusion between the silicon-based low work function layer 114 and the gate conductive layer 108.

Since the silicon-based low work function layer 114 has a low work function, the gate-induced drain leakage (GIDL) in the first doped region 111 and the second doped region 112 may be suppressed.

Since the undoped low work function layer 107L fully overlaps with the side channel 110S, an off-leakage may be prevented.

The doped high work function layer 107H' may fully overlap with the bottom channel 110B. Accordingly, a threshold voltage of the bottom channel 110B may be dominantly controlled by the work function of the doped high work function layer 107H'.

Referring to FIG. 6B, some constituents of the semiconductor device 500F in accordance with the sixth embodiment of the present invention may be the same as those of the semiconductor device 500 shown in FIG. 6A. The semiconductor device 500F may further include a fin region 104F.

Figure 7A:
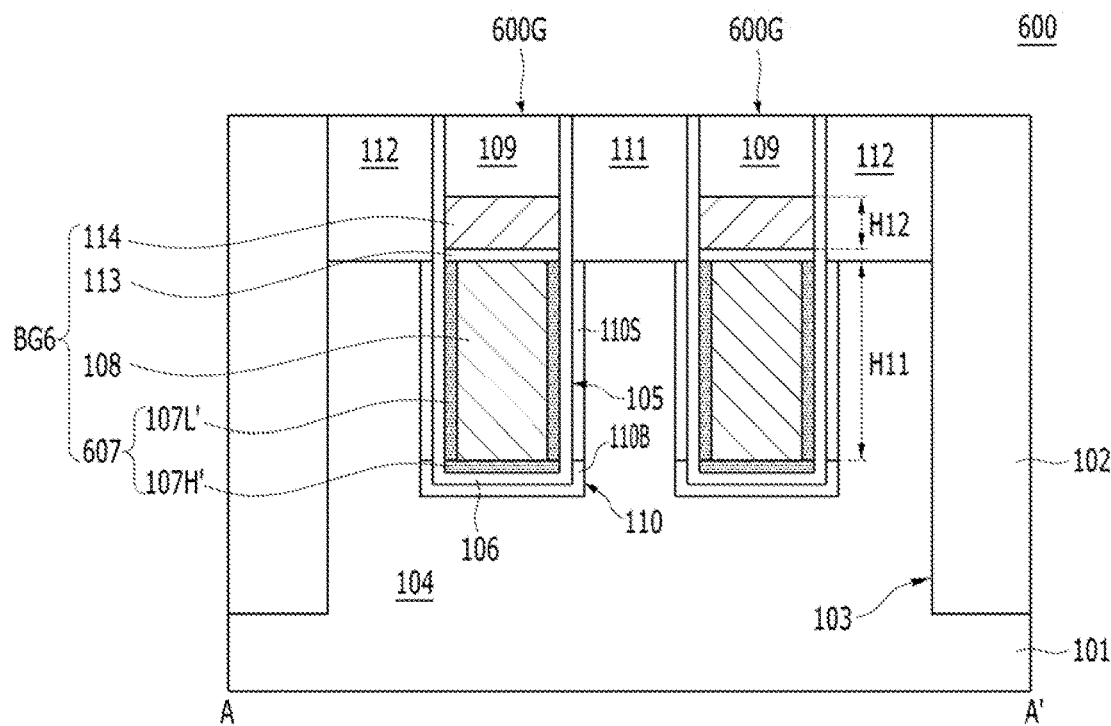
FIG. 7A is a cross-sectional view of an exemplary semiconductor device in accordance with an embodiment of the present invention.
Figure 7B:
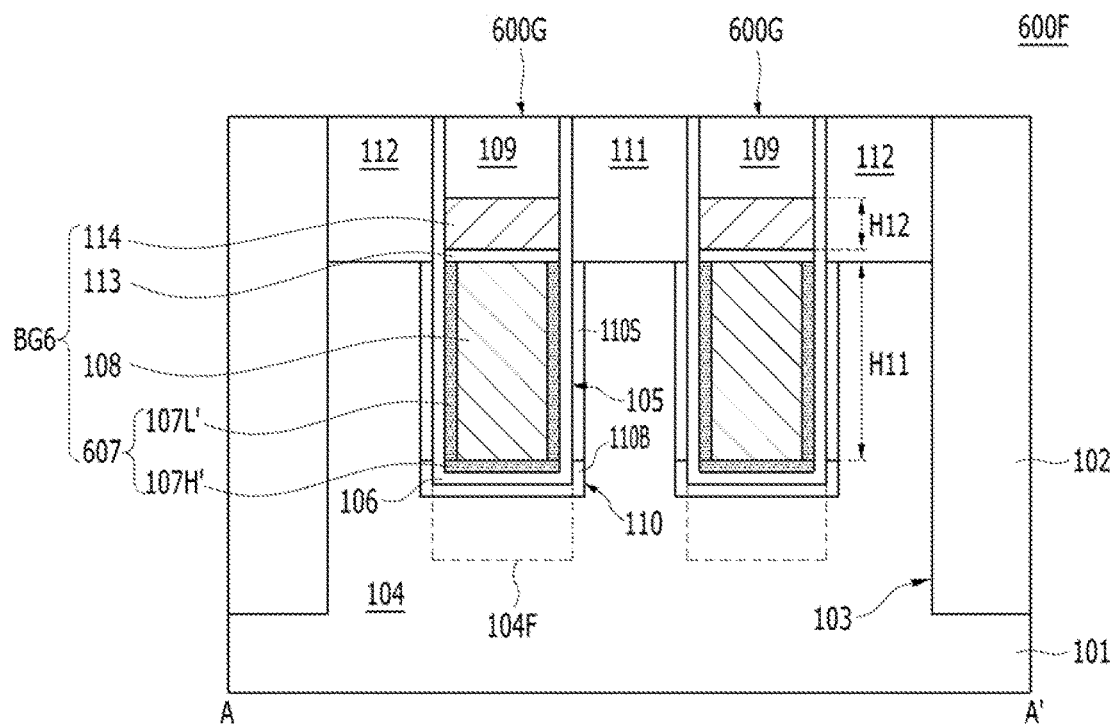
FIG. 7B is a cross-sectional view of an exemplary semiconductor device in accordance with an embodiment of the present invention.

FIG. 7A is a cross-sectional view of a semiconductor device in accordance with an embodiment of the present invention. FIG. 7B is a cross-sectional view of a semiconductor device in accordance with the embodiment of the present invention.

Referring to FIG. 7A, some constituents of the semiconductor device 600 in accordance with the embodiment of the present invention may be the same as those of the semiconductor device 100. The semiconductor device 600 may include a substrate 101, an isolation layer 102, an active region 104, a gate trench 105, a channel region 110, a buried gate structure 600G, a first doped region 111, and a second doped region 112. The buried gate structure 600G may include a gate dielectric layer 106, a buried gate electrode BG6, and a capping layer 109. The buried gate electrode BG6 may include a work function layer 607, a gate conductive layer 108, a barrier layer 113, and a silicon-based low work function layer 114. The work function layer 607 may include a doped high work function layer 107H' and a doped low work function layer 107L'. The channel region 110 may include a bottom channel 110B and a side channel 110S.

The doped high work function layer 107H' may include a doped titanium nitride. The doped low work function layer 107L' may include a doped titanium nitride. The silicon-based low work function layer 607L may include a polysilicon. For example, the doped high work function layer 107H' may include an oxygen-doped titanium nitride, a nitrogen-doped titanium nitride, or an aluminum-doped titanium nitride. The doped low work function layer 107L' may include a carbon-doped titanium nitride, a hydrogen-doped titanium nitride, or a combination thereof. The silicon-based low work function layer 114 may include a polysilicon doped with an N-type impurity, which is an N-doped polysilicon layer.

The doped high work function layer 107H' may overlap with the bottom channel 110B. The doped low work function layer 107L' may overlap with the side channel 110S. The silicon-based low work function layer 114 may overlap with the first doped region 111 and the second doped region 112. The doped low work function layer 107L' may not overlap with the first doped region 111 and the second doped region 112.

A barrier layer 113 may be formed between the silicon-based low work function layer 114 and the gate conductive layer 108. The barrier layer 113 may include a titanium nitride. The barrier layer 113 may be made of an undoped titanium nitride. The barrier layer 113 may prevent a diffusion between the silicon-based low work function layer 114 and the gate conductive layer 108.

Since the silicon-based low work function layer 114 has a low work function, the gate-induced drain leakage (GIDL) in the first doped region 111 and the second doped region 112 may be suppressed.

Since the doped low work function layer 107L' fully overlaps with the side channel 110S, an off-leakage may be prevented.

The doped high work function layer 107H' may fully overlap with the bottom channel 110B. Accordingly, the threshold voltage of the bottom channel 110B may be dominantly controlled by the work function of the doped high work function layer 107H'.

Referring to FIG. 7B, some constituents of the semiconductor device 600F in accordance with the embodiment of the present invention may be the same as those of the semiconductor device 600 shown in FIG. 7A. The semiconductor device 600F may further include a fin region 104F.

In the above embodiments of the present invention, the undoped and doped high work function layers 107H and 107H' and the undoped and doped low work function layers 107L and 107L' may be barrier layers. Therefore, the buried gate structures 100G to 600G may have a structure that a barrier layer is disposed between the gate conductive layer 108 and the gate dielectric layer 106.

In the above embodiments of the present invention, the undoped high work function layer 107H and the undoped low work function layer 107L may include a titanium aluminum nitride (TiAlN) or a titanium aluminum (TiAl). The doped high work function layer 107H' may include an oxygen-doped titanium aluminum nitride (TiAlN), a nitrogen-doped titanium aluminum nitride (TiAlN), an aluminum-rich doped titanium aluminum nitride (TiAlN), an oxygen-doped titanium aluminum (TiAl), a nitrogen-doped titanium aluminum (TiAl), or an aluminum-rich doped titanium aluminum (TiAl). The doped low work function layer 107L' may include a carbon-doped titanium aluminum nitride (TiAlN), a hydrogen-doped titanium aluminum nitride (TiAlN), a carbon-doped titanium aluminum (TiAl), or a hydrogen-doped titanium aluminum (TiAl).

Figure 8A:
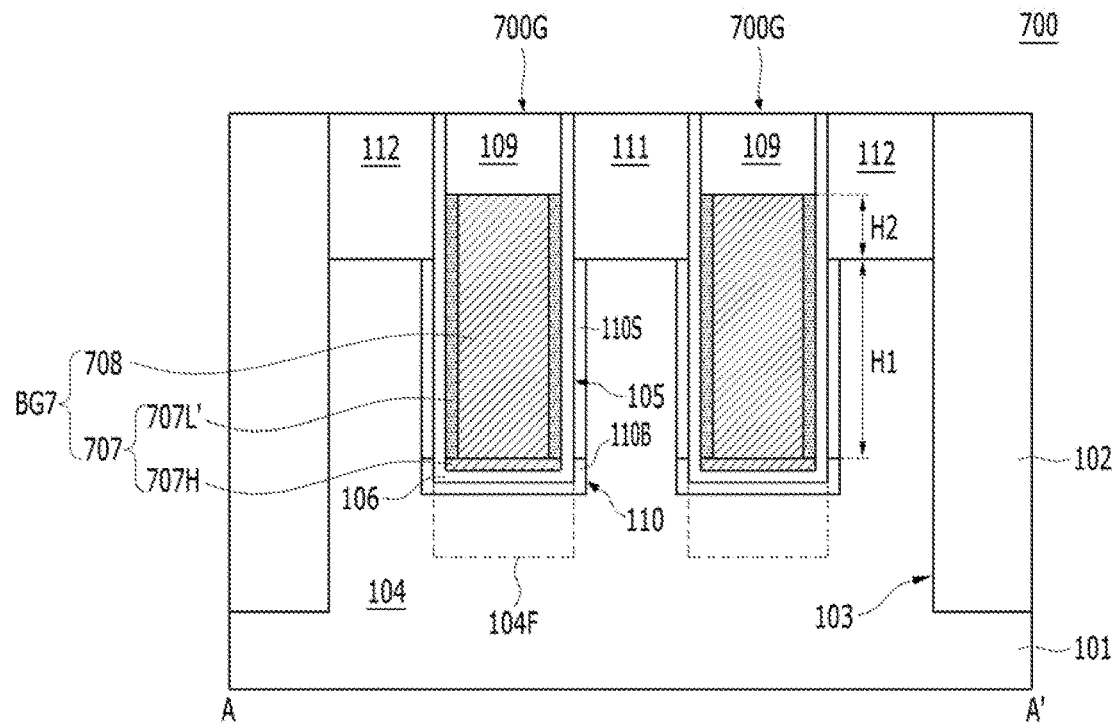
FIG. 8A is a cross-sectional view of an exemplary semiconductor device in accordance with an embodiment of the present invention.

FIG. 8A is a cross-sectional view of a semiconductor device in accordance with an embodiment of the present invention. FIGS. 8B to 8F are cross-sectional views illustrating the semiconductor device in accordance with the embodiment of the present invention.

The following embodiments of the present invention describe barrier-less buried gate structures. The barrier-less buried gate structures may not include a barrier layer between a gate conductive layer and a gate dielectric layer. The gate conductive layer may be formed of a material that does not attack the gate dielectric layer. For example, a buried gate electrode may be formed of a material, e.g., a gate conductive layer alone. The gate conductive layer may be made of a titanium nitride. The buried gate electrode BG made of a titanium nitride alone may be referred to as 'a TiN-Only BG'. Since the titanium nitride does not include a fluorine inside it, it does not attack the gate dielectric layer.

Referring to FIG. 8A, some constituents of the semiconductor device 700 in accordance with the embodiment of the present invention may be the same as those of the semiconductor device 100. The semiconductor device 700 may include a substrate 101, an isolation layer 102, an active region 104, a fin region 104F, a gate trench 105, a channel region 110, a buried gate structure 700G, a first doped region 111, and a second doped region 112. The buried gate structure 700G may include a gate dielectric layer 106, a buried gate electrode BG7, and a capping layer 109. The buried gate electrode BG7 may include a first gate conductive layer 707H, a second gate conductive layer 707L', and a third gate conductive layer 708. The first gate conductive layer 707H and the second gate conductive layer 707L' may be conformally formed over the gate dielectric layer 106. The first gate conductive layer 707H and the second gate conductive layer 707L' may form a continuum. The third gate conductive layer 708 disposed over the first gate conductive layer 707H and the second gate conductive layer 707L' may fill the gate trench 105. The first gate conductive layer 707H, the second gate conductive layer 707L', and the third gate conductive layer 708 may include a titanium nitride, individually.

The second gate conductive layer 707L' may include a doped titanium nitride. For example, the second gate conductive layer 707L' may include a carbon-doped titanium nitride, a hydrogen-doped titanium nitride, or a combination thereof. The first gate conductive layer 707H and the third gate conductive layer 708 may not be doped with a work function adjustment element, e.g., a carbon or a hydrogen. Therefore, the first gate conductive layer 707H and the third gate conductive layer 708 may include an undoped titanium nitride.

Figure 8B:
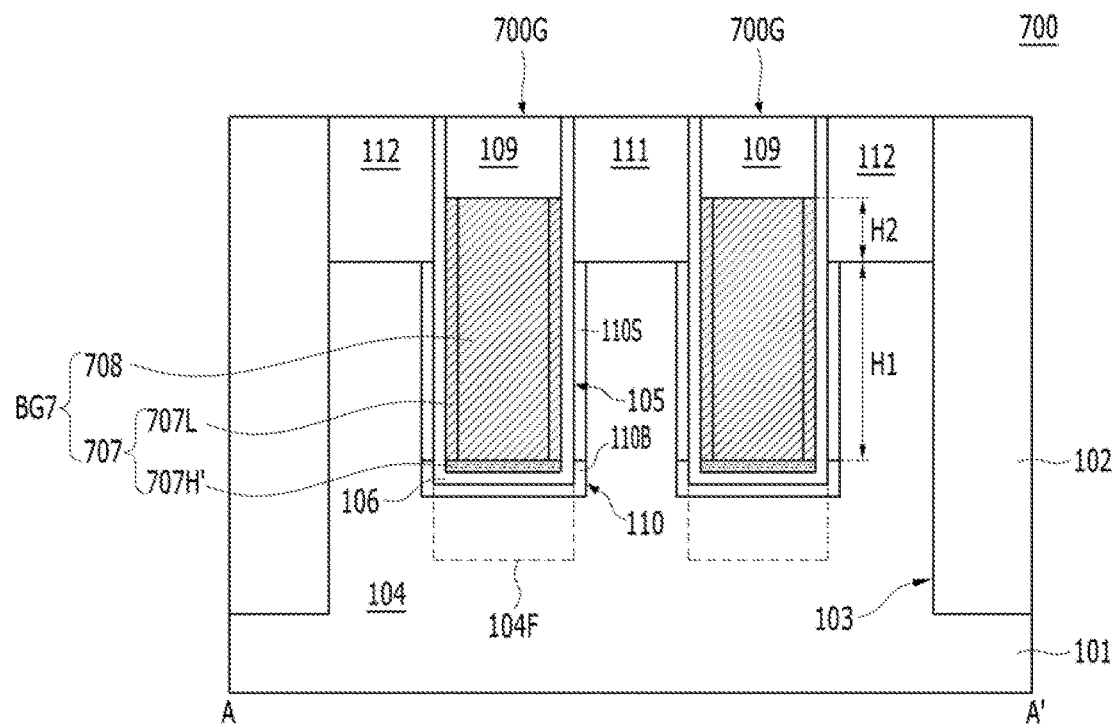
FIGS. 8B to 8F are cross-sectional views illustrating an exemplary semiconductor device in accordance with an embodiment of the present invention.

Referring to FIG. 8B, the buried gate electrode BG7 may include a first gate conductive layer 707H', a second gate conductive layer 707L, and a third gate conductive layer 708. The first gate conductive layer 707H', the second gate conductive layer 707L, and the third gate conductive layer 708 may include a titanium nitride, individually.

The first gate conductive layer 707H' may include a doped titanium nitride. For example, the first gate conductive layer 707H' may include an oxygen-doped titanium nitride, a nitrogen-doped titanium nitride, or an aluminum-doped titanium nitride. The second gate conductive layer 707L and the third gate conductive layer 708 may not be doped with a work function adjustment element, e.g., an oxygen, a nitrogen, or an aluminum. Therefore, the second gate conductive layer 707L and the third gate conductive layer 708 may include an undoped titanium nitride.

Figure 8C:
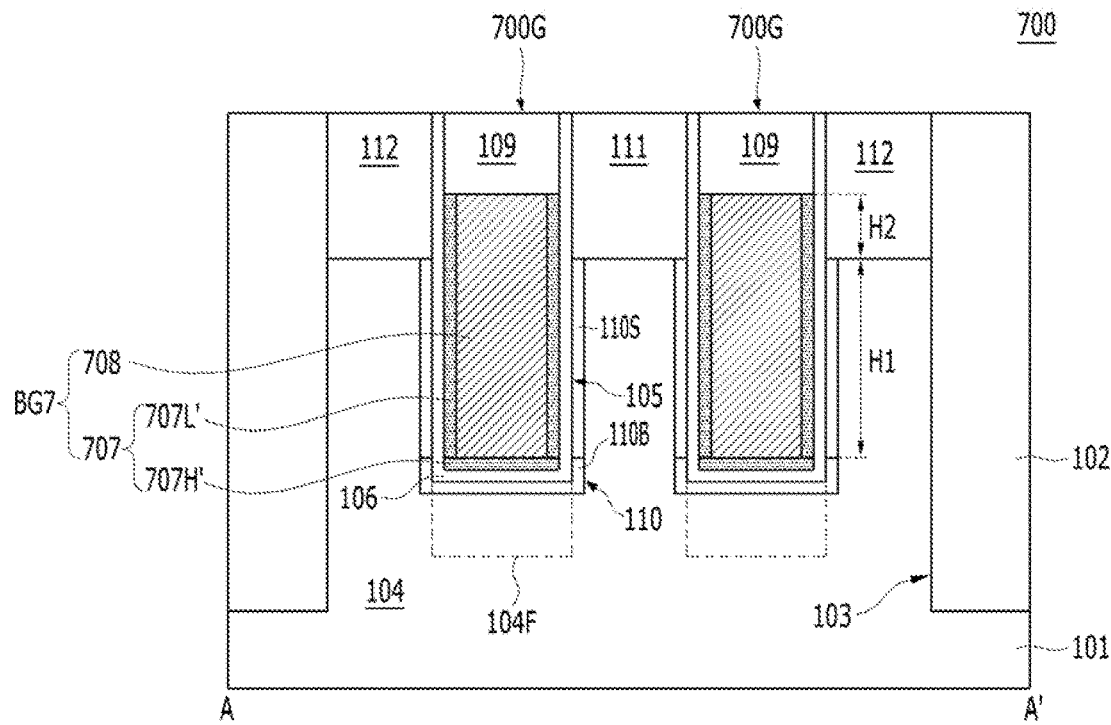

Referring to FIG. 8C, the buried gate electrode BG7 may include a first gate conductive layer 707H', a second gate conductive layer 707L', and a third gate conductive layer 708. The first gate conductive layer 707H', the second gate conductive layer 707L', and the third gate conductive layer 708 may include a titanium nitride, individually.

The first gate conductive layer 707H' may include a doped titanium nitride. For example, the first gate conductive layer 707H' may include an oxygen-doped titanium nitride, a nitrogen-doped titanium nitride, or an aluminum-doped titanium nitride. The second gate conductive layer 707L' may include a carbon-doped titanium nitride, a hydrogen-doped titanium nitride, or a combination thereof. The third gate conductive layer 708 may not be doped with a work function adjustment element, e.g., a carbon, a hydrogen, an oxygen, a nitrogen, or an aluminum. Therefore, the third gate conductive layer 708 may include an undoped titanium nitride.

Referring to FIGS. 8A to 8C, the first gate conductive layer 707H and 707H' may be formed to be vertically spaced apart from the first doped region 111 and the second doped region 112 by a first height H1. The first height H1 may be the same as the height of the side channel 110S. The first height H1 may be defined as a height between the bottom surfaces of the first and second doped regions 111 and 112 and the lowest portion of the gate trench 105. The first gate conductive layer 707H and 707H' may cover most of the lowest portion of the gate trench 105. The upper portion of the second gate conductive layer 707L and 707L' may overlap with the first and second doped regions 111 and 112 by a second height H2. The first height H1 may be longer than the second height H2. The second gate conductive layer 707L and 707L' may overlap with the side channel 110S by the first height H1. Therefore, the second gate conductive layer 707L and 707L' may fully overlap with the side channel 110S. As described above, the second gate conductive layer 707L and 707L' may sufficiently overlap not only with the first and second doped regions 111 and 112 but also with the side channel 110S.

Figure 8D:
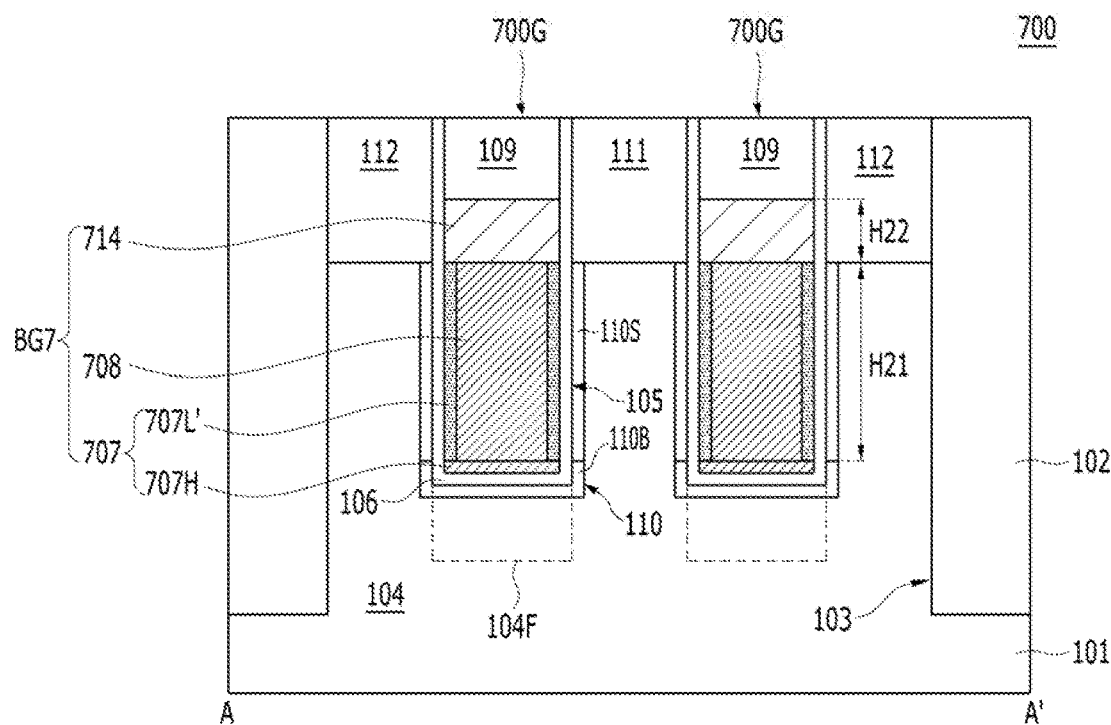

Referring to FIG. 8D, the buried gate electrode BG7 may include a first gate conductive layer 707H, a second gate conductive layer 707L', a third gate conductive layer 708, and a silicon-based low work function layer 714. The first gate conductive layer 707H, the second gate conductive layer 707L', and the third gate conductive layer 708 may include a titanium nitride, individually. The second gate conductive layer 707L' may include a doped titanium nitride. For example, the second gate conductive layer 707L' may include a carbon-doped titanium nitride, a hydrogen-doped titanium nitride, or a combination thereof. The first gate conductive layer 707H and the third gate conductive layer 708 may not be doped with a carbon or a hydrogen. Therefore, the first gate conductive layer 707H and the third gate conductive layer 708 may include an undoped titanium nitride. The silicon-based low work function layer 714 may include a polysilicon doped with an N-type impurity, which is an N-doped polysilicon layer. For example, the silicon-based low work function layer 714 may include an arsenic (As)-doped polysilicon layer or a phosphorus (P)-doped polysilicon layer. The first gate conductive layer 707H may be formed to be vertically spaced apart from the first doped region 111 and the second doped region 112 by a first height H21. The first height H21 may be the same as the height of the side channel 110S. The first height H21 may be defined as a height between the bottom surfaces of the first and second doped regions 111 and 112 and the lowest portion of the gate trench 105. The first gate conductive layer 707H may cover most of the lowest portion of the gate trench 105. Meanwhile, the silicon-based low work function layer 714 may overlap with the first and second doped regions 111 and 112 by a second height H22. The first height H21 may be longer than the second height H22. As described above, the second gate conductive layer 707L' may fully overlap with the side channel 110S.

Figure 8E:
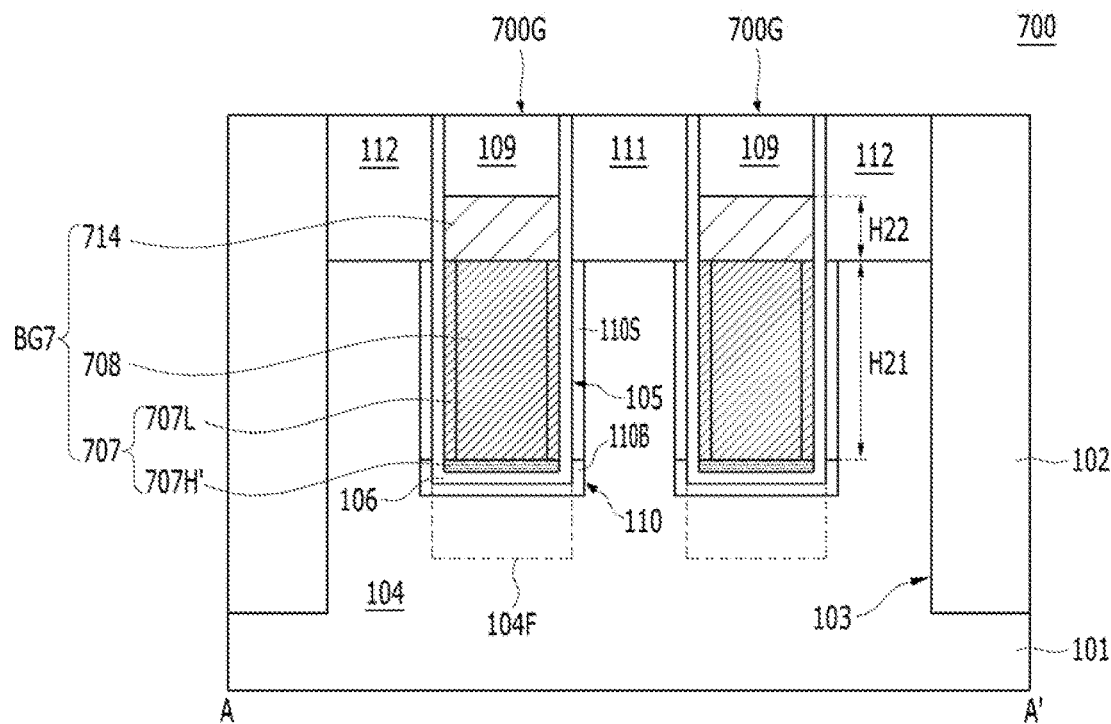

Referring to FIG. 8E, the buried gate electrode BG7 may include a first gate conductive layer 707H', a second gate conductive layer 707L, a third gate conductive layer 708, and a silicon-based low work function layer 714. The first gate conductive layer 707H', the second gate conductive layer 707L, and the third gate conductive layer 708 may include a titanium nitride (TiN), respectively. The first gate conductive layer 707H' may include a doped titanium nitride. For example, the first gate conductive layer 707H' may include an oxygen-doped titanium nitride, a nitrogen-doped titanium nitride, or an aluminum-doped titanium nitride. The second gate conductive layer 707L and the third gate conductive layer 708 may not be doped with a work function adjustment element, e.g., an oxygen, a nitrogen, or an aluminum. Therefore, the second gate conductive layer 707L and the third gate conductive layer 708 may include an undoped titanium nitride. The silicon-based low work function layer 714 may include a polysilicon doped with an N-type impurity, which is an N-doped polysilicon layer. For example, the silicon-based low work function layer 714 may include an arsenic (As)-doped polysilicon layer or a phosphorus (P)-doped polysilicon layer.

Figure 8F:
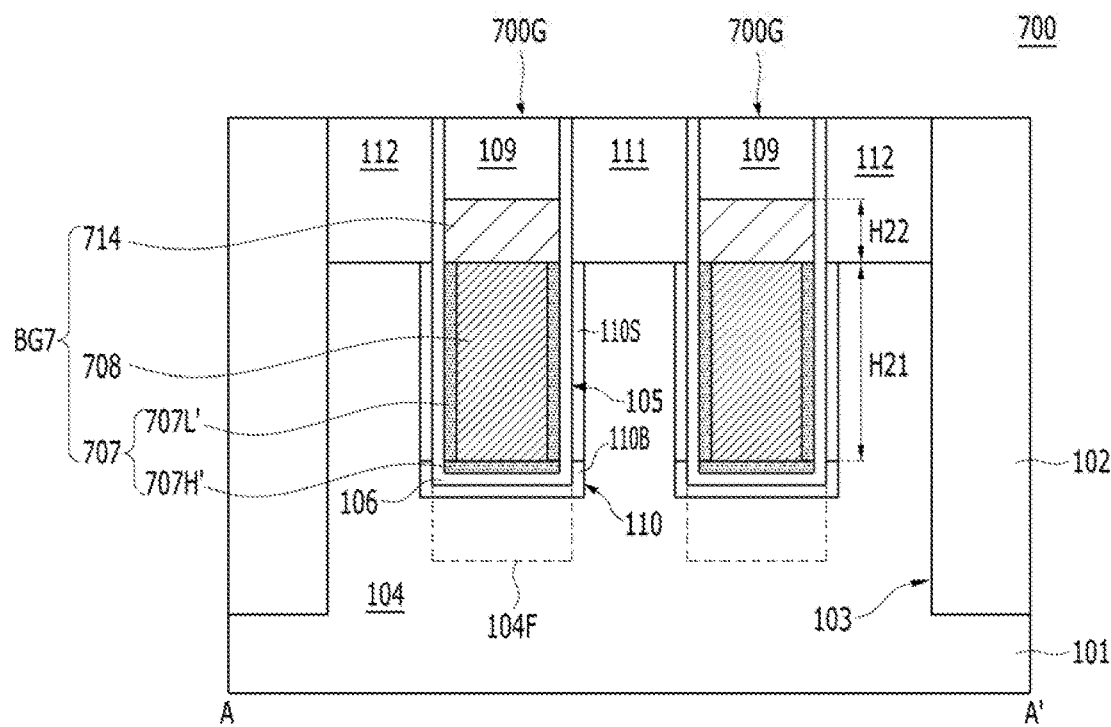

Referring to FIG. 8F, the buried gate electrode BG7 may include a first gate conductive layer 707H', a second gate conductive layer 707L', a third gate conductive layer 708, and a silicon-based low work function layer 714. The first gate conductive layer 707H', the second gate conductive layer 707L', and the third gate conductive layer 708 may include a titanium nitride, individually. The first gate conductive layer 707H' may include a doped titanium nitride. For example, the first gate conductive layer 707H' may include an oxygen-doped titanium nitride, a nitrogen-doped titanium nitride, or an aluminum-doped titanium nitride. The second gate conductive layer 707L' may include a carbon-doped titanium nitride, a hydrogen-doped titanium nitride, or a combination thereof. The third gate conductive layer 708 may not be doped with a work function adjustment element, e.g., a carbon, a hydrogen, an oxygen, a nitrogen, or an aluminum. Therefore, the third gate conductive layer 708 may include an undoped titanium nitride. The silicon-based low work function layer 714 may include a polysilicon doped with an N-type impurity, which is an N-doped polysilicon layer. For example, the silicon-based low work function layer 714 may include an arsenic (As)-doped polysilicon layer or a phosphorus (P)-doped polysilicon layer.

The semiconductor device 700 illustrated in FIGS. 8A to 8F may further include a fin region 104F. Also, the semiconductor device 700 illustrated in FIGS. 8D to 8F may not include a barrier layer between the silicon-based low work function layer 714 and the third gate conductive layer 708. In other words, since the third gate conductive layer 708 includes a titanium nitride, a diffusion between the silicon-based low work function layer 714 and the third gate conductive layer 708 may be prevented fundamentally.

Figure 9:
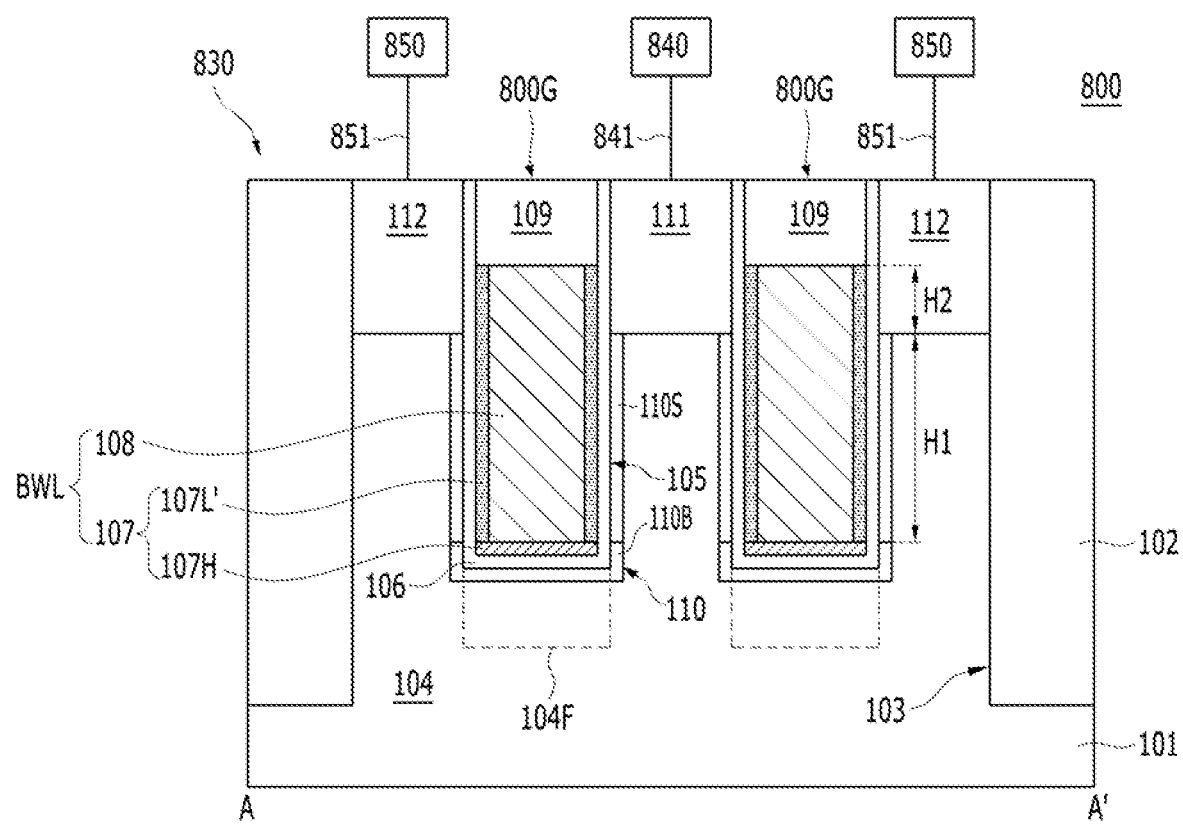
FIG. 9 illustrates an application example of the semiconductor devices in accordance with various embodiments of the present invention.

FIG. 9 illustrates an application example of the semiconductor devices 100 in accordance with the embodiment of the present invention.

Referring to FIG. 9, a memory cell 800 is illustrated. The memory cell 800 may include a cell transistor 830, a bit line 840, and a memory element 850. The cell transistor 830 may be the semiconductor devices 100 in accordance with the embodiment of the present invention. Therefore, the cell transistor 830 may include a buried word line structure 800G, a channel region 110, a first doped region 111, and a second doped region 112. The first doped region 111 may be electrically connected to the bit line 840 through a first contact plug 841. The second doped region 112 may be electrically connected to the memory element 850 through a second contact plug 851. The buried word line structure 800G may be the same as the buried gate structure (see '100G' of FIG. 1B). The buried word line structure 800G may be embedded in the inside of the gate trench 105. The buried word line structure 800G may include a gate dielectric layer 106, a buried word line BWL, and a capping layer 109. The buried word line BWL may include an undoped high work function layer 107H, a doped low work function layer 107L', and a gate conductive layer 108.

The buried word line structure 800G of the cell transistor 830 may be replaced with one buried gate structure selected from the buried gate structures 200G, 300G, 400G, 500G, 600G and 700G. Also, the cell transistor 830 may further include a fin region 104F.

The memory element 850 may be a capacitor. The memory element 850 may include a storage node in contact with the second contact plug 851. The storage node may be a cylindrical shape or a pillar shape. A capacitor dielectric layer may be formed on a surface of the storage node. The capacitor dielectric layer may include at least one selected from a group including a zirconium oxide, an aluminum oxide, and a hafnium oxide. For example, the capacitor dielectric layer may have a ZAZ structure where a first zirconium oxide, an aluminum oxide, and a second zirconium oxide are stacked. A plate node may be formed over the capacitor dielectric layer. The storage node and the plate node may include a metal-containing material.

According to another embodiment of the present invention, the memory element 850 may include a variable resistor. The variable resistor may include a phase-change material. The phase-change material may include at least one selected from a group including tellurium (Te) and selenium (Se), which are chalcogenide elements. According to another embodiment of the present invention, the variable resistor may include a transition metal oxide. According to yet another embodiment of the present invention, the variable resistor may be a Magnetic Tunnel Junction (MTJ).

As described above, the buried word line BWL of the memory cell 800 may include the undoped high work function layer 107H, the doped low work function layer 107L', and the gate conductive layer 108. When the memory cell 800 is applied to a Dynamic Random Access Memory (DRAM) device, the swing and the gate-induced drain leakage (GIDL) may be improved. Therefore, the off-leakage of the cell transistor 830 may be prevented. After all, refresh characteristics of the DRAM may be improved.

The semiconductor devices in accordance with the embodiments of the present invention may be applied to an electronic device. The electronic device may include a plurality of semiconductor devices. For example, the electronic device may include at least one or more of the semiconductor devices 100, 100F, 200, 200F, 300, 300F, 400, 400F, 500, 500F, 600, 600F and 700 in accordance with the above-described embodiments of the present invention and the memory cell 800.

At least one semiconductor device of the semiconductor devices included in the electronic device may include a buried gate structure formed in the inside of the gate trench. The buried gate structure may include a high work function layer and a low work function layer. The high work function layer and the low work function layer may be the same as those in the above-described embodiments of the present invention. The threshold voltage of the bottom channel may be increased by the high work function layer. The threshold voltage of the side channel may be suppressed by the low work function layer. Also, the gate-induced drain leakage (GIDL) may be improved by the low work function layer. Therefore, the electronic device may be able to realize a rapid operation speed even though the electronic device is small.

FIGS. 10A to 10F are cross-sectional views illustrating a method for fabricating the semiconductor devices according to a first example. Hereafter, an example of a method for fabricating the semiconductor device 100 of FIG. 1A and the semiconductor device 100F of FIG. 2A is described with reference to FIGS. 10A to 10F.

Figure 10A:
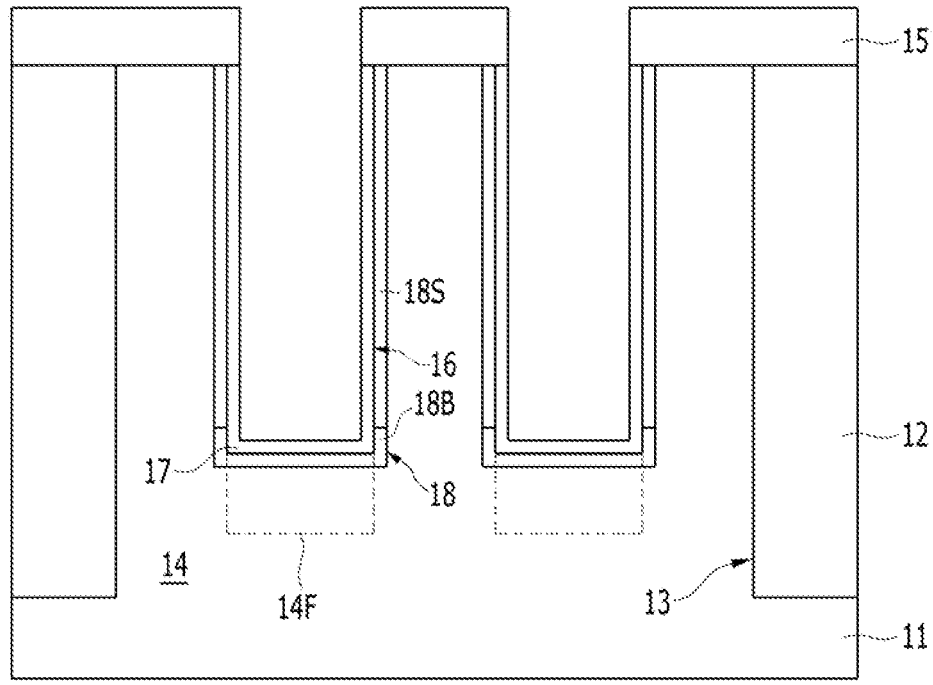
FIGS. 10A to 10F are cross-sectional views illustrating a method for fabricating the semiconductor devices according to an example.

Referring to FIG. 10A, an isolation layer 12 may be formed in a substrate 11. The isolation layer 12 may define an active region 14. The isolation layer 12 may be formed through a Shallow Trench Isolation (STI) process. The STI process may be performed as follows. An isolation trench 13 may be formed by etching the substrate 11. The isolation trench 13 may be filled with an isolation material, and as a result, the isolation layer 12 may be formed. The isolation layer 12 may include a silicon oxide, a silicon nitride, or a combination thereof. A Chemical Vapor Deposition (CVD) process or other deposition processes may be performed to fill the isolation trench 13 with an isolation material. Herein, a planarization process such as a Chemical Mechanical Polishing (CMP) may be additionally performed.

A hard mask layer 15 may be formed over the substrate 11. The hard mask layer 15 may be formed of a material having an etch selectivity with respect to the substrate 11. The hard mask layer 15 may include a silicon oxide. The hard mask layer 15 may include TEOS (Tetra-Ethyl-Ortho-Silicate).

A gate trench 16 may be formed in the inside of the substrate 11. The gate trench 16 may have a shape of a line that traverses the active region 14 and the isolation layer 12. In order to the gate trench 16, a mask pattern (not shown) may be formed over the substrate 11, and an etch process may be performed by using the mask pattern as an etch mask. The gate trench 16 may be formed shallower than the isolation trench 13. a depth of the gate trench 16 may be deep enough to enlarge an average cross-sectional area of a buried gate electrode, which is to be formed subsequently. Accordingly, a resistance of the buried gate electrode may be decreased. Bottom edges of the gate trench 16 may have a curved shape. By forming the bottom portion of the gate trench 16 to have the curved shape, a unevenness in the bottom portion of the gate trench 16 may be minimized, and thus, the gate electrode may be easily filled. Also, by forming the bottom portion of the gate trench 16 to have the curved shape, squared edges may be removed from the bottom portion of the gate trench 16, thus alleviating concentration of an electric field.

A fin region 14F may be formed. The fin region 14F may be formed by recessing the isolation layer 12.

Subsequently, a channel region 18 may be defined along a profile of the gate trench 16. For example, a side channel 18S may be defined on outer sidewalls of the gate trench 16, and the bottom channel 18B may be defined on the outer sidewalls of the gate trench 16. The bottom channel 18B may be defined on the upper portion and inner sidewalls of the fin region 14F.

As one method for defining the bottom channel 18B and the side channel 18S, a channel doping process may be performed. The channel doping process may be performed on the bottom and sidewalls of the gate trench 16. In addition, a local channel doping process may be performed on the bottom of the gate trench 16. While the channel doping process is performed, a doping concentration may be controlled. In other words, when a work function layer is formed subsequently, the channel doping concentration may be decreased or the channel doping process may be omitted. In particular, the local channel doping concentration may be decreased or the local channel doping process may be omitted.

A gate dielectric layer 17 may be formed over the bottom surface and inner sidewalls of the gate trench 16. Before the gate dielectric layer 17 is formed, the damage on the surface of the gate trench 16 caused by an etch process may be cured. For example, after a sacrificial oxide is formed through a thermal oxidation process, a sacrificial oxide may be removed.

The gate dielectric layer 17 may be formed through a thermal oxidation process. According to another embodiment of the present invention, the gate dielectric layer 17 may be formed through a Chemical Vapor Deposition (CVD) process or an Atomic Layer Deposition (ALD) process. The gate dielectric layer 17 may include a high dielectric material, an oxide, a nitride, an oxynitride, or a combination thereof. The high dielectric material may include a hafnium-containing material. The hafnium-containing material may include a hafnium oxide, a hafnium silicon oxide, a hafnium silicon oxynitride, or a combination thereof. According to another embodiment of the present invention, the high dielectric material may include a lanthanum oxide, a lanthanum aluminum oxide, a zirconium oxide, a zirconium silicon oxide, a zirconium silicon oxynitride, an aluminum oxide, and combinations thereof. Also, other known high dielectric materials may be selectively used in place of the high dielectric material described above.

According to another embodiment of the present invention, the gate dielectric layer 17 may be formed by depositing and then radical-oxidizing a liner polysilicon layer.

According to yet another embodiment of the present invention, the gate dielectric layer 17 may be formed by depositing and then radical-oxidizing a liner silicon nitride layer.

Figure 10B:
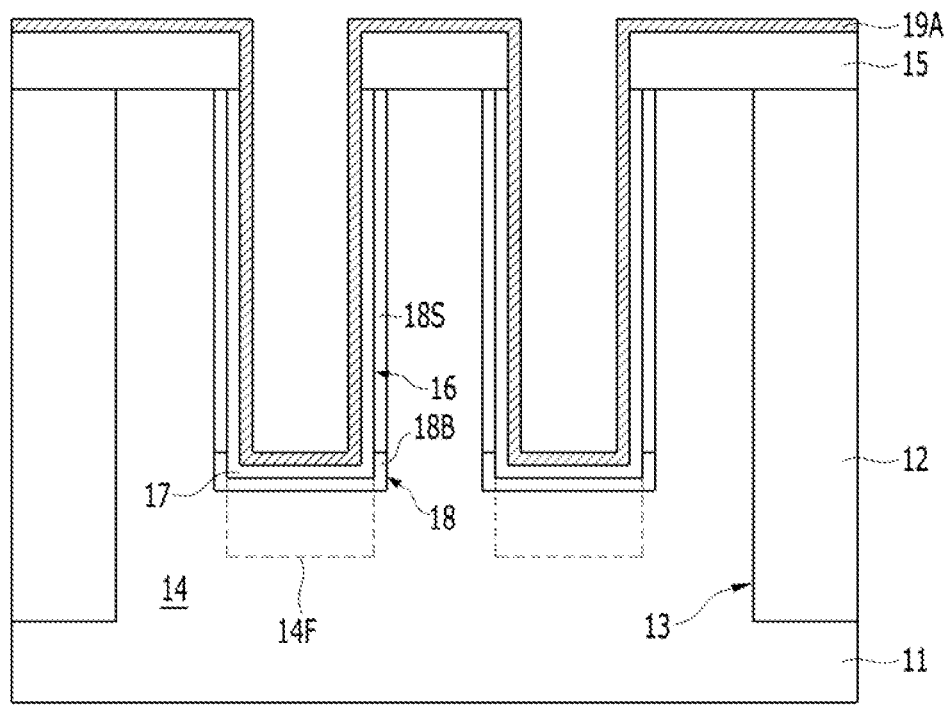

Referring to FIG. 10B, a work function layer 19A may be formed over the gate dielectric layer 17. The work function layer 19A may be conformally formed over the surface of the gate dielectric layer 17. The work function layer 19A may include a conductive material. The work function layer 19A may be formed through a Chemical Vapor Deposition (CVD) process and an Atomic Layer Deposition (ALD) process. The work function layer 19A may be a thin layer. For example, the work function layer 19A may be a continuous layer that is formed to a uniform thickness along the inner sidewalls of the gate trench 16. The work function layer 19A may include a material having a lower resistance than a polysilicon layer. The work function layer 19A may be made of a metal-based material. The work function layer 19A may function as a barrier layer for preventing an impurity of a subsequent gate conductive layer from diffusing into the gate dielectric layer 17. The work function layer 19A may be a metal nitride layer. The work function layer 19A may include a titanium nitride (TiN). The work function layer 19A may include a titanium nitride having a stoichiometric composition ratio. Also, the work function layer 19A may include an undoped titanium nitride.

Figure 10C:
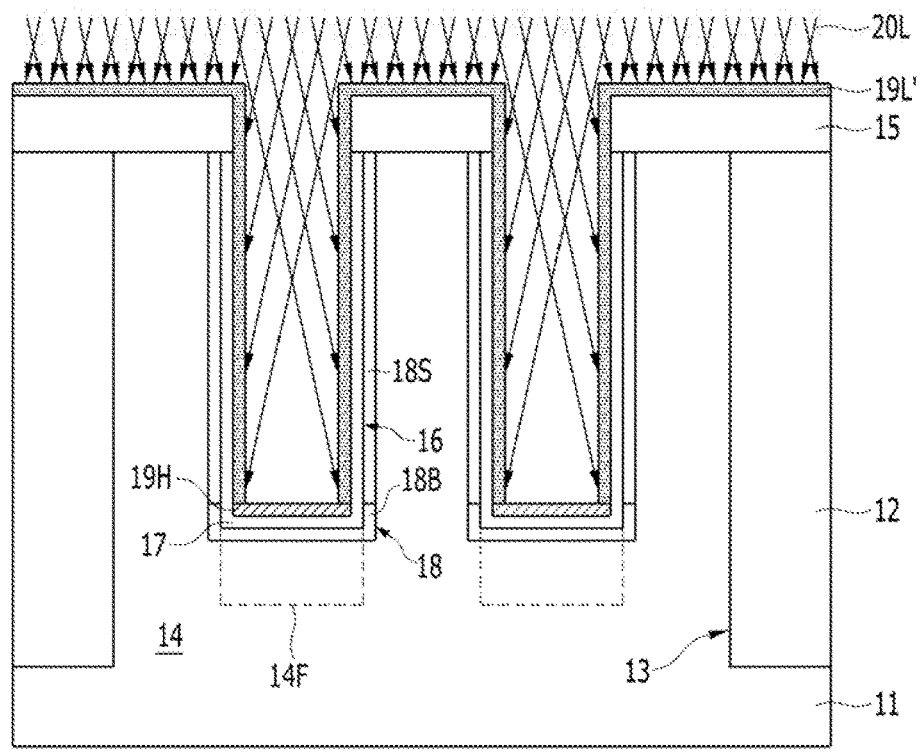

Referring to FIG. 10C, a low work function adjustment element doping process 20L may be performed. Through the low work function adjustment element doping process 20L, the work function layer 19A may be locally doped with a low work function adjustment element. The low work function adjustment element may refer to a material for engineering the work function layer 19A into a low work function. The low work function adjustment element may include a carbon, a hydrogen, or a combination thereof.

Through the low work function adjustment element doping process 20L, the work function layer 19A may locally include a low work function adjustment element. For example, a low work function layer 19L' may be formed through the low work function adjustment element doping process 20L. Therefore, the work function layer 19A may be divided into a high work function layer 19H and the low work function layer 19L'. The high work function layer 19H may not be doped with a low work function adjustment element. Further, the high work function layer 19H may not be doped with a high work function adjustment element. In addition, the high work function layer 19H may have an intrinsic work function of the work function layer 19A. Therefore, the high work function layer 19H may refer to a layer having a higher work function than the low work function layer 19L', and it may not be doped with a high work function adjustment element. The low work function layer 19L' and the high work function layer 19H may be a continuous layer. The low work function layer 19L' may be formed on the sidewall and upper surface of the hard mask layer 15.

As described above, the low work function layer 19L' may be formed through the low work function adjustment element doping process 20L. In short, to form the low work function layer 19L', the low work function adjustment element may be locally doped. For example, a carbon, a hydrogen, or a combination thereof may be doped into the low work function layer 19L' through the low work function adjustment element doping process 20L. The low work function adjustment element may be doped through a doping process, such as a tilt-implantation process. For example, the low work function layer 19L' may be locally formed on the work function layer 19A through a tilt-implantation of a low work function adjustment element. Herein, since a portion of the work function layer 19A where the tilt-implantation is not performed is not doped with the low work function adjustment element, the portion may remain as the high work function layer 19H. The low work function layer 19L' may include a doped titanium nitride. In other words, the low work function layer 19L' may include a carbon-doped titanium nitride, a hydrogen-doped titanium nitride, or a combination thereof. The high work function layer 19H may include an undoped titanium nitride (TiN) that is not doped with carbon or hydrogen. In some embodiments, the low work function adjustment element may be implanted at an implantation energy of from approximately 3 KeV to approximately 5 KeV. In some embodiments the low work function adjustment element may be implanted at a dose of from approximately $1 \times 10^{14}$ atoms/cm$^2$ to approximately $5 \times 10^{15}$ atoms/cm$^2$.

The low work function layer 19L' may be formed through the tilt-implantation process. The tilted angle in the tilt-implantation process may be adjusted in such a manner that most of the low work function layer 19L' and the side channel 18S may overlap with each other. The low work function layer 19L' may not overlap with the bottom channel 18B. The high work function layer 19H may overlap with the bottom channel 18B. The high work function layer 19H may not overlap with the side channel 18S.

Figure 10D:
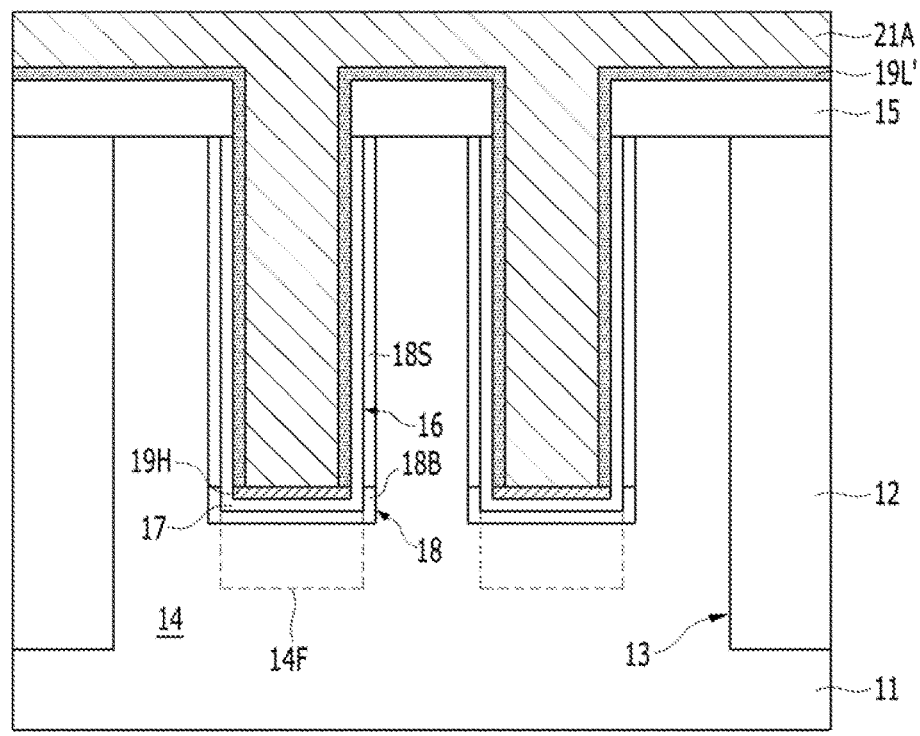

Referring to FIG. 10D, a low resistance layer 21A may be formed. The low resistance layer 21A may fill the gate trench 16 over the high work function layer 19H and the low work function layer 19L'. The low resistance layer 21A may be formed of a metal-based material. The low resistance layer 21A may include a tungsten layer.

Figure 10E:
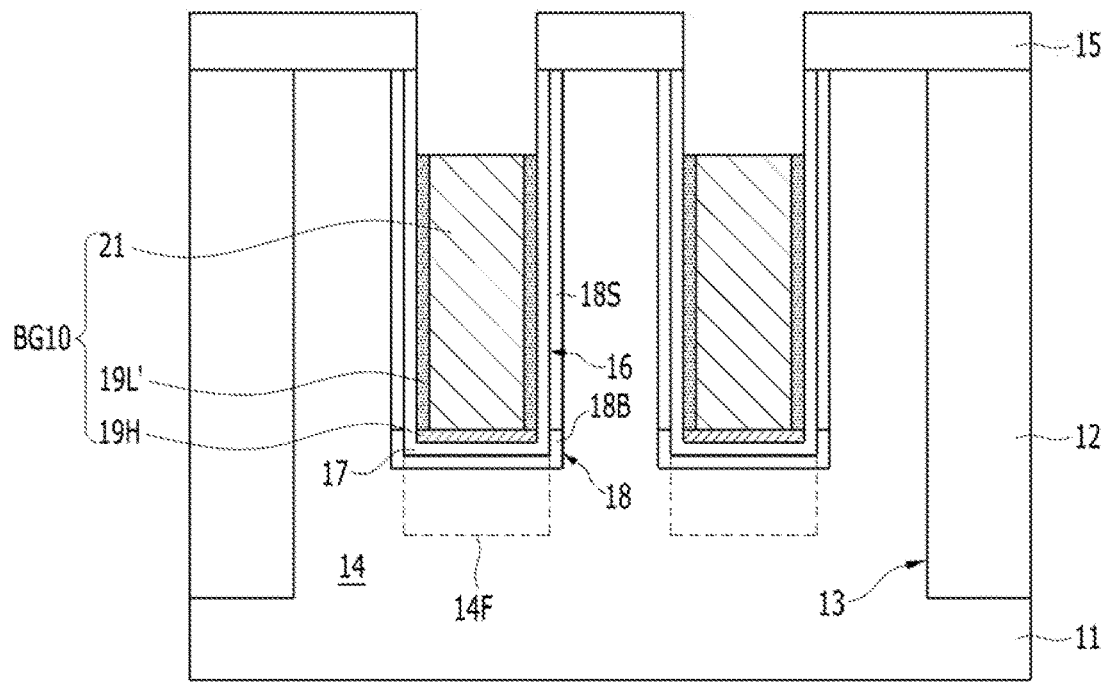

Referring to FIG. 10E, a buried gate electrode BG10 may be formed. To form the buried gate electrode BG10, the low work function layer 19L' and the low resistance layer 21A may be recessed through an etch-back process. The buried gate electrode BG10 may be formed at a lower level than the upper surface of the active region 14. Therefore, the buried gate electrode BG10 may be positioned in the inside of the gate trench 16. Before the etch-back process is performed, a planarization process such as a Chemical Mechanical Polishing (CMP) may be performed in advance. Through the CMP process and the etch-back process of the low resistance layer 21A, a gate conductive layer 21 may be formed. The low work function layer 19L' may remain only in the inside of the gate trench 16 through the CMP process and the etch-back process. The high work function layer 19H may not be exposed to the etch-back process and the CMP process.

The buried gate electrode BG10 may include the high work function layer 19H, the low work function layer 19L', and the gate conductive layer 21. The low work function layer 19L' may contact the sidewalls of the gate conductive layer 21. The high work function layer 19H may contact with the bottom surface of the gate conductive layer 21. The high work function layer 19H and the low work function layer 19L' may form a continuum. The upper surface of the gate conductive layer 21 and the upper surface of the low work function layer 19L' may be formed at the same level.

Figure 10F:
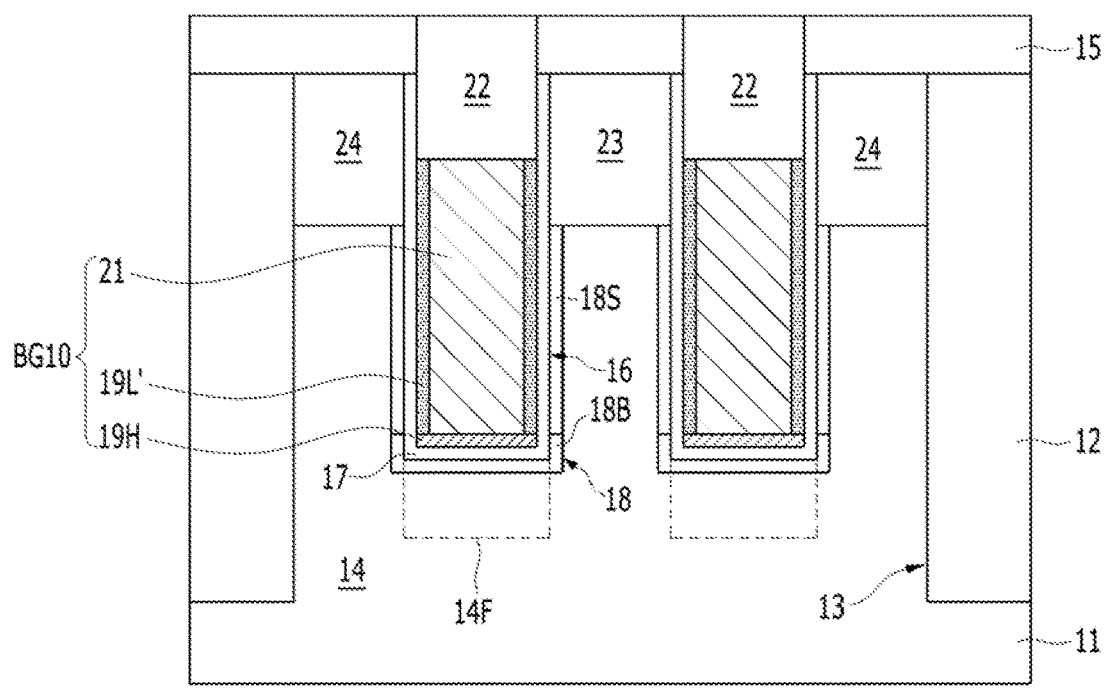

Referring to FIG. 10F, a capping layer 22 may be formed over the buried gate electrode BG10. The capping layer 22 may include a dielectric material. The gate trench 16 may be filled with the capping layer 22 over the buried gate electrode BG10. The capping layer 22 may include a silicon nitride. Subsequently, the capping layer 22 may be planarized to expose the upper surface of the substrate 11. According to another embodiment of the present invention, the capping layer 22 may include a silicon oxide. According to yet another embodiment of the present invention, the capping layer 22 may have a NON (Nitride-Oxide-Nitride) structure.

As the capping layer 22 is formed, a buried gate structure may be formed. The buried gate structure may include the gate dielectric layer 17, the high work function layer 19H, the low work function layer 19L', the gate conductive layer 21, and the capping layer 22.

Subsequently, a first doped region 23 and a second doped region 24 may be formed. The first doped region 23 and the second doped region 24 may be formed through a doping process, such as an implantation process. The first doped region 23 and the second doped region 24 may have the same depth. According to another embodiment of the present invention, the first doped region 23 may be deeper than the second doped region 24. The channel region 18 may be defined between the first doped region 23 and the second doped region 24. In other words, the channel region 18 may include the side channel 18S and the bottom channel 18B. The first doped region 23 and the second doped region 24 may make the height of the side channel 18S lower than its initial height, which is the height of the side channel 18S when the side channel 18S is initially formed.

The first doped region 23 and the second doped region 24 may have a depth that horizontally overlaps with the upper portion of the low work function layer 19L'. Also, the first doped region 23 and the second doped region 24 may be disposed at a depth that is sufficiently spaced apart from the high work function layer 19H in a vertical direction.

The low work function layer 19L' and the side channel 18S may overlap with each other in a horizontal direction. The low work function layer 19L' may fully overlap with the side channel 18S. As a result, the threshold voltage of the side channel 18S may be dominantly controlled by the low work function of the low work function layer 19L'. The high work function layer 19H and the bottom channel 18B may vertically overlap with each other. The high work function layer 19H may fully overlap with the bottom channel 18B. As a result, the threshold voltage of the bottom channel 18B may be dominantly controlled by the high work function of the high work function layer 19H. The high work function layer 19H may have a high work function higher than approximately 4.5 eV. The low work function layer 19L may have a lower work function than approximately 4.5 eV.

Figure 11A:
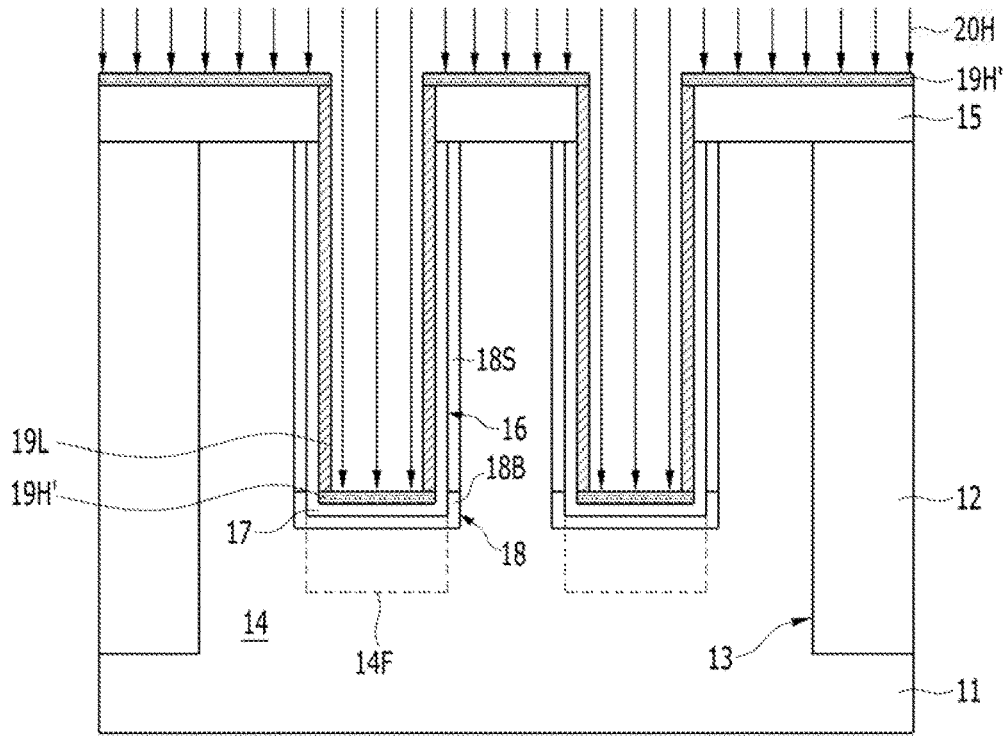
FIGS. 11A to 11C are cross-sectional views illustrating a method for fabricating the semiconductor devices according to an example.
Figure 11B:
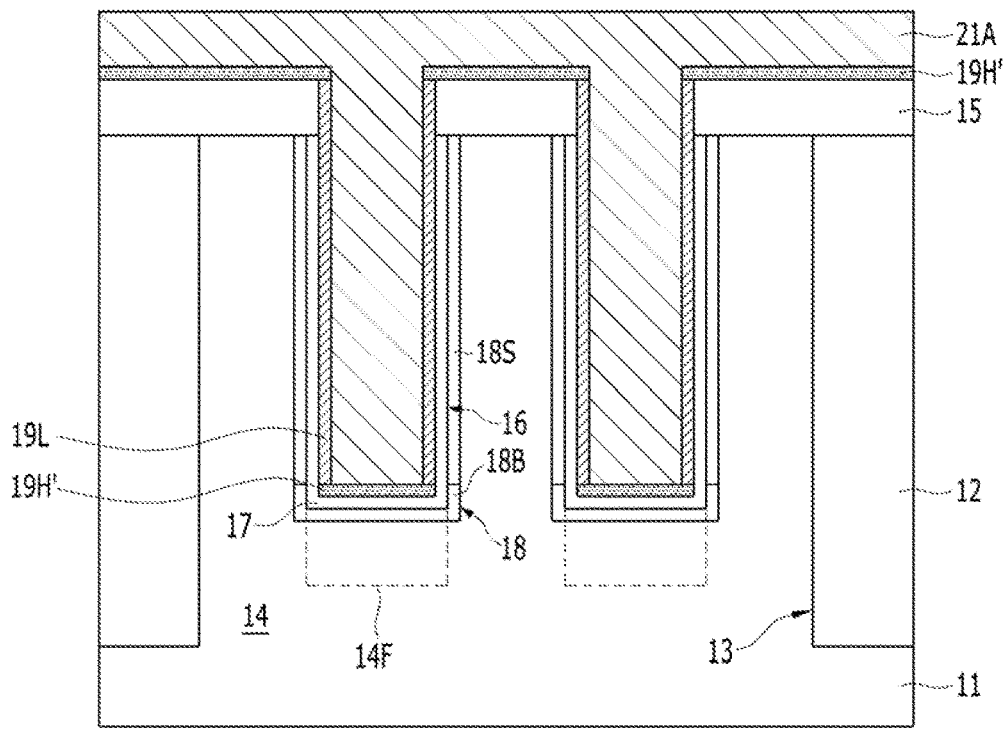
Figure 11C:
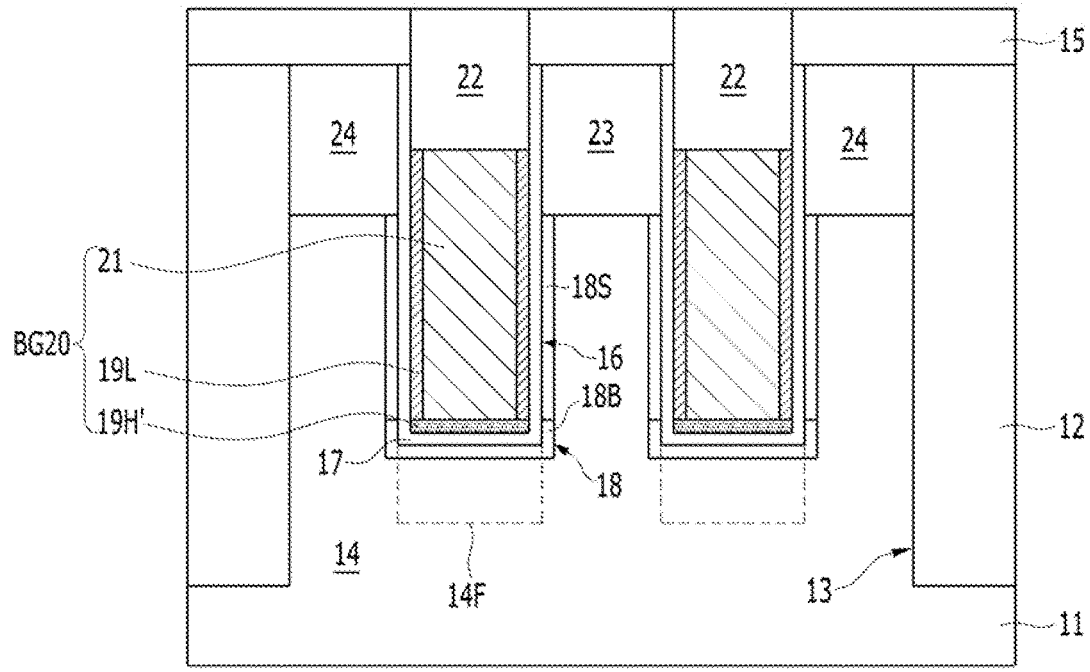

FIGS. 11A to 11C are cross-sectional views illustrating a method for fabricating the semiconductor devices according to a second example. Hereafter, an example of a method for fabricating the semiconductor device 200 of FIG. 3A and the semiconductor device 200F of FIG. 3B is described with reference to FIGS. 11A to 11C.

In the first place, through the method described in FIGS. 10A and 10B, a work function layer 19A may be formed. The work function layer 19A may be conformally formed. The work function layer 19A may include a titanium nitride.

Subsequently, referring to FIG. 11A, a high work function adjustment element doping process 20H may be performed. Through the high work function adjustment element doping process 20H, the work function layer 19A may be locally doped with a high work function adjustment element. The high work function adjustment element may engineer a work function of the work function layer 19A into a higher work function than its intrinsic work function. The high work function adjustment element may refer to a material for engineering the work function of the work function layer 19A into a high work function. The high work function adjustment element may include an oxygen, a nitrogen, an aluminum, or a combination thereof.

Through the high work function adjustment element doping process 20H, the work function layer 19A may locally include a high work function adjustment element. For example, a high work function layer 19H' may be formed through the high work function adjustment element doping process 20H. Therefore, the work function layer 19A may be divided into the high work function layer 19H' and the low work function layer 19L. The high work function layer 19H' may be doped with a high work function adjustment element. The low work function layer 19L may not be doped with a high work function adjustment element. Further, the low work function layer 19L may not be doped with a low work function adjustment element. In addition, the low work function layer 19L may have an intrinsic work function of the work function layer 19A. Therefore, the low work function layer 19L may refer to a layer having a lower work function than the high work function layer 19H', and it may not be doped with a low work function adjustment element. The low work function layer 19L and the high work function layer 19H' may be a continuous layer.

As described above, the high work function layer 19H' may be formed through the high work function adjustment element doping process 20H. In short, to form the high work function layer 19H', a high work function adjustment element may be locally doped. For example, an oxygen, a nitrogen, an aluminum or a combination thereof may be doped into the high work function layer 19H' through the high work function adjustment element doping process 20H. The high work function adjustment element may be doped through a doping process, such as an implantation process. For example, the high work function layer 19H' may be locally formed on the work function layer 19A through a vertical implantation of a high work function adjustment element. Herein, since a portion of the work function layer 19A where the implantation is not performed is not doped with the high work function adjustment element, the portion may remain as the low work function layer 19L. The high work function layer 19H' may be formed on the sidewalls and upper surface of the hard mask layer 15. In some embodiments, the high work function adjustment element may be implanted at an implantation energy of from approximately 3 KeV to approximately 5 KeV. In some embodiments the high work function adjustment element may be implanted at a dose of from approximately $1 \times 10^{14}$ atoms/cm$^2$ to approximately $5 \times 10^{15}$ atoms/cm$^2$. In some embodiments, the high work function adjustment element doping process 20H may be performed using plasma doping (PLAD). For example, the plasma doping may be performed at an energy of approximately 0.5 KeV and at dose of approximately $1 \times 10^{16}$ atoms/cm$^2$.

The high work function layer 19H' may include an oxygen-doped titanium nitride, a nitrogen-doped titanium nitride, or an aluminum-doped titanium nitride. Also, the high work function layer 19H' may include a doped titanium nitride that is doped with at least two or more elements selected from a group including an oxygen, a nitrogen, and an aluminum. The low work function layer 19L may include an undoped titanium nitride (undoped TiN) that is not doped with an oxygen, a nitrogen, and an aluminum.

As described above, the high work function layer 19H' may be formed through a vertical implantation process. The implantation angle of the vertical implantation process may be adjusted in such a manner that most of the high work function layer 19H' and the bottom channel 18B may overlap with each other. The high work function layer 19H' may not overlap with the side channel 18S. The low work function layer 19L may overlap with the bottom channel 18B. The low work function layer 19L may not overlap with the side channel 18S.

Referring to FIG. 11B, the low resistance layer 21A may be formed. The low resistance layer 21A may fill the gate trench 16 over the high work function layer 19H' and the low work function layer 19L. The low resistance layer 21A may be formed of a metal-based material. The low resistance layer 21A may include a tungsten layer.

Referring to FIG. 11C, a buried gate electrode BG20 may be formed. To form the buried gate electrode BG20, the low work function layer 19L and the low resistance layer 21A may be recessed through an etch-back process. The buried gate electrode BG20 may be formed at a lower level than the upper surface of the active region 14. Therefore, the buried gate electrode BG20 may be positioned in the inside of the gate trench 16. Before the etch-back process is performed, a planarization process such as a Chemical Mechanical Polishing (CMP) may be performed in advance.

Through the CMP process and the etch-back process of the low resistance layer 21A, a gate conductive layer 21 may be formed. The low work function layer 19L may remain only in the inside of the gate trench 16 through the CMP process and the etch-back process. The high work function layer 19H' may not be exposed to the etch-back process and the CMP process.

The buried gate electrode BG20 may include the high work function layer 19H', the low work function layer 19L, and the gate conductive layer 21. The low work function layer 19L may contact with the sidewalls of the gate conductive layer 21. The high work function layer 19H' may contact with the bottom surface of the gate conductive layer 21. The high work function layer 19H' and the low work function layer 19L may form a continuum. The upper surface of the gate conductive layer 21 and the upper surface of the low work function layer 19L may be formed at the same level.

Subsequently, a capping layer 22 may be formed over the buried gate electrode BG20. The capping layer 22 may include a dielectric material. The gate trench 16 may be filled with the capping layer 22 over the buried gate electrode BG20. The capping layer 22 may include a silicon nitride. Subsequently, the capping layer 22 may be planarized to expose the upper surface of the substrate 11. According to another embodiment of the present invention, the capping layer 22 may include a silicon oxide. According to yet another embodiment of the present invention, the capping layer 22 may have a NON (Nitride-Oxide-Nitride) structure.

As the capping layer 22 is formed, a buried gate structure may be formed. The buried gate structure may include the gate dielectric layer 17, the high work function layer 19H', the low work function layer 19L, the gate conductive layer 21, and the capping layer 22.

Subsequently, a first doped region 23 and a second doped region 24 may be formed. The first doped region 23 and the second doped region 24 may be formed through a doping process, such as an implantation process. The first doped region 23 and the second doped region 24 may have the same depth. According to another embodiment of the present invention, the first doped region 23 may be deeper than the second doped region 24. The channel region 18 may be defined between the first doped region 23 and the second doped region 24. In other words, the channel region 18 may include the side channel 18S and the bottom channel 18B. The first doped region 23 and the second doped region 24 may make the height of the side channel 18S lower than its initial height, which is the height of the side channel 18S when the side channel 18S is initially formed.

The first doped region 23 and the second doped region 24 may have a depth that horizontally overlaps with the upper portion of the low work function layer 19L. Also, the first doped region 23 and the second doped region 24 may be disposed at a depth that is sufficiently spaced apart from the high work function layer 19H' in a vertical direction.

The low work function layer 19L and the side channel 18S may overlap with each other in a horizontal direction. The low work function layer 19L may fully overlap with the side channel 18S. As a result, the threshold voltage of the side channel 18S may be dominantly controlled by the work function of the low work function layer 19L. The high work function layer 19H' and the bottom channel 18B may vertically overlap with each other. The high work function layer 19H' may fully overlap with the bottom channel 18B. As a result, the threshold voltage of the bottom channel 18B may be dominantly controlled by the work function of the high work function layer 19H'. The high work function layer 19H' may have a high work function higher than approximately 4.5 eV. The low work function layer 19L may have a lower work function than approximately 4.5 eV.

Figure 12A:
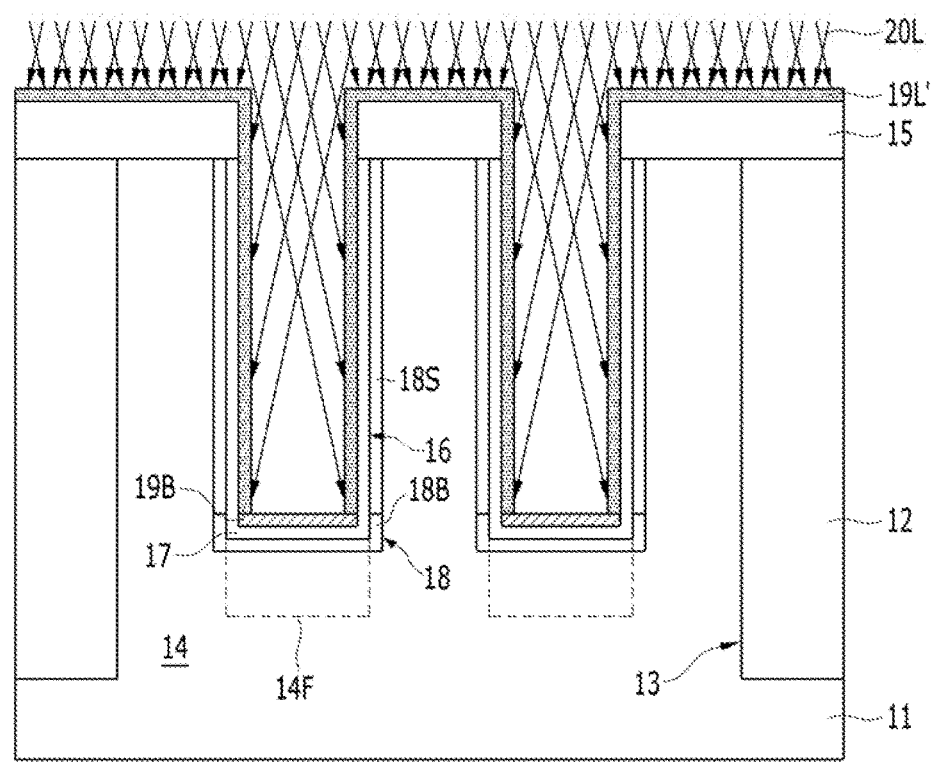
FIGS. 12A to 12C are cross-sectional views illustrating a method for fabricating the semiconductor devices according to an example.
Figure 12B:
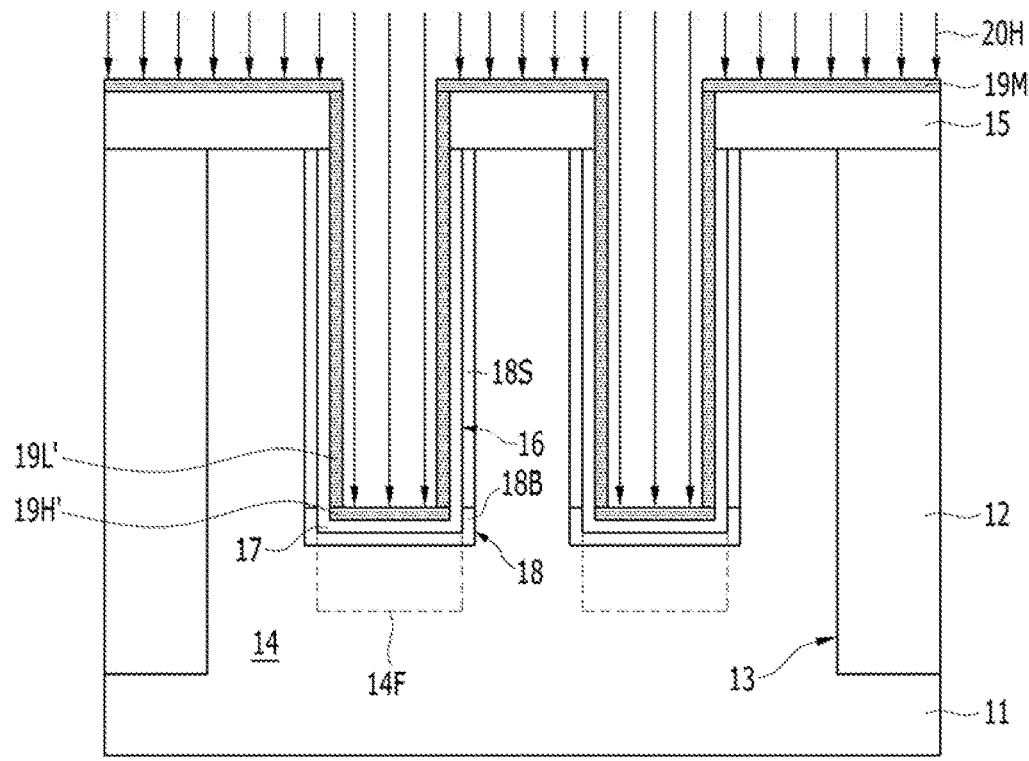
Figure 12C:
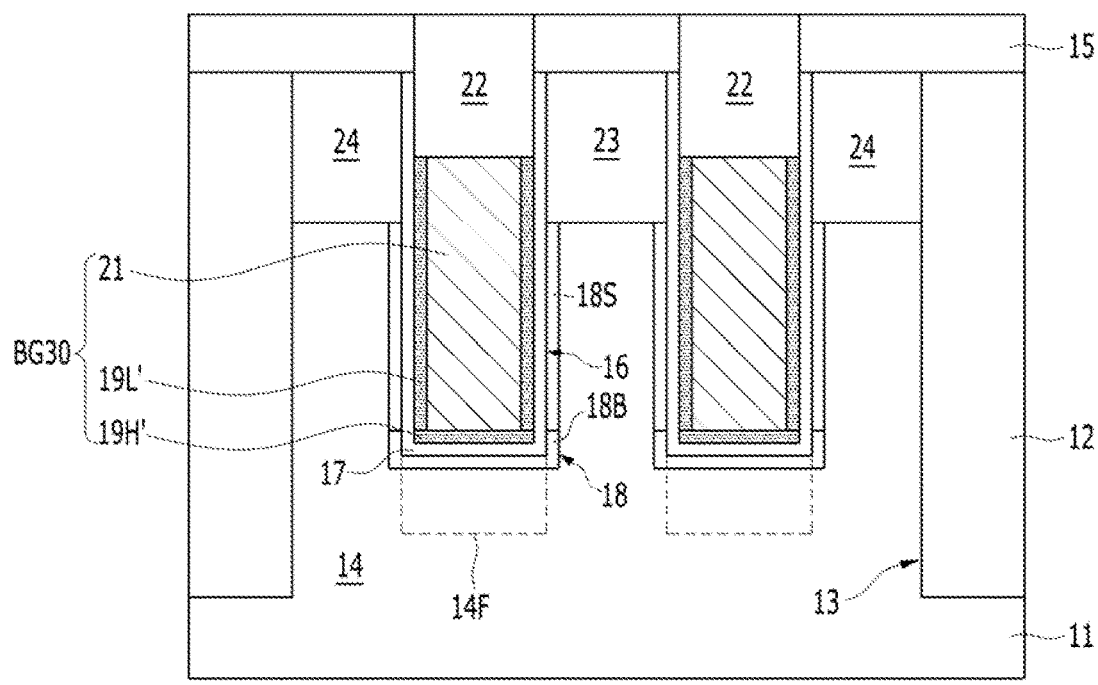

FIGS. 12A to 12C are cross-sectional views illustrating a method for fabricating the semiconductor devices according to a third example. Hereafter, an example of a method for fabricating the semiconductor device 300 of FIG. 4A and the semiconductor device 300F of FIG. 4B is described with reference to FIGS. 12A to 12C.

In the first place, through the method described in FIGS. 10A and 10B, a work function layer 19A may be formed. The work function layer 19A may be conformally formed. The work function layer 19A may include a titanium nitride.

Subsequently, referring to FIG. 12A, a low work function adjustment element doping process 20L may be performed. Through the low work function adjustment element doping process 20L, the work function layer 19A may be locally doped with a low work function adjustment element. The low work function adjustment element may engineer a work function of the work function layer 19A into a lower work function than its intrinsic work function. The low work function adjustment element may include a carbon, a hydrogen, or a combination thereof.

Through the low work function adjustment element doping process 20L, a low work function layer 19L' may be locally formed in the work function layer 19A. The low work function adjustment element may be doped through a doping process, such as a tilt-implantation process. Herein, since a portion of the work function layer 19A where the tilt-implantation is not performed is not doped with the low work function adjustment element, the portion may remain as the undoped work function layer 19B. The low work function layer 19L' may include a carbon-doped titanium nitride, a hydrogen-doped titanium nitride, or a combination thereof. The undoped work function layer 19B may include an undoped titanium nitride (undoped TiN).

As described above, the low work function layer 19L' may be formed through a tilt-implantation process. The tilted angle of the tilt-implantation process may be adjusted in such a manner that most of the low work function layer 19L' and the side channel 18S may overlap with each other. The low work function layer 19L' may not overlap with the bottom channel 18B. The undoped work function layer 19B may overlap with the bottom channel 18B. The undoped work function layer 19B may not overlap with the side channel 18S.

Referring to FIG. 12B, a high work function adjustment element doping process 20H may be performed. Through the high work function adjustment element doping process 20H, the undoped work function layer 19B may be doped with a high work function adjustment element. The high work function adjustment element may engineer a work function of the undoped work function layer 19B into a higher work function than its intrinsic work function. The high work function adjustment element may include an oxygen, a nitrogen, an aluminum, or a combination thereof.

The undoped work function layer 19B may be converted into a high work function layer 19H'. The high work function layer 19H' may be doped with a high work function adjustment element. The high work function layer 19H' may have a higher work function than the undoped work function layer 19B and the low work function layer 19L'. The low work function layer 19L' may not be doped with the high work function adjustment element.

The low work function layer 19L' and the high work function layer 19H' may form a continuum. Over the sidewalls and upper surface of the hard mask layer 15, a mixed work function layer 19M including a mixture of the low work function adjustment element and the high work function adjustment element may be formed. The mixed work function layer 19M may be removed through an etch-back process and a Chemical Mechanical Polishing (CMP) process to be performed subsequently.

The high work function adjustment element may be doped through a doping process, such as an implantation process. For example, the undoped work function layer 19B may be converted into the high work function layer 19H' through a vertical implantation process of a high work function adjustment element.

The high work function layer 19H' may include an oxygen-doped titanium nitride, a nitrogen-doped titanium nitride, or an aluminum-doped titanium nitride. Also, the high work function layer 19H' may include a doped titanium nitride that is doped with at least two or more elements selected from a group including an oxygen, a nitrogen, and an aluminum.

As described above, the high work function layer 19H' may be formed through a vertical implantation process. The implantation angle of the vertical implantation process may be adjusted in such a manner that most of the high work function layer 19H' and the bottom channel 18B may overlap with each other. The high work function layer 19H' may not overlap with the side channel 18S.

As described above, the high work function layer 19H' may be formed through the high work function adjustment element doping process 20H. Also, the low work function layer 19L' may be formed through the low work function adjustment element doping process 20L. The high work function layer 19H' and the low work function layer 19L' may have different work functions.

According to another embodiment of the present invention, the high work function adjustment element doping process 20H and the low work function adjustment element doping process 20L may be performed in reverse order. For example, the high work function adjustment element doping process 20H may be performed first and then the low work function adjustment element doping process 20L may be performed.

Subsequently, a series of processes described with reference to FIGS. 10D to 10F may be performed. Referring to FIG. 12C, a buried gate electrode BG30, a capping layer 22, a first doped region 23, and a second doped region 24 may be formed.

The buried gate electrode BG30 may include a high work function layer 19H', a low work function layer 19L', and a gate conductive layer 21. The low work function layer 19L' may contact with the sidewalls of the gate conductive layer 21. The high work function layer 19H' may contact with the bottom surface of the gate conductive layer 21. The high work function layer 19H' and the low work function layer 19L' may form a continuum. The upper surface of the gate conductive layer 21 and the upper surface of the low work function layer 19L' may be formed at the same level.

The low work function layer 19L' and the side channel 18S may overlap with each other in a horizontal direction. The low work function layer 19L' may fully overlap with the side channel 18S. As a result, the threshold voltage of the side channel 18S may be dominantly controlled by the low work function of the low work function layer 19L'. The high work function layer 19H' may fully overlap with the bottom channel 18B. As a result, the threshold voltage of the bottom channel 18B may be dominantly controlled by the high work function of the high work function layer 19H'. The high work function layer 19H' may have a high work function higher than approximately 4.5 eV. The low work function layer 19L' may have a lower work function than approximately 4.5 eV.

FIGS. 13A to 13E are cross-sectional views illustrating a method for fabricating the semiconductor devices according to a fourth example. Hereafter, an example of a method for fabricating the semiconductor device 400 of FIG. 5A and the semiconductor device 400F of FIG. 5B is described with reference to FIGS. 13A to 11E.

Figure 13A:
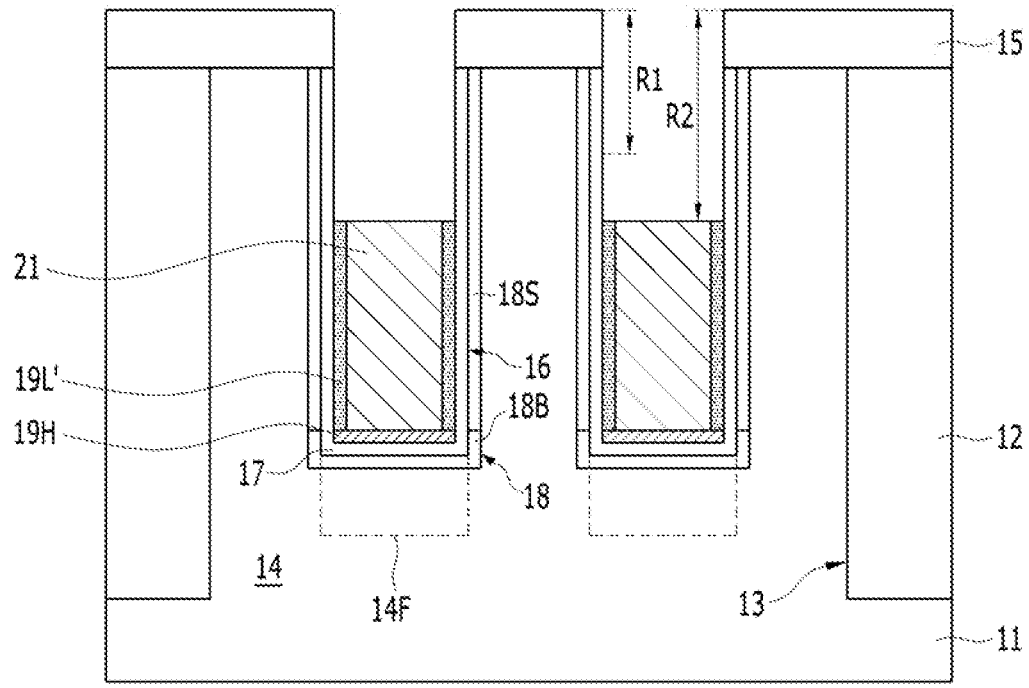
FIGS. 13A to 13E are cross-sectional views illustrating a method for fabricating the semiconductor devices according to an example.

In the first place, through the method described with reference to FIGS. 10A to 10F, a high work function layer 19H, a low work function layer 19L', and a gate conductive layer 21 may be formed. Referring to FIG. 13A, the gate conductive layer 21 and the low work function layer 19L' may have a second recess depth R2 from an upper surface of an active region 14. The second recess depth R2 may be longer than a first recess depth R1. The first recess depth R1 may be a recess depth of the gate conductive layer 21 and the low work function layer 19L' according to the method of the first example (refer to FIG. 10F). As described above, the recess amount of the gate conductive layer 21 and the low work function layer 19L' may be increased in the fourth example.

Figure 13B:
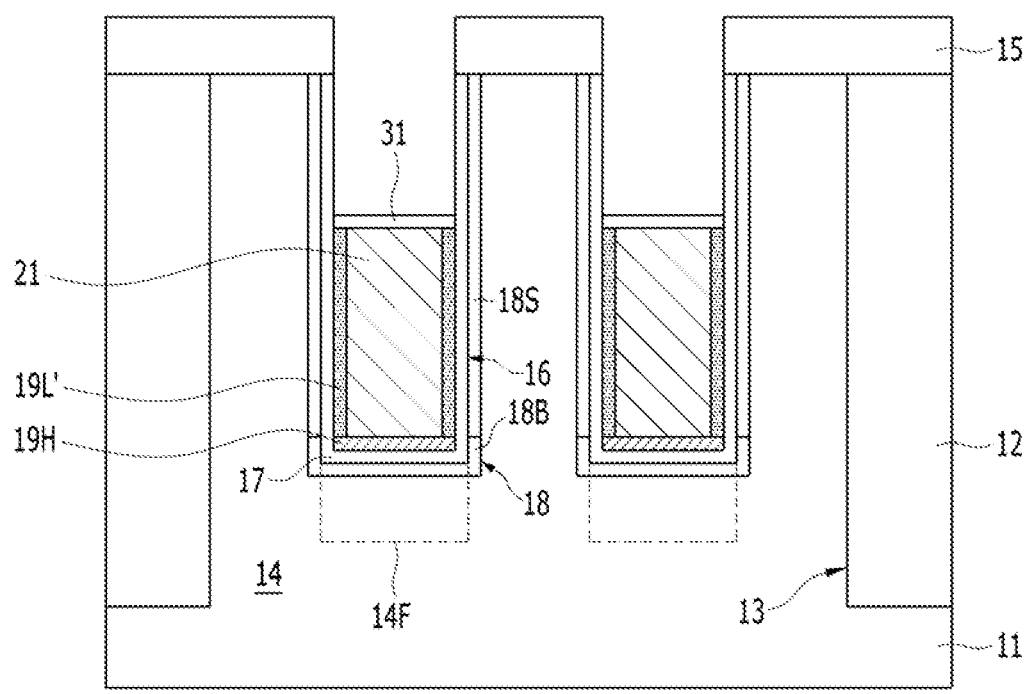

Referring to FIG. 13B, a barrier layer 31 may be formed over the gate conductive layer 21 and the low work function layer 19L'. The barrier layer 31 may include a titanium nitride. To form the barrier layer 31, a recess process may be performed after a titanium nitride is formed.

Figure 13C:
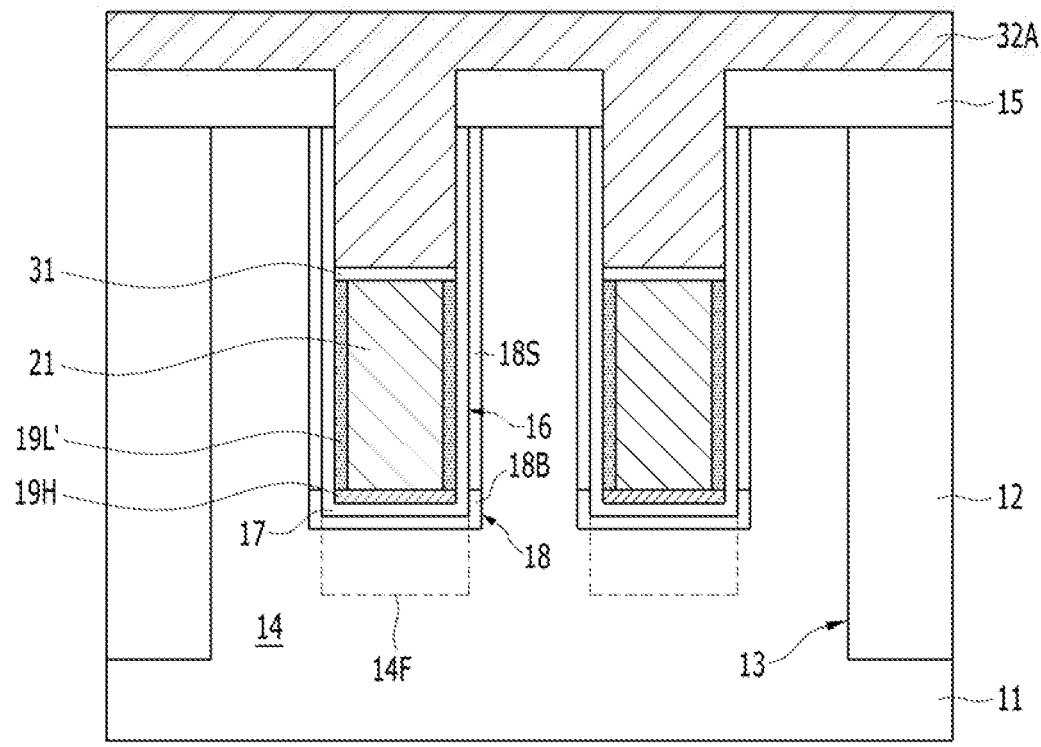

Referring to FIG. 13C, a doped polysilicon layer 32A may be formed over the barrier layer 31. The doped polysilicon layer 32A may be doped with an N-type impurity. The doped polysilicon layer 32A may fill the gate trench 16 over the barrier layer 31.

Figure 13D:
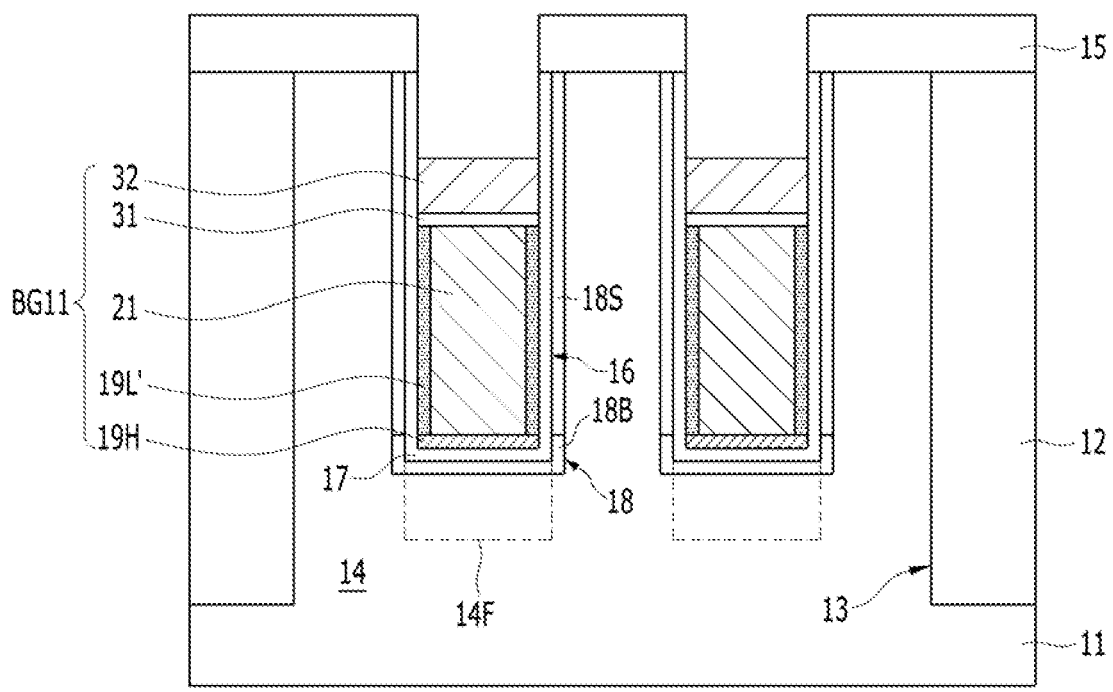

Referring to FIG. 13D, to form a silicon-based low work function layer 32, the doped polysilicon layer 32A may be recessed. As a result, the silicon-based low work function layer 32 may be disposed over the barrier layer 31. The upper surface of the silicon-based low work function layer 32 may be positioned at a lower level than the surface of the substrate 11.

As described above, as the silicon-based low work function layer 32 is formed, a buried gate electrode BG11 may be formed. The buried gate electrode BG11 may include the undoped high work function layer 19H, the doped low work function layer 19L', the gate conductive layer 21, the barrier layer 31, and the silicon-based low work function layer 32.

Figure 13E:
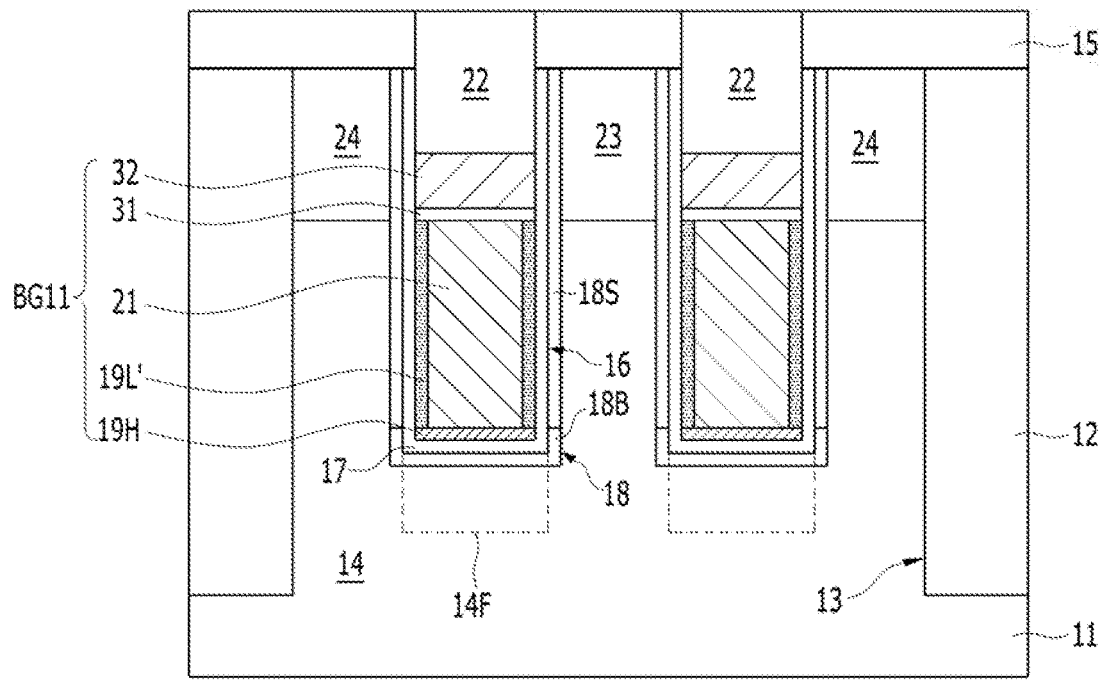

Referring to FIG. 13E, a capping layer 22 may be formed over the buried gate electrode BG11. The capping layer 22 may include a dielectric material. The gate trench 16 may be filled with the capping layer 22 over the buried gate electrode BG11. The capping layer 22 may include a silicon nitride. Subsequently, the capping layer 22 may be planarized to expose the upper surface of the substrate 11. According to another embodiment of the present invention, the capping layer 22 may include a silicon oxide. According to yet another embodiment of the present invention, the capping layer 22 may have a NON (Nitride-Oxide-Nitride) structure.

As the capping layer 22 is formed, a buried gate structure may be formed. The buried gate structure may include the gate dielectric layer 17, the undoped high work function layer 19H, the doped low work function layer 19L', the gate conductive layer 21, the barrier layer 31, the silicon-based low work function layer 32, and the capping layer 22.

Subsequently, a first doped region 23 and a second doped region 24 may be formed. The first doped region 23 and the second doped region 24 may be formed through a doping process, such as an implantation process. The first doped region 23 and the second doped region 24 may have the same depth. According to another embodiment of the present invention, the first doped region 23 may be deeper than the second doped region 24. The channel region 18 may be defined between the first doped region 23 and the second doped region 24. In other words, the channel region 18 may include the side channel 18S and the bottom channel 18B. The first doped region 23 and the second doped region 24 may make the height of the side channel 18S lower than its initial height, which is the height of the side channel 18S when the side channel 18S is initially formed.

The first doped region 23 and the second doped region 24 may have a depth that horizontally overlaps with the silicon-based low work function layer 32. Also, the first doped region 23 and the second doped region 24 may be disposed at a depth that is sufficiently spaced apart from the undoped high work function layer 19H in a vertical direction.

The doped low work function layer 19L' and the side channel 18S may overlap with each other in a horizontal direction. The doped low work function layer 19L' may fully overlap with the side channel 18S. As a result, the threshold voltage of the side channel 18S may be dominantly controlled by the low work function of the low work function layer 19L'. The undoped high work function layer 19H and the bottom channel 18B may vertically overlap with each other. The undoped high work function layer 19H may fully overlap with the bottom channel 18B. As a result, the threshold voltage of the bottom channel 18B may be dominantly controlled by the high work function of the undoped high work function layer 19H. The undoped high work function layer 19H may have a high work function higher than approximately 4.5 eV. The doped low work function layer 19L' may have a lower work function than approximately 4.5 eV.

Although not illustrated, the method for fabricating the semiconductor devices 500 and 500F of FIGS. 6A and 6B may be similar to the method described with reference to FIGS. 11A to 11C and FIGS. 13A to 13E. The method for fabricating the semiconductor devices 600 and 600F of FIGS. 7A and 7B may be similar to the method described with reference to FIGS. 12A to 12C and FIGS. 13A to 13E.

According to the semiconductor device fabrication methods described above, the low resistance layer 21A may include a titanium nitride, other than tungsten. Accordingly, a barrier-less buried gate electrode illustrated in FIGS. 8A to 8C may be formed.

FIGS. 14A to 14E are cross-sectional views illustrating a method for fabricating the semiconductor devices according to a fifth example. Hereafter, an example of a method for fabricating the semiconductor device 700 of FIG. 8D is described with reference to FIGS. 14A to 14E.

In the first place, through the method described in FIGS. 10A and 10B, the doped low work function layer 19L' and the undoped high work function layer 19H may be formed. Hereafter, the undoped high work function layer 19H may be simply referred to as 'a first gate conductive layer 19H', and the doped low work function layer 19L' may be simply referred to as 'a second gate conductive layer 19L''.

Figure 14A:
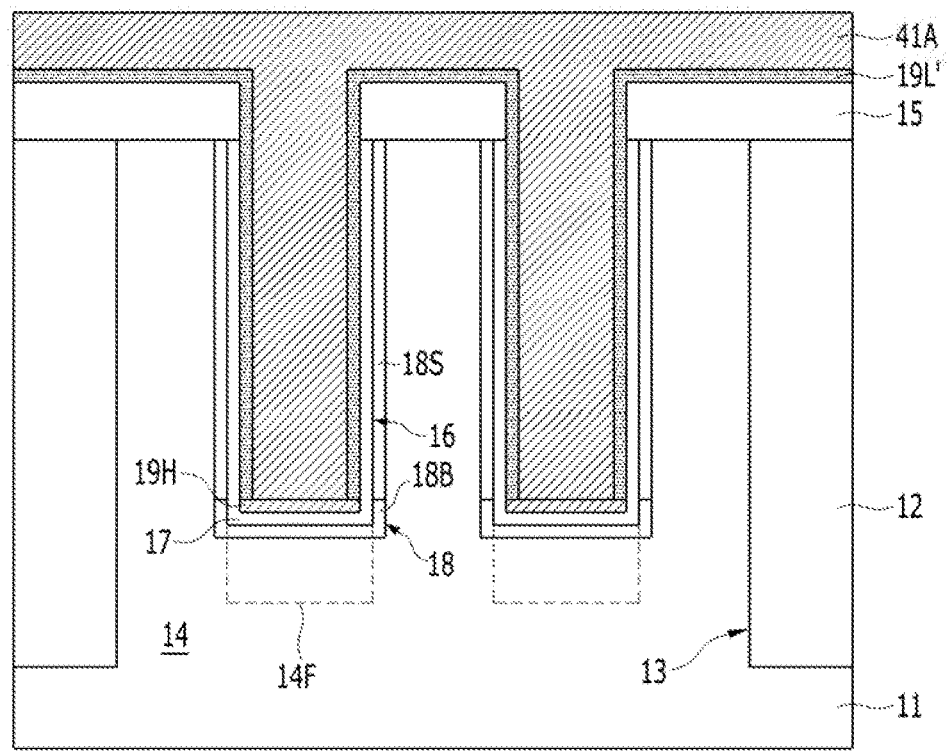
FIGS. 14A to 14E are cross-sectional views illustrating a method for fabricating the semiconductor devices according to an example.

Subsequently, referring to FIG. 14A, an undoped titanium nitride layer 41A may be formed. The undoped titanium nitride layer 41A may fill the gate trench 16 over the high work function layer 19H and the low work function layer 19L'.

Figure 14B:
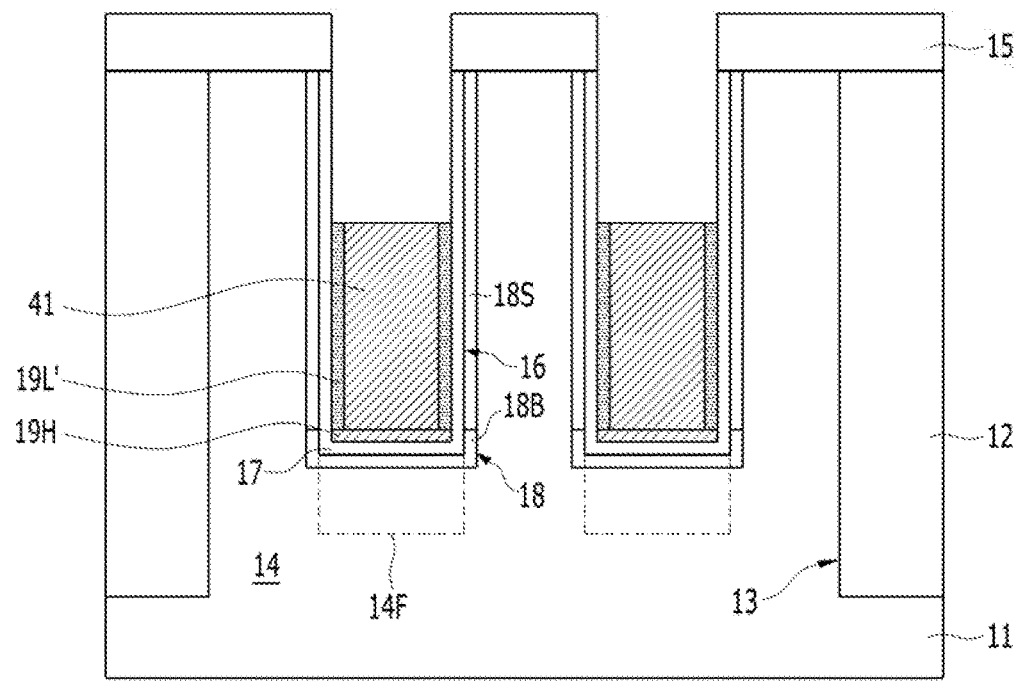

Referring to FIG. 14B, the low work function layer 19L' and the undoped titanium nitride layer 41A may be recessed through an etch-back process. As a result, a third gate conductive layer 41 may be formed. The third gate conductive layer 41 may be positioned at a lower level than the upper surface of the active region 14. Before the etch-back process is performed, a planarization process using a Chemical Mechanical Polishing (CMP) may be performed in advance. The second gate conductive layer 19L' may remain only in the inside of the gate trench 16 through the CMP process and the etch-back process. The first gate conductive layer 19H may not be exposed to the etch-back process and the CMP process.

Figure 14C:
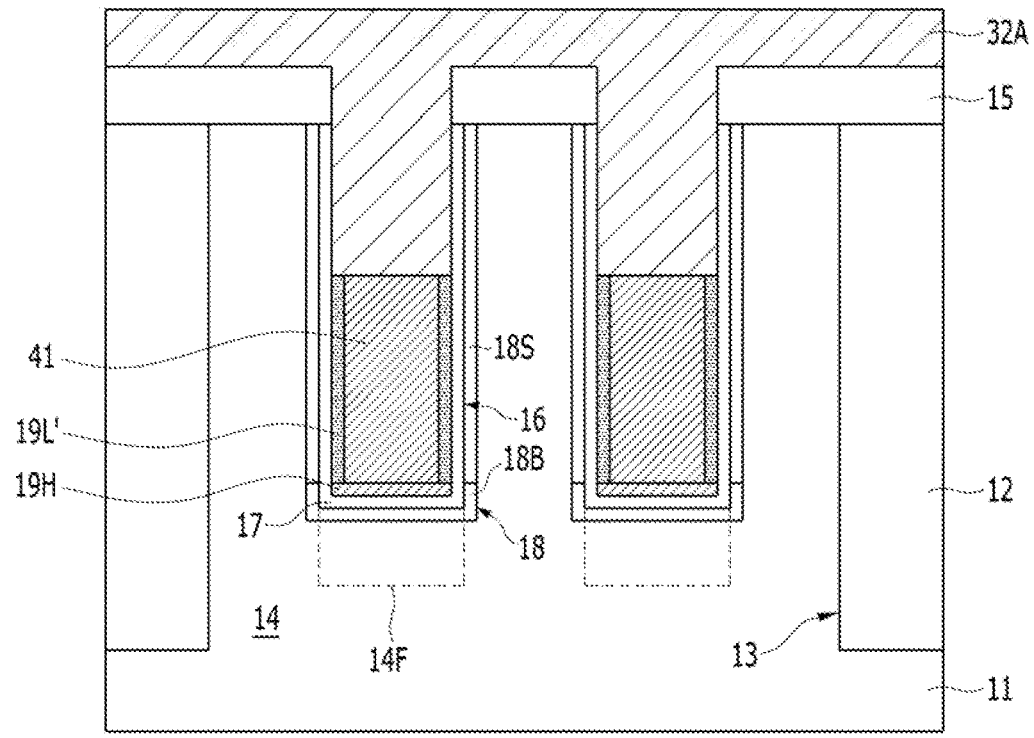

Referring to FIG. 14C, a doped polysilicon layer 32A may be formed. The doped polysilicon layer 32A may be doped with an N-type impurity. The doped polysilicon layer 32A may fill the gate trench 16 over the third gate conductive layer 41.

Figure 14D:
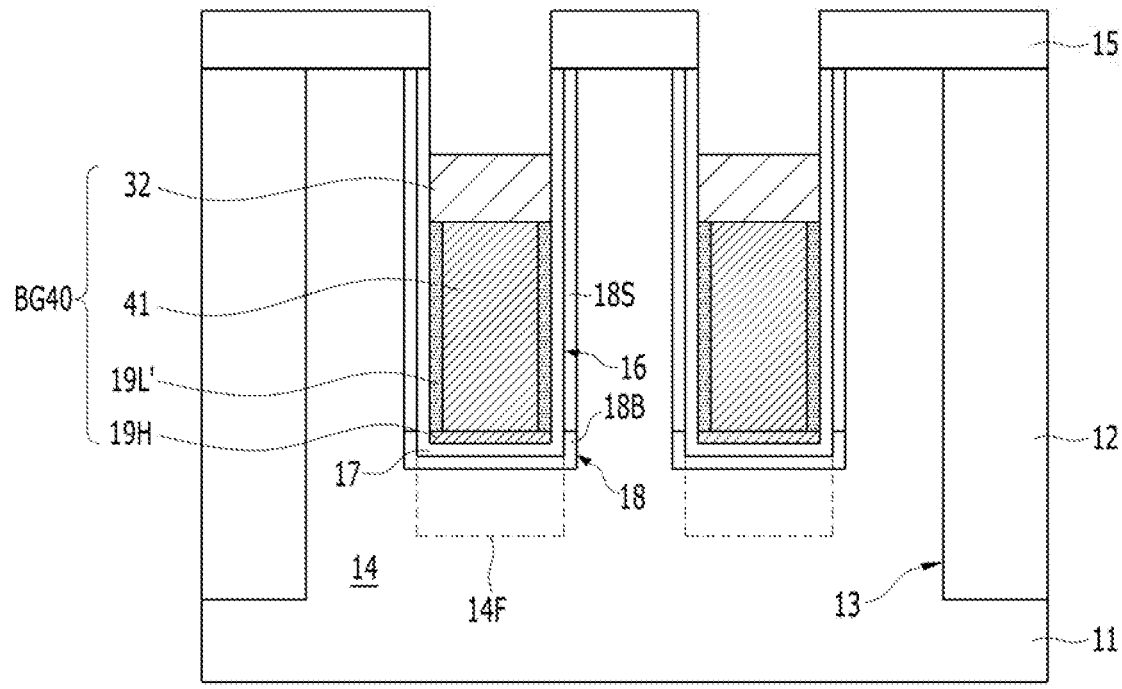

Referring to FIG. 14D, to form the silicon-based low work function layer 32, the doped polysilicon layer 32A may be recessed. As a result, the silicon-based low work function layer 32 may be disposed over the third gate conductive layer 41. The upper surface of the silicon-based low work function layer 32 may be positioned at a lower level than the surface of the substrate 11.

As described above, as the silicon-based low work function layer 32 is formed, a buried gate electrode BG40 may be formed. The buried gate electrode BG40 may include the first gate conductive layer 19H, the second gate conductive layer 19L', the third gate conductive layer 41, and the silicon-based low work function layer 32. The first gate conductive layer 19H, the second gate conductive layer 19L', and the third gate conductive layer 41 may be all titanium nitrides. The first gate conductive layer 19H and the third gate conductive layer 41 may be made of undoped titanium nitrides. The second gate conductive layer 19L' may include a carbon-doped titanium nitride, a hydrogen-doped titanium nitride, or a combination thereof.

Figure 14E:
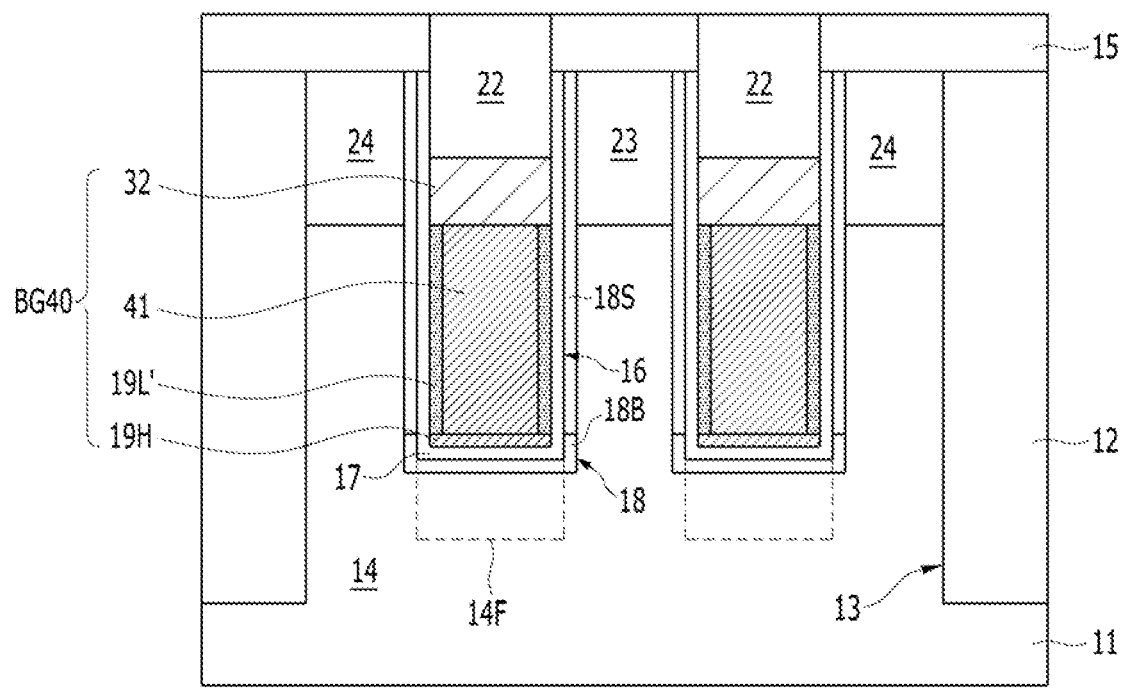

Referring to FIG. 14E, a capping layer 22 may be formed over the buried gate electrode BG40. The capping layer 22 may include a dielectric material. The gate trench 16 may be filled with the capping layer 22 over the buried gate electrode BG40. The capping layer 22 may include a silicon nitride. Subsequently, the capping layer 22 may be planarized to expose the upper surface of the substrate 11. According to another embodiment of the present invention, the capping layer 22 may include a silicon oxide. According to yet another embodiment of the present invention, the capping layer 22 may have a NON (Nitride-Oxide-Nitride) structure.

As the capping layer 22 is formed, a buried gate structure may be formed. The buried gate structure may include the gate dielectric layer 17, the first gate conductive layer 19H, the second gate conductive layer 19L', the third gate conductive layer 41, the silicon-based low work function layer 32, and the capping layer 22.

Subsequently, a first doped region 23 and a second doped region 24 may be formed. The first doped region 23 and the second doped region 24 may be formed through a doping process, such as an implantation process. The first doped region 23 and the second doped region 24 may have the same depth. According to another embodiment of the present invention, the first doped region 23 may be deeper than the second doped region 24. The channel region 18 may be defined between the first doped region 23 and the second doped region 24. In other words, the channel region 18 may include the side channel 18S and the bottom channel 18B. The first doped region 23 and the second doped region 24 may make the height of the side channel 18S lower than its initial height, which is the height of the side channel 18S when the side channel 18S is initially formed.

The first doped region 23 and the second doped region 24 may have a depth that horizontally overlaps with the silicon-based low work function layer 32. Also, the first doped region 23 and the second doped region 24 may be disposed at a depth that is sufficiently spaced apart from the first gate conductive layer 19H in a vertical direction.

The second gate conductive layer 19L' and the side channel 18S may overlap with each other in a horizontal direction. The second gate conductive layer 19L' may fully overlap with the side channel 18S. As a result, the threshold voltage of the side channel 18S may be dominantly controlled by the low work function of the second gate conductive layer 19L'. The first gate conductive layer 19H and the bottom channel 18B may vertically overlap with each other. The first gate conductive layer 19H may fully overlap with the bottom channel 18B. As a result, the threshold voltage of the bottom channel 18B may be dominantly controlled by the high work function of the first gate conductive layer 19H. The first gate conductive layer 19H may have a high work function higher than approximately 4.5 eV. The second gate conductive layer 19L' may have a lower work function than approximately 4.5 eV.

According to an embodiment of the present invention, a side transistor effect may be suppressed by controlling a work function of a barrier layer disposed adjacent to a side channel based on a selective doping of a work function adjustment element.

Also, according to an embodiment of the present invention, it is possible to suppress a junction leakage current by using a high-work function barrier layer to decrease a channel dose.

Also, according to an embodiment of the present invention, a gate-induced drain leakage (GIDL) may be decreased by forming a low work function barrier layer between a buried gate electrode and a doping region.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a gate trench extended into a semiconductor substrate and including a bottom channel and a side channel;
a first work function layer covering a lowest portion of the gate trench to overlap with the bottom channel;
a second work function layer that continues from the first work function layer and overlaps with the side channel;
a gate conductive layer covering the first work function layer and the second work function layer and filling the gate trench; and
doped regions isolated from each other by the gate trench and contacting with an upper portion of the side channel,
wherein the second work function layer has a work function lower than the first work function layer.

2. The semiconductor device of claim 1, wherein the second work function layer fully overlaps with the side channel.

3. The semiconductor device of claim 1, wherein the first work function layer fully overlaps with the bottom channel.

4. The semiconductor device of claim 1, wherein the second work function layer includes a material that is doped with a first work function adjustment element, and the first work function layer includes a material that is not doped with the first work function adjustment element, and
the first work function adjustment element includes a carbon, a hydrogen, or a combination thereof.

5. The semiconductor device of claim 1, wherein the first work function layer includes a material that is doped with a second work function adjustment element, and the second work function layer includes a material that is not doped with the second work function adjustment element, and
the second work function adjustment element includes an oxygen, a nitrogen, an aluminum, or a combination thereof.

6. The semiconductor device of claim 1, wherein the second work function layer includes a material that is doped with a first work function adjustment element, and the first work function layer includes a material that is doped with a second work function adjustment element, and
the first work function adjustment element includes a carbon, a hydrogen, or a combination thereof, and
the second work function adjustment element includes an oxygen, a nitrogen, an aluminum, or a combination thereof.

7. The semiconductor device of claim 1, wherein the second work function layer includes a carbon-doped titanium nitride, a hydrogen-doped titanium nitride, or a combination thereof.

8. The semiconductor device of claim 1, wherein the first work function layer includes an oxygen-doped titanium nitride, a nitrogen-doped titanium nitride, an aluminum-doped titanium nitride, or a combination thereof.

9. The semiconductor device of claim 1, further comprising:
a barrier layer over the gate conductive layer;
a polysilicon layer doped with an N-type impurity over the barrier layer; and
a capping layer over the polysilicon layer,
wherein the polysilicon layer overlaps with the doped regions.

10. The semiconductor device of claim 1, wherein the second work function layer includes a titanium nitride that is doped with a first work function adjustment element, and
the first work function layer includes a titanium nitride that is not doped with the first work function adjustment element, and
the gate conductive layer includes a tungsten or a titanium nitride that is not doped with the first work function adjustment element.

11. The semiconductor device of claim 1, wherein the first work function layer includes a titanium nitride that is doped with a second work function adjustment element, and
the second work function layer includes a titanium nitride that is not doped with the second work function adjustment element, and
the gate conductive layer includes a tungsten or a titanium nitride that is not doped with the second work function adjustment element.

12. The semiconductor device of claim 1, wherein the second work function layer includes a titanium nitride that is doped with a first work function adjustment element, and
the first work function layer includes a titanium nitride that is doped with a second work function adjustment element, and
the gate conductive layer includes a tungsten or a titanium nitride that is not doped with the first work function adjustment element and the second work function adjustment element.

* * * * *